(12) United States Patent
Kimura et al.

(10) Patent No.: US 8,339,530 B2
(45) Date of Patent: Dec. 25, 2012

(54) DISPLAY DEVICE, ELECTRONIC DEVICE AND METHOD OF DRIVING DISPLAY DEVICE

(75) Inventors: Hajime Kimura, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/441,622

(22) Filed: Apr. 6, 2012

(65) Prior Publication Data

US 2012/0194412 A1 Aug. 2, 2012

Related U.S. Application Data

(60) Continuation of application No. 13/032,829, filed on Feb. 23, 2011, now Pat. No. 8,154,678, which is a division of application No. 11/474,227, filed on Jun. 23, 2006, now Pat. No. 7,898,623.

(30) Foreign Application Priority Data

Jul. 4, 2005 (JP) ................................. 2005-194668

(51) Int. Cl.
*G02F 1/136* (2006.01)
*G02F 1/133* (2006.01)
*G02F 1/1343* (2006.01)

(52) U.S. Cl. ................................ 349/41; 349/33; 349/38

(58) Field of Classification Search ........................ None
See application file for complete search history.

(56) References Cited

U.S. PATENT DOCUMENTS

| | | | |
|---|---|---|---|
| 6,335,778 B1 | 1/2002 | Kubota et al. | |
| 6,961,042 B2 | 11/2005 | Murai | |
| 7,362,289 B2* | 4/2008 | Yamazaki et al. | 345/76 |
| 7,368,868 B2 | 5/2008 | Sakamoto | |
| 7,573,443 B2 | 8/2009 | Oh | |
| 7,898,623 B2* | 3/2011 | Kimura et al. | 349/129 |
| 2001/0022565 A1 | 9/2001 | Kimura | |
| 2002/0036625 A1 | 3/2002 | Nakamura | |
| 2002/0075211 A1 | 6/2002 | Nakamura | |
| 2002/0167477 A1 | 11/2002 | Tsutsui et al. | |
| 2004/0021677 A1 | 2/2004 | Sasaki et al. | |
| 2005/0007361 A1* | 1/2005 | Fujikura et al. | 345/204 |
| 2005/0041188 A1 | 2/2005 | Yamazaki | |
| 2005/0270444 A1 | 12/2005 | Miller et al. | |
| 2006/0139279 A1* | 6/2006 | Yamazaki et al. | 345/92 |
| 2007/0091418 A1 | 4/2007 | Danner et al. | |
| 2008/0170169 A1 | 7/2008 | Kimura et al. | |
| 2008/0291352 A1 | 11/2008 | Kimura | |
| 2012/0194412 A1* | 8/2012 | Kimura et al. | 345/76 |

FOREIGN PATENT DOCUMENTS

| | | |
|---|---|---|
| EP | 1 103 946 A2 | 5/2001 |
| EP | 1 594 347 A1 | 11/2005 |
| JP | 58-172085 | 10/1983 |

(Continued)

*Primary Examiner* — Rhonda Peace
(74) *Attorney, Agent, or Firm* — Husch Blackwell LLP

(57) ABSTRACT

The present invention provides a display device which can display characters clearly and display images smoothly. An area gray scale method is adopted and a configuration of one pixel is changed depending on a mode, by selecting one or more display regions in each pixel. When characters are needed to be displayed clearly, one pixel is configured by selecting a stripe arrangement. Thus, clear display can be conducted. When images are needed to be displayed, one pixel is configured by selecting an indented state. Thus, smooth display can be conducted.

27 Claims, 49 Drawing Sheets

FOREIGN PATENT DOCUMENTS

| | | |
|---|---|---|
| JP | 59-225683 | 12/1984 |
| JP | 59-230378 | 12/1984 |
| JP | 4-32383 | 2/1992 |
| JP | 6-82617 | 3/1994 |
| JP | 7-72824 | 3/1995 |
| JP | 10-68931 | 3/1998 |
| JP | 2001-125526 | 5/2001 |
| JP | 2001-324958 | 11/2001 |
| JP | 2001-337317 | 12/2001 |
| JP | 2001-343933 | 12/2001 |
| JP | 2001-350430 | 12/2001 |
| JP | 2002-175040 | 6/2002 |
| JP | 2002-229505 | 8/2002 |
| JP | 2002-328655 | 11/2002 |
| JP | 2003-132797 | 5/2003 |
| JP | 2004-117689 | 4/2004 |
| JP | 2005-62416 | 3/2005 |
| JP | 2005-164814 | 6/2005 |
| JP | 2005-300579 | 10/2005 |
| JP | 2005-352408 | 12/2005 |
| WO | WO 2004/073356 A1 | 8/2004 |

\* cited by examiner

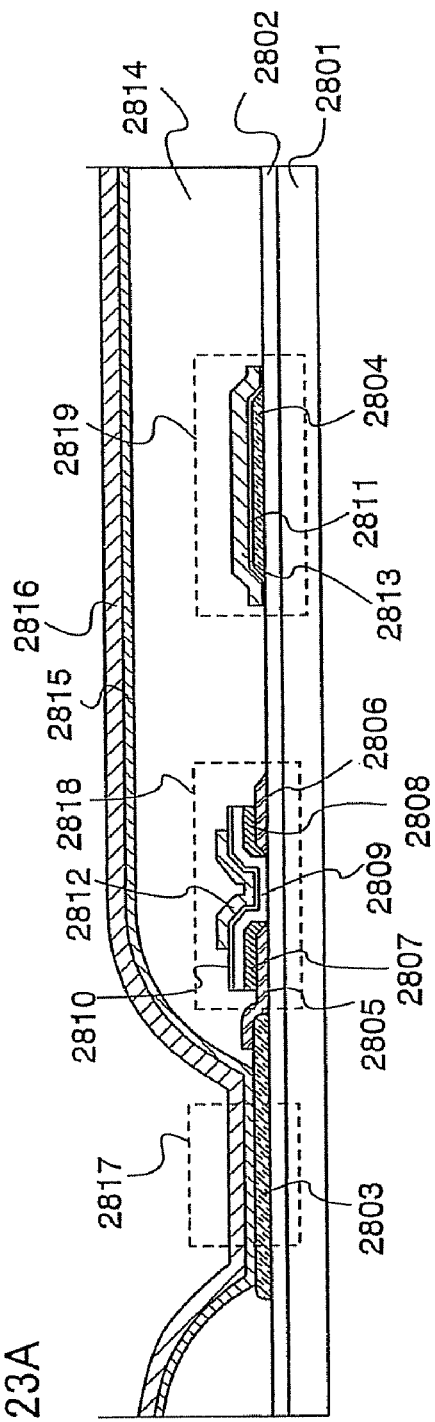
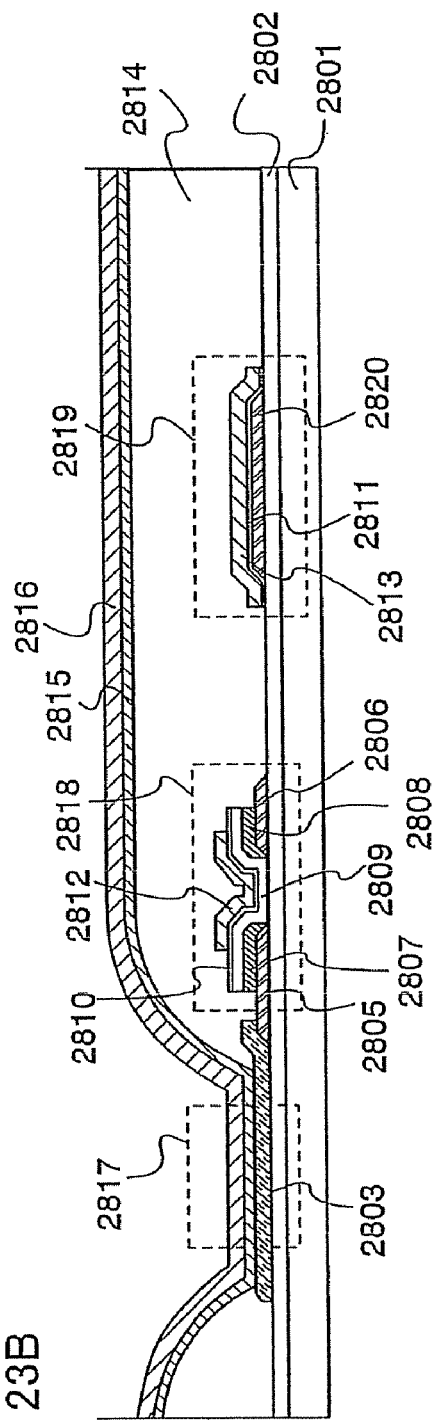
FIG. 23A
FIG. 23B

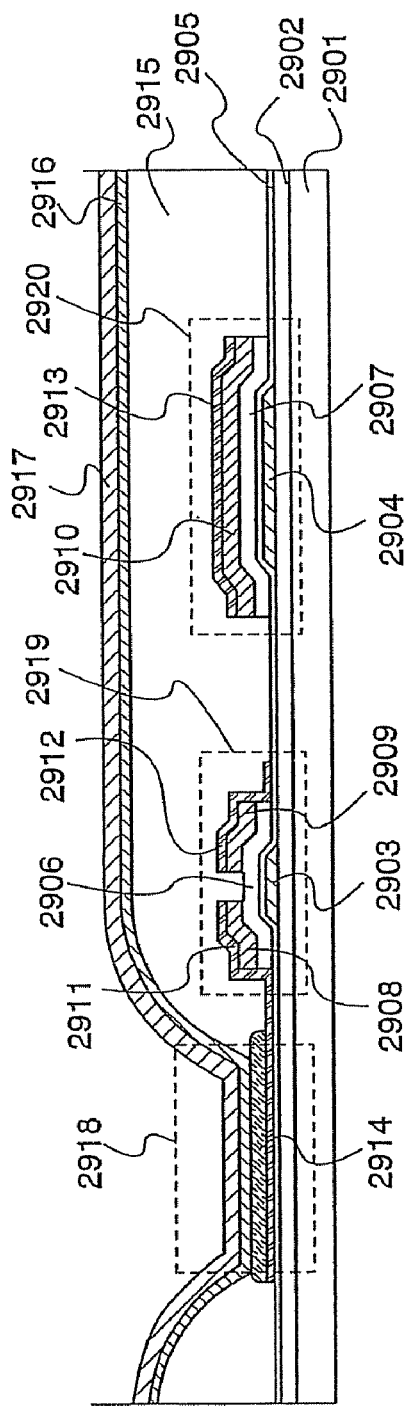
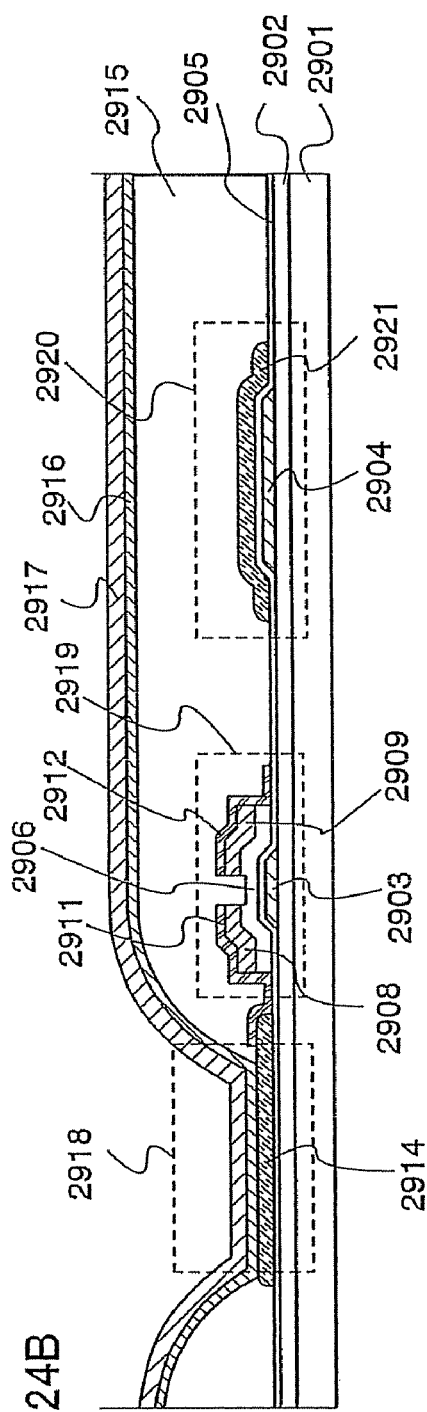
FIG. 24A
FIG. 24B

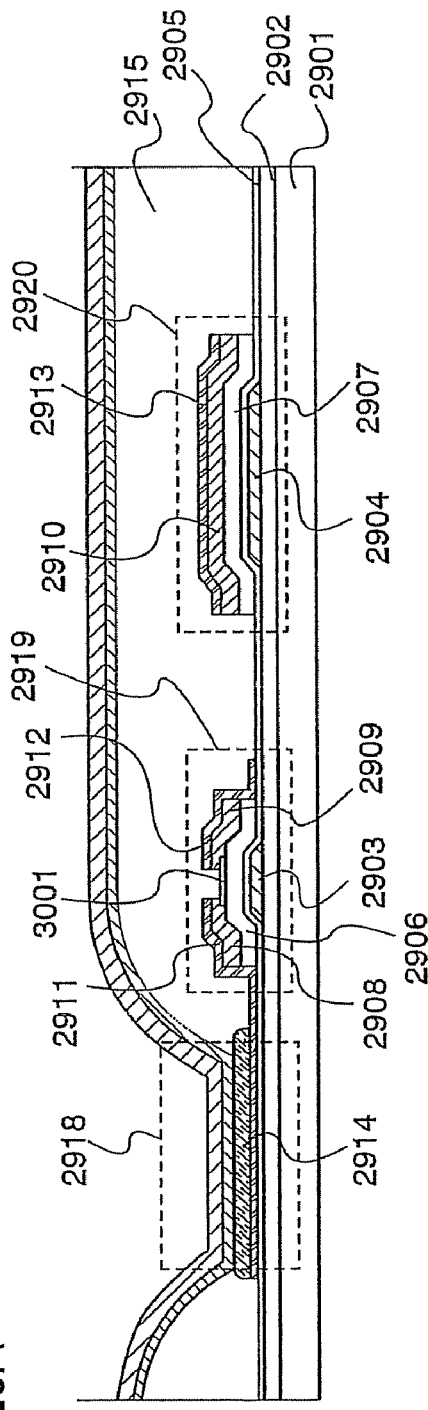
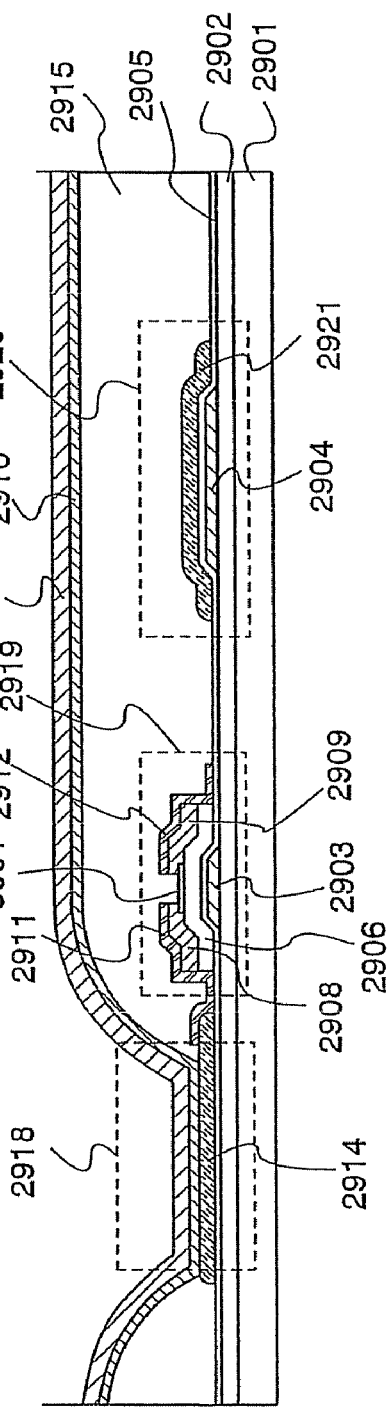
FIG. 25A
FIG. 25B

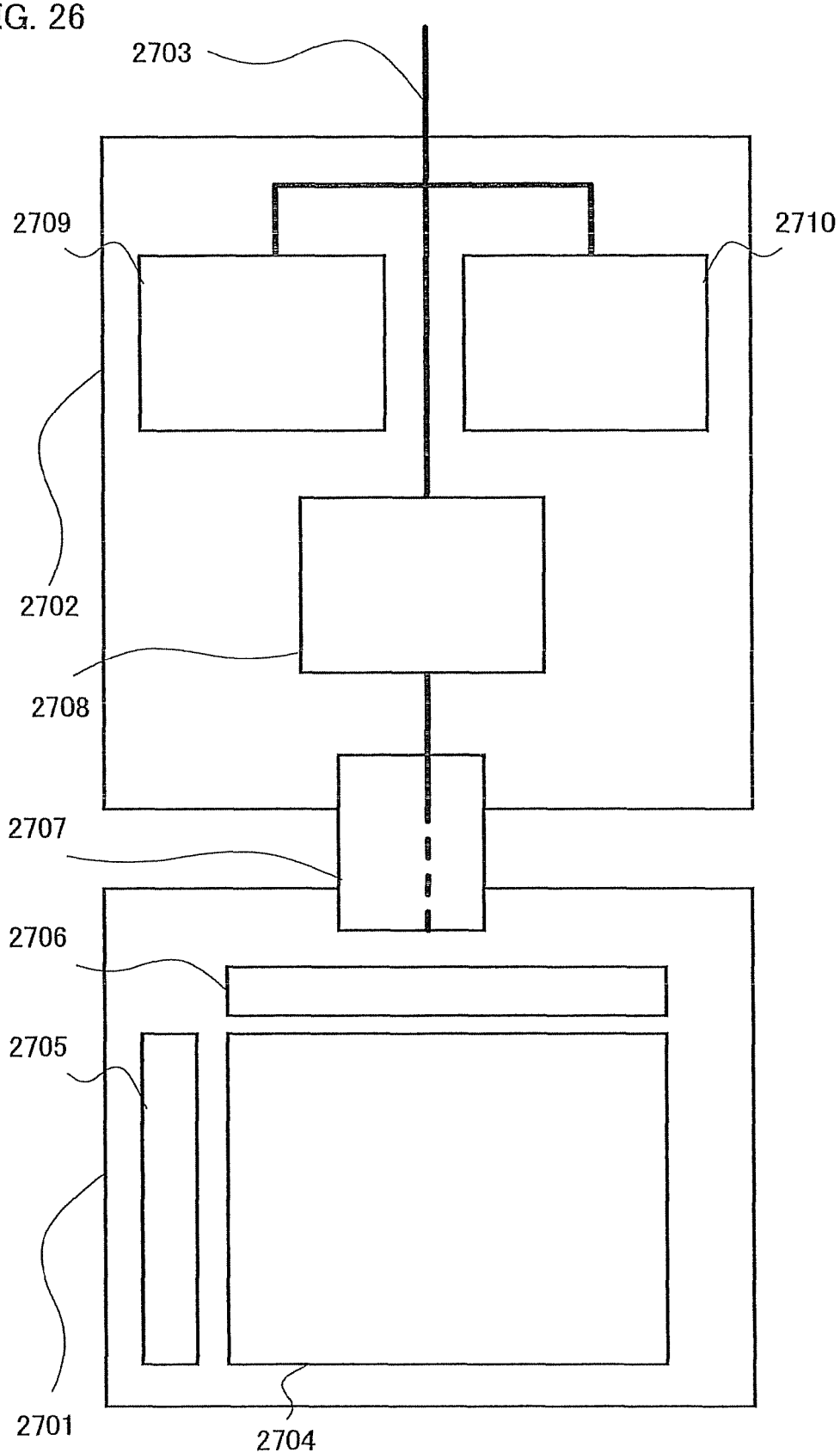

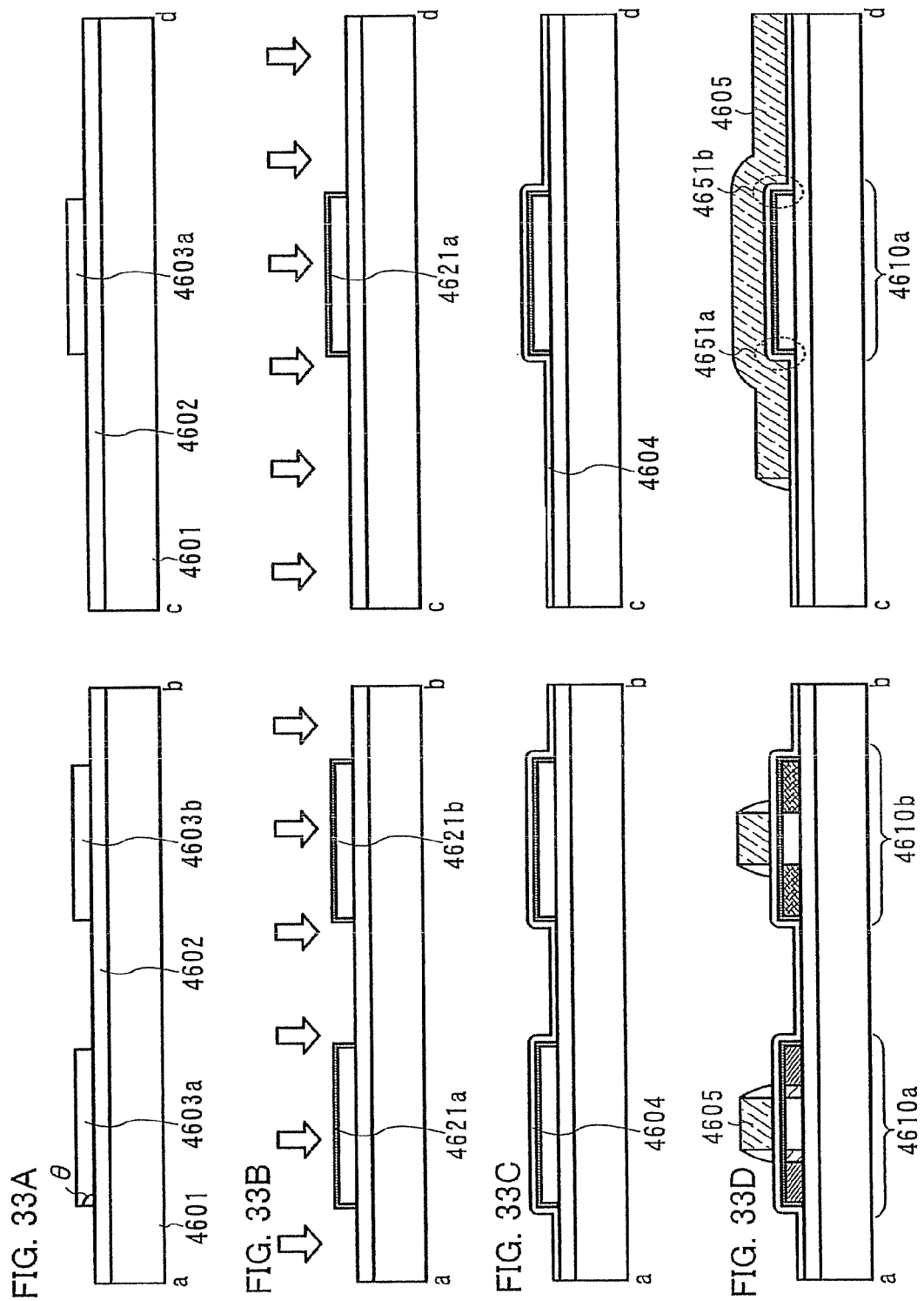

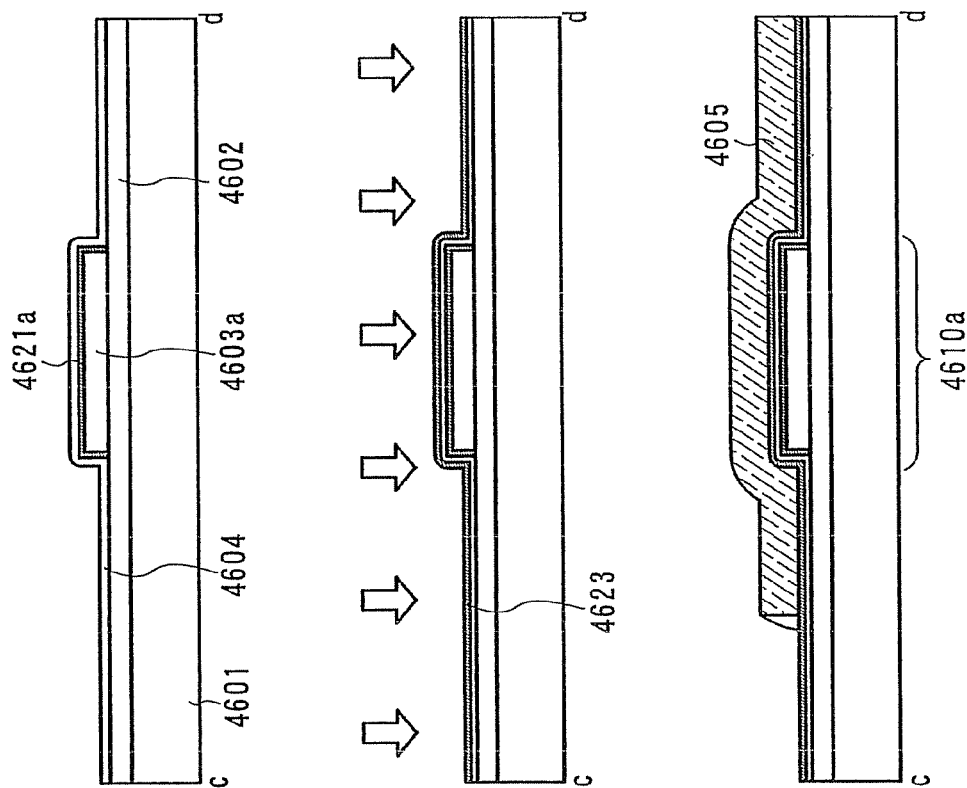

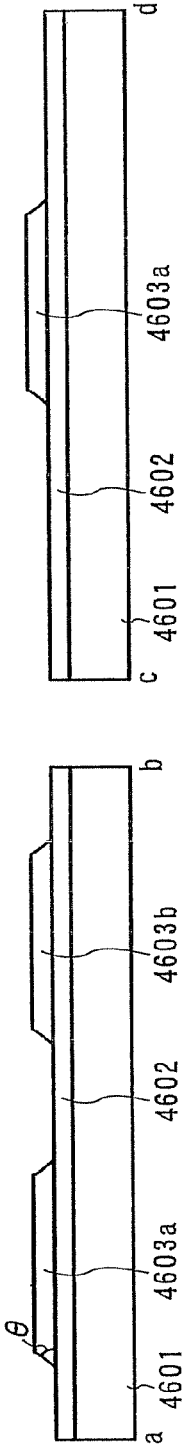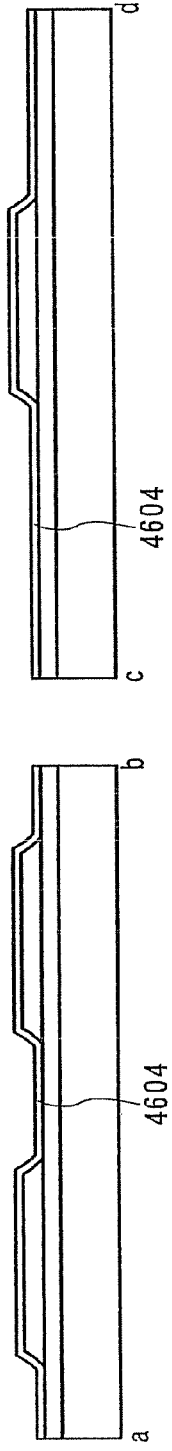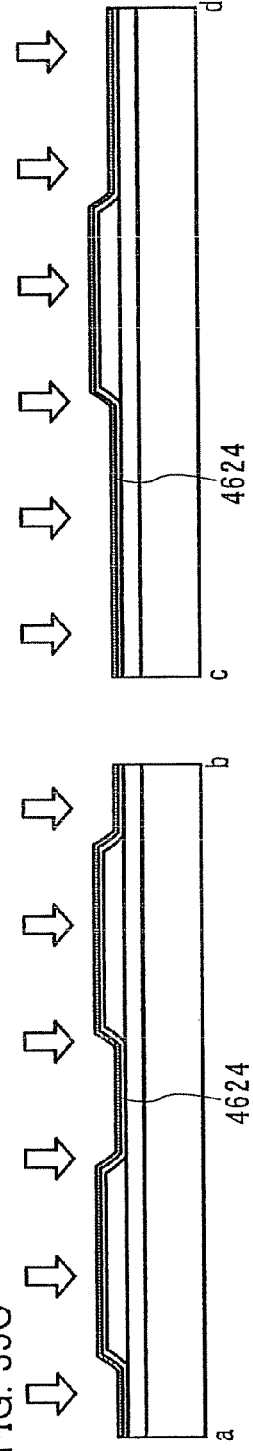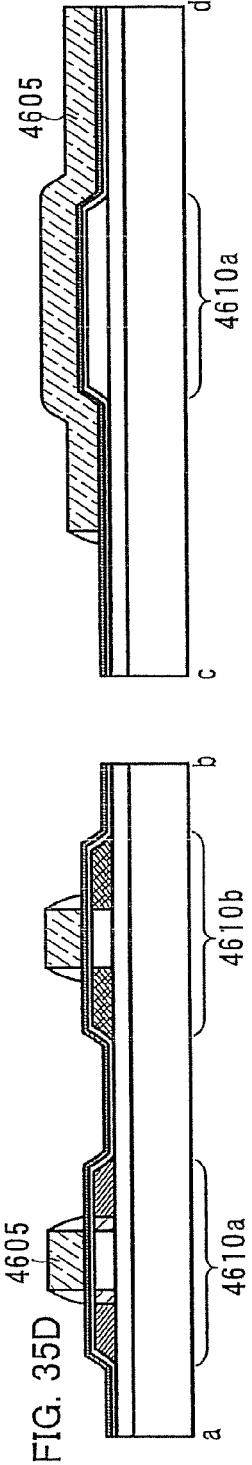

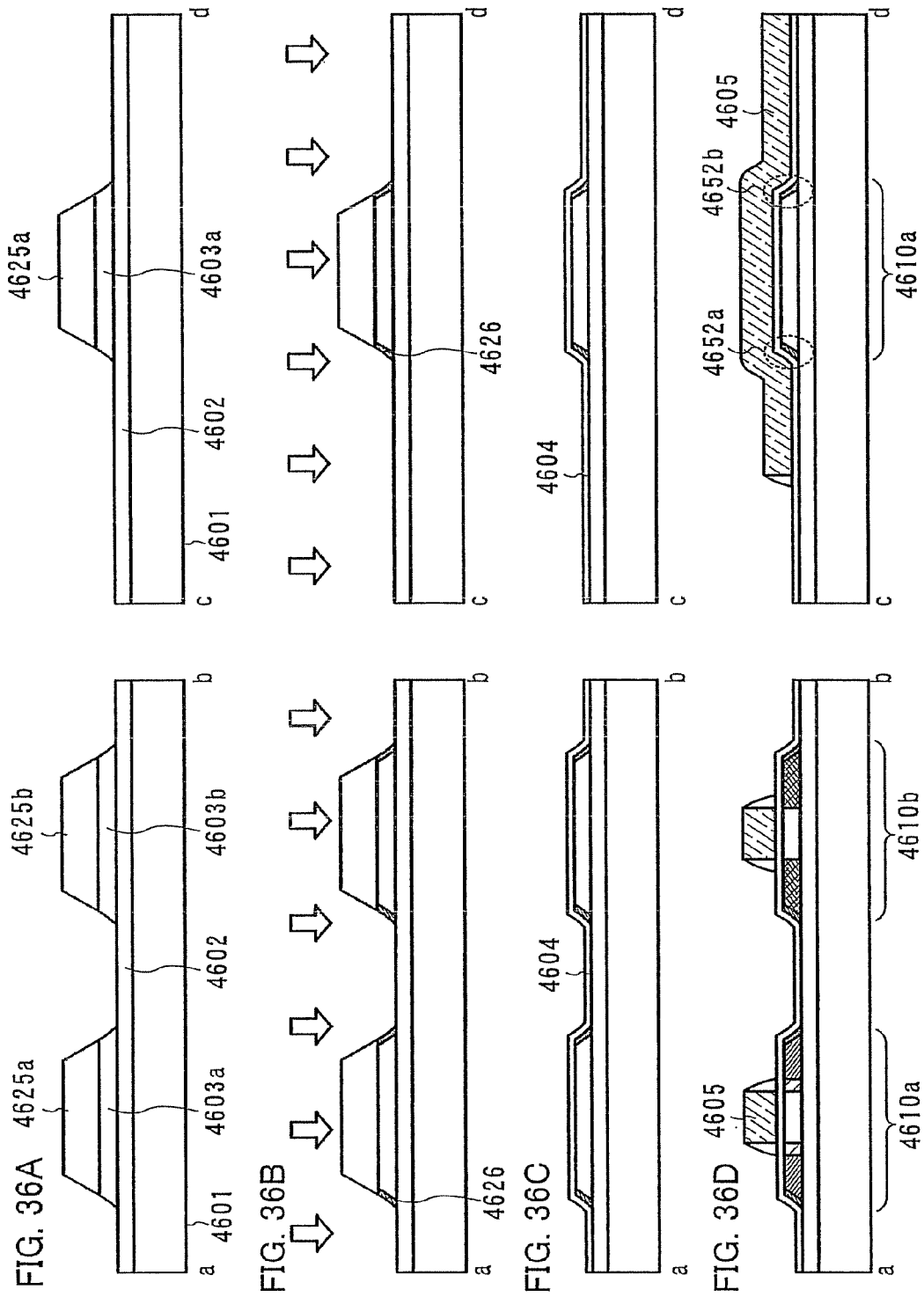

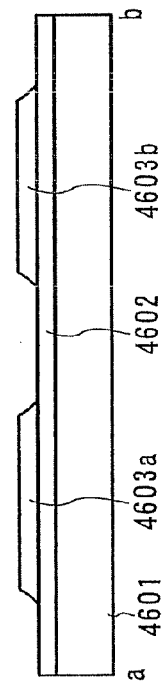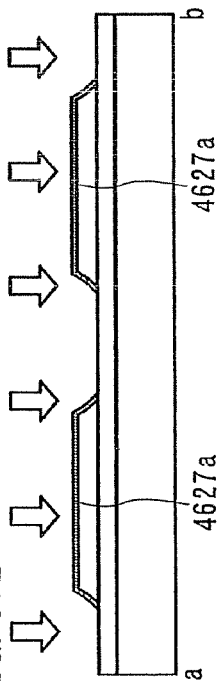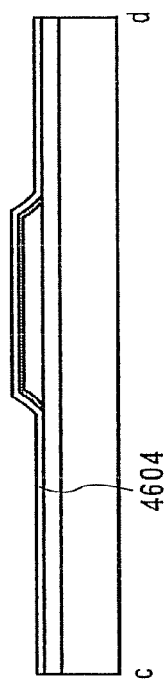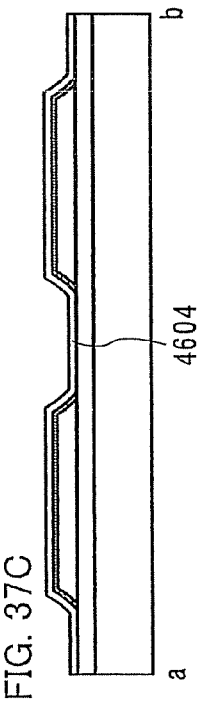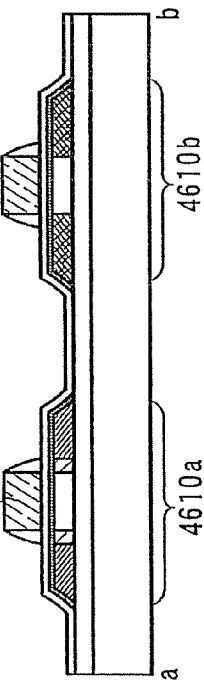
FIG. 37A, FIG. 37B, FIG. 37C, FIG. 37D

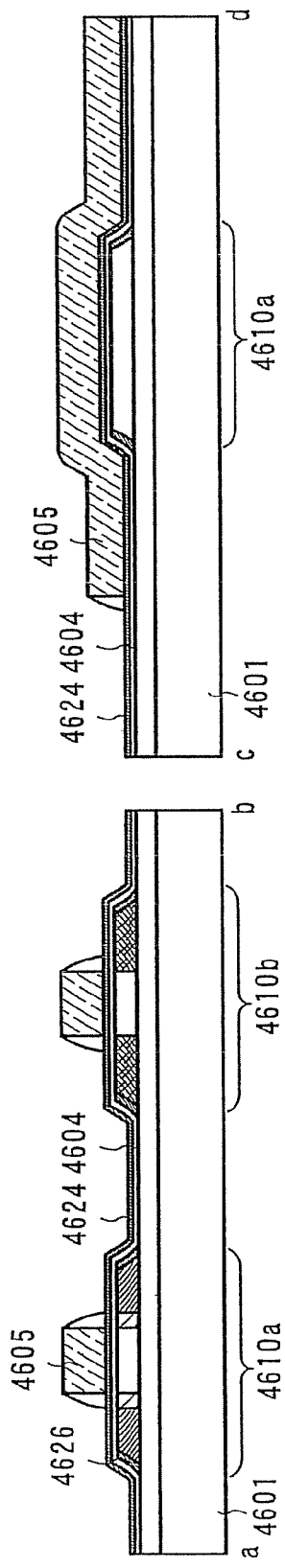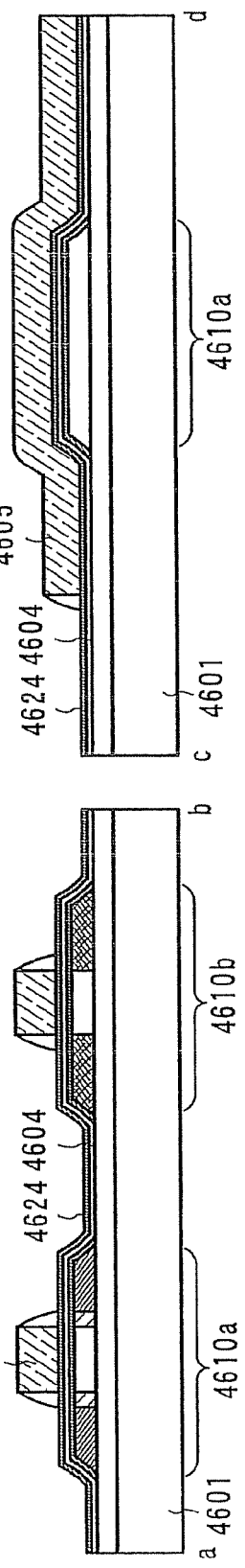
FIG. 38A
FIG. 38B

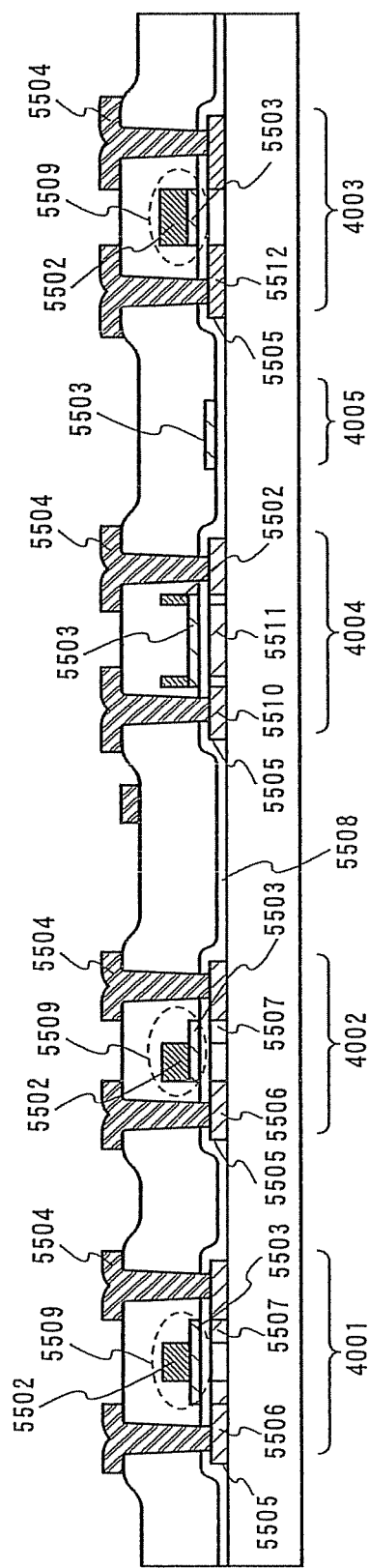

DISPLAY DEVICE, ELECTRONIC DEVICE AND METHOD OF DRIVING DISPLAY DEVICE

This application is a continuation of application Ser. No. 13/032,829 filed on Feb. 23, 2011 now U.S. Pat. No. 8,154,678 which is a divisional of application Ser. No. 11/474,227 filed on Jun. 23, 2006 (U.S. Pat. No. 7,898,623 issued Mar. 1, 2011).

BACKGROUND OF THE INVENTION

1. Field of the Invention

The present invention relates to display devices having a display screen on which characters and images are displayed, and relates to a technique for improving visibility of a display screen.

2. Description of the Related Art

In recent years, a so-called self-luminous display device has been attracting attention, which has pixels formed with a light-emitting element such as a light-emitting diode (LED). As a light-emitting element used in such a self-luminous display device, there is an organic light-emitting diode (also called an OLED, an organic EL element, an electroluminescence (EL) element, or the like), which has been attracting attention and used for an EL display (e.g., an organic EL display). Since the light-emitting element such as an OLED is a self-luminous type, it is advantageous, as compared to a liquid crystal display, in that high visibility of pixels is ensured, no backlight is required, high response speed is achieved, and the like. The luminance of a light-emitting element is controlled by the value of current flowing therein.

As a driving method of controlling gray scales of light emission (luminance) in such a display device, there are a digital gray scale method and an analog gray scale method. In the digital gray scale method, gray scales are expressed by controlling ON/OFF of a light-emitting element in a digital manner. On the other hand, as for the analog gray scale method, there are a method of controlling the light-emission intensity of a light-emitting element in an analog manner, and a method of controlling the light-emission time of a light-emitting element in an analog manner.

In the digital gray scale method, only two states of a light-emitting element can be selected, which are a light-emission state and a non-light-emission state; therefore, only two gray scales can be expressed. Thus, the digital gray scale method is often used in combination with another method to achieve multi-grayscale display. As a method for achieving multi-grayscales, a time gray scale method is often used in combination (Reference 1: Japanese Patent Laid-Open No. 2001-324958 and Reference 2: Japanese Patent Laid-Open No. 2001-343933). In addition, an area gray scale method is used in some cases (Reference 3: Japanese Patent Laid-Open No. 2001-125526).

On the other hand, a pixel configuration for displaying clear images and characters both has been developed (Reference 4: Japanese Patent Laid-Open No. 2005-062416). In general, a delta array or a stripe array is adopted as a pixel configuration; however, in Reference 4, a hexagonal pixel configuration is adopted.

SUMMARY OF THE INVENTION

However, it is difficult to form pixels for each color when the hexagonal pixel configuration is employed. In particular, in a case of an organic EL element, since an organic layer is deposited for each color, the organic layer is not deposited so well, in the case of such a complex structure.

In view of the above problem, it is an object of the present invention to provide a display device in which a display method can be changed as appropriate, with a simple pixel configuration.

One feature of the present invention is a display device comprising: a first display region; a second display region; and a third display region, wherein in the first, second and third regions, the same color is displayed; wherein in a first state, a pixel includes the first display region and the second display region; wherein in a second state, the pixel includes the second display region and the third display region; and wherein an area of the first display region is equal to an area of the third display region.

Another feature of the present invention is that the pixel expresses a gray scale by selecting the display regions included in the pixel to emit light in the display device described above.

Note that various kinds of transistors can be used in the present invention. Therefore, transistors applicable to the present invention are not limited to a particular type. Thus, the present invention can employ a transistor such as a thin film transistor (TFT) using a non-single crystalline semiconductor film typified by amorphous silicon or polycrystalline silicon. Thus, manufacturing can be done at a low manufacturing temperature, at a low cost, devices can be formed over a large substrate or a transparent substrate, or a transistor can transmit light. A MOS transistor, a junction transistor, a bipolar transistor formed with a semiconductor substrate or an SOI substrate, or the like can also be used. Thus, transistors with less variation, transistors with high current supply ability, or transistors with small size can be formed, or less power consumption circuits can be obtained. In addition, a transistor formed with a compound semiconductor such as ZnO, a-InGaZnO, SiGe or GaAs, a thin film transistor thereof or the like can be applied. Thus, manufacturing can be done at a low manufacturing temperature or at room temperature, or a transistor can be formed directly on a low heat resistant substrate such as a plastic substrate or a film substrate, for example. A transistor obtained by an ink-jet method or a printing method can also be used. Thus, manufacturing at room temperature or at a low vacuum degree, or a manufacturing with use of a large substrate is possible. Since manufacturing without a mask (reticle) is possible, layout of a transistor can be changed easily. A transistor using an organic semiconductor or a carbon nanotube, or other transistors can also be applied. Thus, such a transistor can be formed over a flexible substrate. In the case of using a non-single crystalline semiconductor film, it may contain hydrogen or halogen. In addition, a substrate over which transistors are formed is not limited to a particular type, and various kinds of substrates cart be used. Accordingly, transistors can be formed over a single crystalline substrate, an SOI substrate, a glass substrate, a quartz substrate, a plastic substrate, a paper substrate, a cellophane substrate, a stone substrate, a stainless steel substrate, a substrate including a stainless steel foil, or the like. Alternatively, after forming a transistor over a certain substrate, the transistor may be transferred to another substrate. By using such a substrate, a transistor having excellent characteristics or a transistor with low power consumption can be formed, or a nonbreakable device or a heat-resistant device can be manufactured.

Note also that the structure of a transistor is not limited to a particular type and various structures may be employed. For example, a multi-gate structure having two or more gates may be used. In the case of multi-gate structure, since channel regions are connected in series, a structure in which plural transistors are connected in series is obtained. By using a multi-gate structure, off-current can be reduced as well as the withstand voltage can be increased to improve the reliability of the transistor, and even when the drain-source voltage fluctuates at the time when the transistor operates in the saturation region, flat characteristics can be provided without causing variations of a drain-source current. In addition, such a structure that gate electrodes are formed to sandwich a channel may also be employed. By using such a structure that gate electrodes are formed to sandwich a channel, the area of the channel region can be enlarged to increase the value of current flowing therein, and a depletion layer can be easily formed to improve an S value. A structure in which plural transistors are arranged in parallel is obtained, when gate electrodes are formed to sandwich a channel. In addition, any of the following structures may be employed: a structure where a gate electrode is formed over a channel; a structure where a gate electrode is formed below a channel; a staggered structure; an inversely staggered structure; a structure where a channel region is divided into a plurality of regions, and the channel regions are connected in parallel; or a structure where a channel region is divided into a plurality of regions, and the channel regions are connected in series. In addition, a channel (or a part of it) may overlap a source electrode or a drain electrode. With a structure where a channel (or a part of it) overlaps a source electrode or a drain electrode, unstable operation caused by charges accumulated in a part of the channel can be prevented. In addition, an LDD region may be provided. By providing an LDD region, off-current can be reduced, and the withstand voltage can be increased to improve the reliability of the transistor. Even when the drain-source voltage fluctuates at the time when the transistor operates in the saturation region, stable characteristics can be provided without causing variations in a drain-source current.

Note that transistors in the present invention may be any type of transistors and may be formed over various types of substrates. Thus, all circuits may be formed over a glass substrate, a plastic substrate, a single crystalline substrate, an SOI substrate, or other substrates. By forming all circuits over one substrate, the number of parts can be reduced to lower manufacturing cost, or connection points with circuit components can be reduced to enhance reliability. Alternatively, such a structure may be employed that a part of circuits is formed over a substrate, while another part of the circuits is formed over another substrate. That is, all circuits are not required to be formed over the same substrate. For example, such a structure may be employed that a part of circuits is formed over a glass substrate with transistors, while another part of the circuits is formed over a single crystalline substrate so that the IC chip is attached onto the glass substrate by COG (Chip on Glass). Alternatively, the IC chip may be connected to the glass substrate by TAB (Tape Automated Bonding) or by using a printed board. In this manner, by forming a part of circuits over the same substrate, the number of parts can be reduced to lower manufacturing cost, or connection points with circuit components can be reduced to enhance reliability. In addition, since a portion of high driving voltage or a portion of a high driving frequency consumes a lot of power, such a portion is not allowed to be formed over the same substrate, and thus, increase in power consumption can be prevented.

Note that a transistor is an element having at least three terminals of a gate, a drain, and a source. A channel region is provided between a drain region and a source region, and current can flow through the drain region, the channel region and the source region. Here, a source and a drain are exchangeable depending on a structure, an operation condition or the like of a transistor, and thus, it is difficult to determine which is a source or a drain. Thus, in some cases of the present invention, regions serving as a source and a drain are not referred to as a source or a drain. In that case, they are referred to as a first terminal or a second terminal, for example. Further, a transistor may be an element including at least three terminals, a base, an emitter and a collector. Also in this case, an emitter and a collector may be referred to as a first terminal and a second terminal.

In addition, in the case of a multi-gate transistor, for example, a gate electrode of a transistor is connected to a gate electrode of another transistor with the use of a conductive film which is formed from the same material as the gate electrode in many cases. Since this region is a region for connecting a gate electrode to another gate electrode, it may be called a gate wire, while it may also be called a gate electrode since the multi-gate transistor may be regarded as one transistor. That is, such a region may be called a gate electrode or a gate wire as long as it is formed of the same material as the gate electrode or the gate wire and connected thereto. In addition, a part of a conductive film which connects a gate electrode to a gate wire, for example, may also be called a gate electrode or a gate wire.

Note that a gate terminal means a region of a gate electrode or a part of a region electrically connected to the gate electrode.

Note that a source means a part or a whole part of a source region, a source electrode, and a source wire (also called a source line, a source signal line, or the like). A source region is a semiconductor region containing a large amount of p-type impurities (e.g., boron or gallium) or n-type impurities (e.g., phosphorus or arsenic). Accordingly, it does not include a region containing a slight amount of p-type impurities or n-type impurities, that is, a so-called LDD (Lightly Doped Drain) region. A source electrode is a conductive layer formed of a different material from the source region, while being electrically connected to the source region. Note that there is a case where a source electrode and a source region are collectively referred to as a source electrode. A source wire is a wire for connecting source electrodes of different pixels, or a wire for connecting a source electrode with another wire.

Note that there is a portion functioning as both a source electrode and a source wire. Such a region may be called either a source electrode or a source wire. That is, there is a region where a source electrode and a source wire cannot be clearly distinguished from each other. For example, in the case where a source region overlaps a source wire which is extended, the overlapped region functions as both a source wire and a source electrode. Accordingly, such a region may be called either a source electrode or a source wire.

In addition, a region formed with the same material as a source electrode, while being connected to the source electrode may be called a source electrode. A part which overlaps a source region may be called a source electrode as well. Similarly, a region formed with the same material as the source wire, while being connected to the source wire may be called a source wire as well. In the strict sense, such a region does not have a function of connecting to another source electrode in some cases. However, there is a case where this region is formed with same material as the source electrode or the source wire, while being connected to the source electrode or the source wire in order to provide a sufficient manufacturing margin. Accordingly, such a region may also be called either a source electrode or a source wire.

In addition, a conductive film which connects a source electrode to a source wire may be called a source electrode or a source wire, for example.

Note that a source terminal means a part of a source region, a source electrode, or a region electrically connected to the source electrode.

Note also that this is true of a drain, similarly to the source.

In the present invention, a connection includes an electrical connection, a functional connection and a direct connection. Accordingly, in the configuration disclosed in the present invention, other connection than a predetermined connection are also included. At least one element which enables an electrical connection (e.g., a switch, a transistor, a capacitor element, an inductor, a resistor element, or a diode) may be interposed between an element and another element. In addition, at least one of a circuit which enables a functional connection (e.g., a logic circuit (such as an inverter, a NAND circuit or a NOR circuit); a signal conversion circuit (such as a DA conversion circuit, an AD conversion circuit or a gamma correction circuit); an electric potential level conversion circuit (a power supply circuit such as a boost circuit or a buck circuit, or a level shift circuit for changing electric potential level of H signal or L signal), a power source, a current source or a switching circuit, an amplifier circuit (such as an op-amp, a differential amplifier circuit, a source follower circuit, a buffer circuit, or a circuit which can increase a signal amplitude or a current amount); a signal generation circuit, a memory circuit; a control circuit and the like) may be arranged between an element and another element. Alternatively, connection may be conducted directly without interposing other elements or other circuits. Note that only the case that connection may be conducted directly without interposing other elements or other circuits is described as being "directly connected". Meanwhile, description of "electrically connected" includes an electrical connection (i.e., a connection with another element interposed), a functional connection (i.e., a connection with another circuit interposed), and a direct connection (i.e., a connection without another element or another circuit interposed).

In the present invention, a pixel means a minimum unit of an image. Thus, in the case of a color display device having color elements of R (Red), G (Green), and B (Blue), one pixel is composed of a dot for R color element, a dot for G color element, and a dot for B color element. Note that the color element is not limited to three colors, and it may be composed of more than three colors. For example, there is RGBW (W means white), or RGB plus yellow, cyan, and/or magenta. In addition, a color similar to at least one color of RGB may be added. For example, R, G, B1 and B2 may be employed. B1 and B2 are both blue, but have slightly different frequencies. By using such color elements, an image like a real thing can be done or reduction of power consumption can be achieved. Note that plural dots for a certain color element may be included in one pixel. At that time, the plural color elements may have different sizes of regions contributing to displaying. In addition, by controlling plural dots of a circuit color element, gray scales may be expressed. This is called an area gray scale method. Alternatively, plural dots of a circuit color element may be used and signals to be supplied to each dot may be slightly different to widen a viewing angle.

Note that in the present invention, "semiconductor device" means a device including a circuit which includes a semiconductor element (such as a transistor or a diode). In addition, it is acceptable that "semiconductor device" means a general device which can operate with use of semiconductor characteristics. "Display device" means a device having a display element (such as a liquid crystal element or a light-emitting element). Further, it means a display panel itself in which a plurality of pixels including a display element such as a liquid crystal element or an EL element, or a peripheral driver circuit for driving the pixels are formed over a substrate. Moreover, "display device" may include a periphery driver circuit arranged over a substrate by wire-bonding or by using a bump, that is, a so-called chip-on-glass (COG). Furthermore, it may include a device to which a flexible printing circuit (FPC) or a printed wiring board (PWB) is attached (for example, IC, a resistor element, a capacitor element, an inductor, a transistor and the like). It may include an optical sheet such as a polarizing plate or a phase plate. Moreover, it may include a backlight (such as a light guide plate, a prism sheet, a diffusion sheet, a reflecting sheet or a light source (e.g., LED or a cold-cathode tube). Moreover, "light-emitting device" means a display device having a self-luminous type display element such as an EL element or an element for FED, in particular. "Liquid crystal display device" means a display device having a liquid crystal element.

In the present invention, an expression that an object is "formed on" or "formed over" a different object does not necessarily mean that the object is in direct contact with the different object. The expression may include a case where two objects are not in direct contact with each other, with another object sandwiched therebetween. Accordingly, when it is described that a layer B is formed on a layer A (over a layer A), it means either case where the layer B is formed on and in direct contact with the layer A, or where another layer (e.g., a layer C or a layer D) is formed on and in direct contact with the layer A, and then the layer B is formed on and in direct contact with the layer C or D. In addition, when it is described that an object is "formed above" a different object, it does not necessarily mean that the object is in direct contact with the different object, and another object may be sandwiched therebetween. Accordingly, when it is described that a layer B is formed over or above a layer A, it means either case where the layer B is formed in direct contact with the layer A, or where another layer (e.g., a layer C or a layer D) is formed in direct contact with the layer A, and then the layer B is formed in direct contact with the layer C or D. Similarly, when it is described that an object is formed below or under a different object, it means either case where the objects are in direct contact with each other or not in contact with each other.

In accordance with the present invention, a unit constituting one pixel can be changed in accordance with an image. As a result, characters can be displayed clearly and imaged can be displayed smoothly.

BRIEF DESCRIPTION OF THE DRAWINGS

In the accompanying drawings:

FIGS. 23A and 23B each show a cross-section of a display device of the present invention;

FIGS. 24A and 24B each show a cross-section of a display device of the present invention;

FIGS. 25A and 25B each show a cross-section of a display device of the present invention;

FIG. 26 shows a structure of a display device of the present invention;

FIGS. 33A to 33D show cross-sectional structures of a display device of the present invention;

FIGS. 34A to 34C show cross-sectional structures of a display device of the present invention;

FIGS. 35A to 35D show cross-sectional structures of a display device of the present invention;

FIGS. 36A to 36D show cross-sectional structures of a display device of the present invention;

FIGS. 37A to 37D show cross-sectional structures of a display device of the present invention;

FIGS. 38A and 38B show cross-sectional structures of a display device of the present invention;

FIG. 40 shows a cross-sectional structure of a display device of the present invention;

DETAILED DESCRIPTION OF THE INVENTION

Hereinafter, the embodiment modes will be described with reference to the drawings. It is to be noted that the present invention is not limited to the following description, and it is easily understood by those skilled in the art that modes and details herein disclosed can be modified in various ways without departing from the spirit and the scope of the present invention. Therefore, the present invention should not be interpreted as being limited to the description of the embodiment modes to be given below.

Embodiment Mode 1

Figure 1:
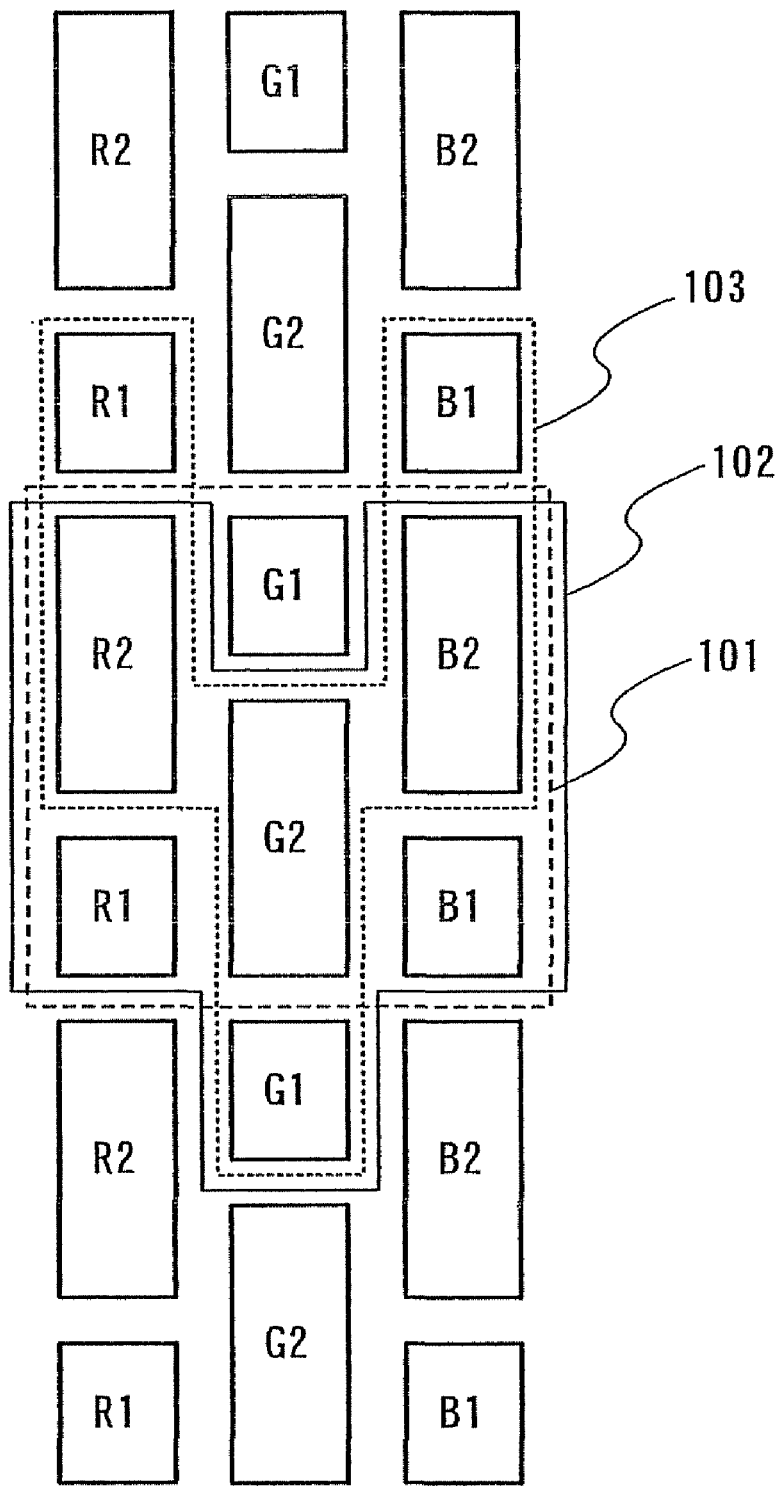
FIG. 1 shows a structure of a display device of the present invention.

FIG. 1 shows a pixel configuration of three pixels. Usually, a region 101 corresponds to one pixel.

R1 and R2 constitute a red sub-pixel, G1 and G2 constitute a green sub-pixel, and B1 and B2 constitute a blue sub-pixel. One pixel is constituted by the sub-pixels of each color. Here, in R1 and R2, areas contributing to light-emission or displaying is set at R1 and R2=1:2. In G1 and G2, areas contributing light-emission or displaying is set at G1 and G2=1:2. In B1 and B2, areas contributing light-emission or displaying is set at B1 and B2=1:2. Gray scales can be expressed by selecting either, both or none of R1 and R2 so as to emit light (or contributes to displaying). In other words, an area gray scale method can be used. In FIG. 1, a square region (dot) surrounded by a heavy line is a display region constituting a part of a sub-pixel. The shape of this display region is not limited to that shown in FIG. 1. R1 is the smallest display region constituting a part of a red sub-pixel, and R2 is a display region having a double area of R1. Thus is true of B1 and B2 constituting the blue sub-pixel, and G1 and G2 constituting the green sub-pixel. In addition, this is true of R1, R2, R4, G1, G2, G4, B1 B2, and B4.

The portion shown by reference numeral 101 is square. When this square is regarded as one pixel unit, a stripe array can be conducted in a whole display screen. Consequently, a clear display can be conducted. In each color, subpixels are aligned in columns and thus, it is easy to form an organic EL element.

Next, a case is shown, where a portion shown by reference numeral 102 constitutes one pixel. In the red sub-pixel, R2 and R1 are aligned in this order, and in the blue subpixel, B2 and B1 are aligned in this order. In the green sub-pixel, G2 and G1 are aligned in this order. In the case of one pixel 101, the order of G1 and G2 is employed to form one pixel, whereas in the case of one pixel 102, the order of G2 and G1 is employed. Consequently, the shape of a portion constituting one pixel is indented. Thus, blurred display can be made, and because of the blurred display, smooth display can be made. This leads to a structure similar to the case where subpixels are arranged in a delta array.

By adopting a more indented shape, a portion 103 may constitute one pixel. Thus, a smoother display can be made.

In this manner, it is possible to change one pixel unit as appropriate, in other words, determine which subpixels constitute one pixel, and thus, how to express display can be changed. For example, when characters are displayed mainly, one pixel having a square shape is formed to display clearly, whereas when images are displayed mainly, one pixel having an indented shape, i.e., a non-square shape is formed by shifting the subpixels up and down. As a result, a smooth display can be performed.

Display region (contributing to displaying) in the subpixel of each color is divided into plural regions. The ratio of the sizes of the regions is set at 1:2. As a result, an area gray scale method can be applied.

It is to be noted that FIG. 1 shows three pixels in one column; however, the present invention is not limited to this structure.

Figure 2:
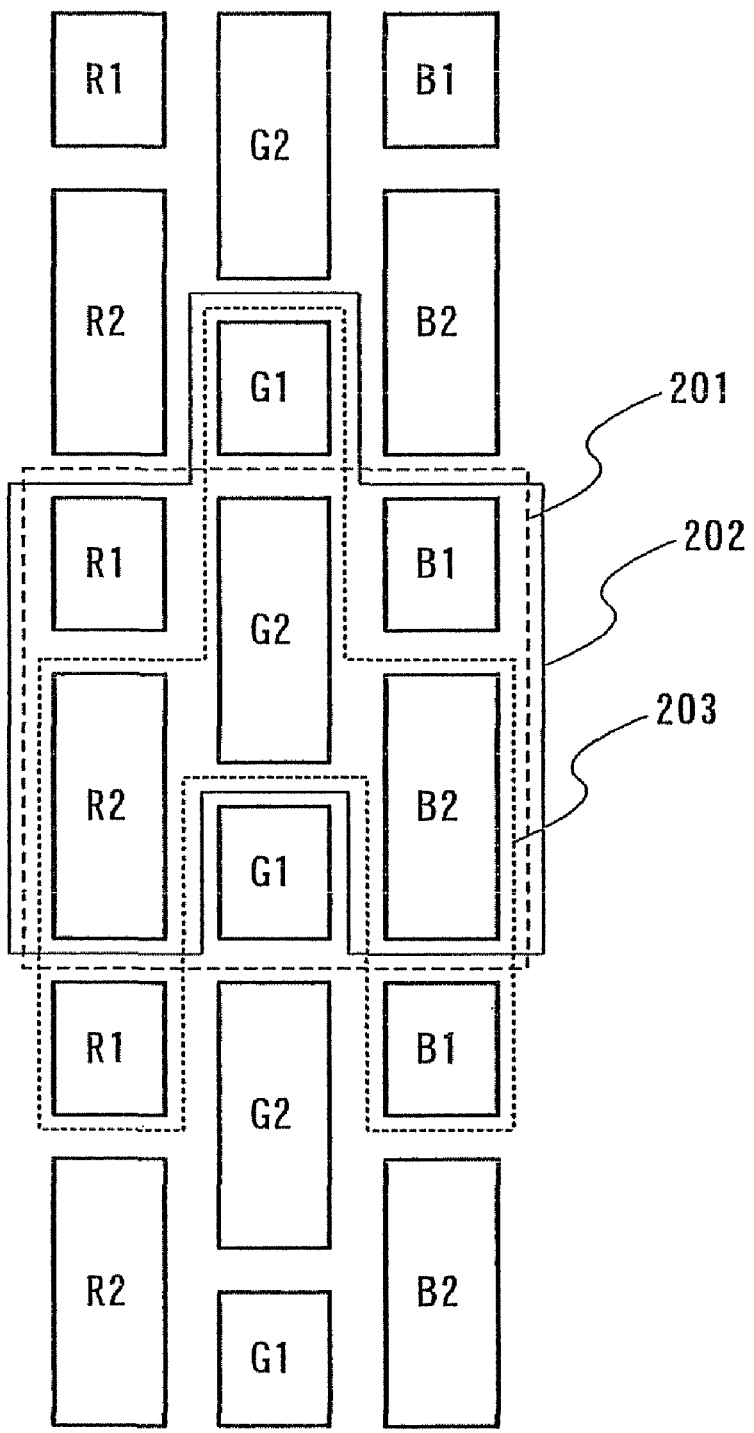
FIG. 2 shows a structure of a display device of the present invention.

For example, as shown in FIG. 2. in a red subpixel, R1 and R2 are aligned in this order, in a blue subpixel, B1 and B2 are aligned in this order, and in a green subpixel, G2 and G1 are aligned in this order.

As to FIG. 2, the pixel configuration may be changed as appropriate, by constituting one pixel with any of a portion 201, a portion 202 and a portion 203, in the same way as in FIG. 1. The portion 201 is square; the portion 202 is a square having an indented shape; the portion 203 is a more indented shape.

In FIG. 1 or FIG. 2, one column has been shown, and when plural columns are formed, a plurality of such columns shown in FIG. 1 or FIG. 2 may be arrayed in parallel. Alternatively, the column of FIG. 1 and the column of FIG. 2 may be arrayed alternately. In the case of arraying the columns alternately, the subpixels are arrayed to be more complicated (indented), thereby conducting smoother display.

Note that in FIG. 1 or FIG. 2, the subpixels are arrayed in the order of red (R) green (G), and blue (B) in a horizontal direction; however, the present invention is not limited to this. The subpixels may be arrayed in an appropriate order.

Further, in FIG. 1 or FIG. 2, areas of the display regions (contributing to displaying, or also referred to as a light-emitting region) of red (R) green (G), and blue (B) are equal; however, the present invention is not limited to this. The sizes of the subpixels may be changed for each color, in consideration of degradation speed.

Note that FIG. 1 and FIG. 2 show the case where three colors Of red (R) green (G), and blue (B) constitute one pixel; however the present invention is not limited to this. White (W) may be added to the three colors, or all the colors may be replaced by other colors.

Figure 3:
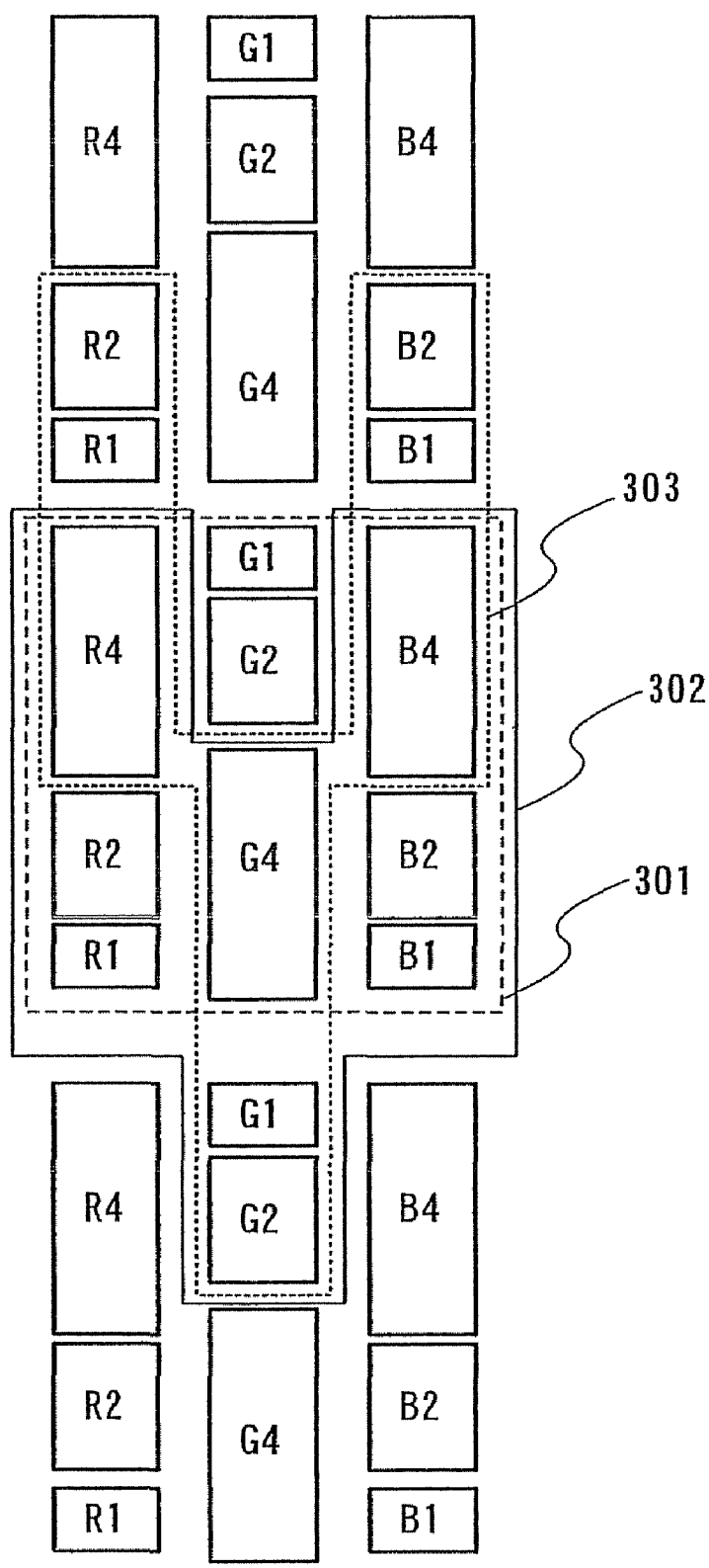
FIG. 3 shows a structure of a display device of the present invention.

Note that in FIG. 1 and FIG. 2, the subpixel of each color includes two display regions; however, the present invention is not limited to this. More display regions may be employed. A case that a subpixel of each color includes three display regions is shown in FIG. 3 as an example. The ratio of sizes of display regions (contributing to displaying or also referred to as a light-emitting region) of the subpixel for each color is set at 1:2:4. As a result, a 3-bit gray scale can be expressed in the case of employing an area gray scale method. In FIG. 3, one pixel may be constituted, as shown in portions denoted by 301 to 303, similarly.

In addition, in FIGS. 1 to 3, the area ratio of display regions (contributing to displaying) of the subpixel for each color is set at 1:2 or 1:2:4; however, the present invention is not limited to this. The ratio may be set at 1:4 or 1:1, as long as the ratio can express a gray scale well. The best method for expressing a gray scale is to employ power of 2, which is preferable.

Embodiment Mode 2

Figure 4:
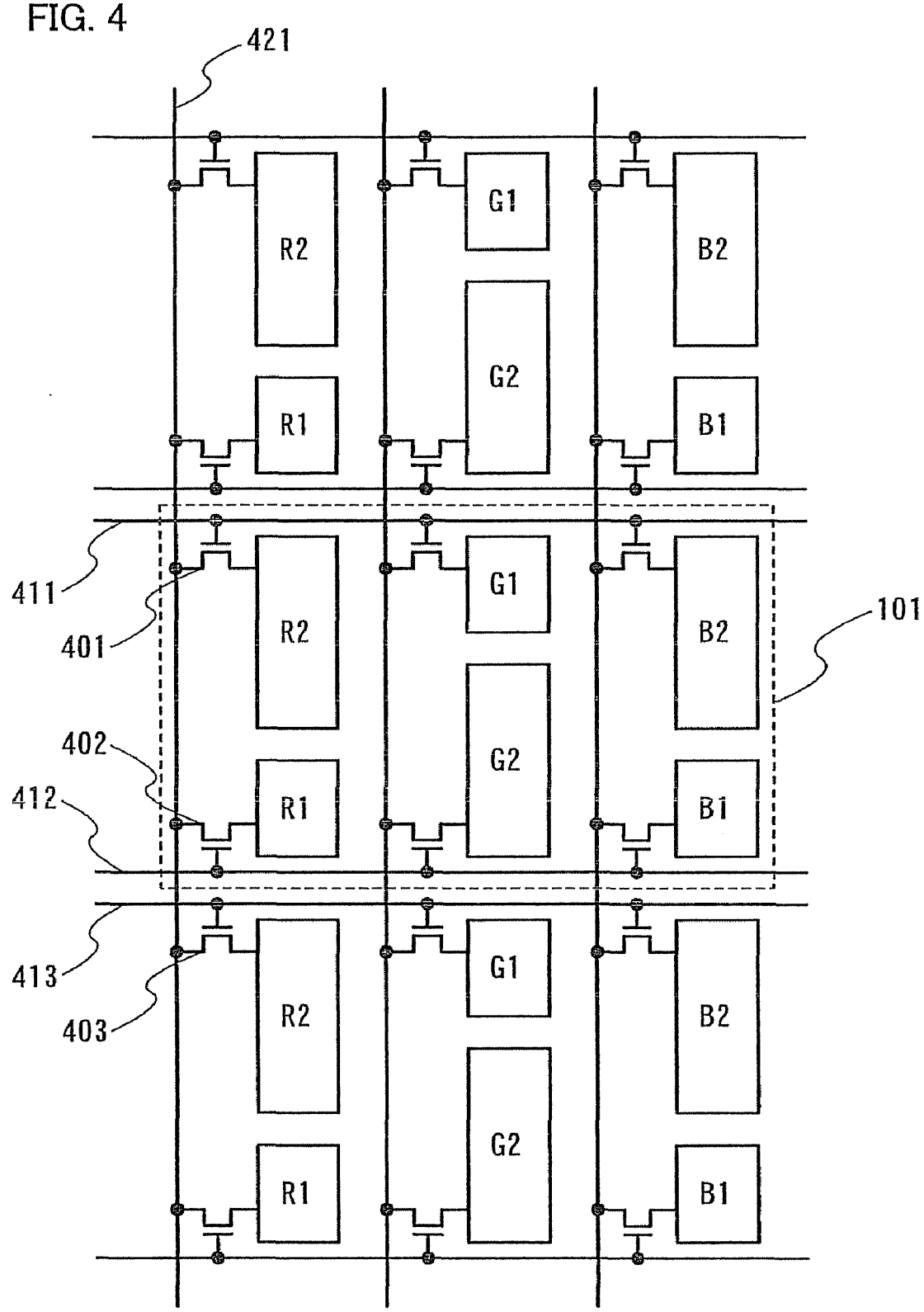
FIG. 4 shows a structure of a display device of the present invention.

In Embodiment Mode 2, supply of a signal to each subpixel will be described. In FIG. 4, a signal line is arranged for each color and a gate signal line is arranged for each display region of each color. FIG. 4 corresponds to the structure in FIG. 1; however the present invention is not limited to this structure.

R2 at a second row is connected to a signal line 421 via a selecting transistor 401. R1 at a second row is connected to the signal line 421 via a selecting transistor 402. In other words, R1 and R2 are connected to the same signal line. R2 at a third row is also connected to the signal line 421 via a selecting transistor 403.

A gate signal line is connected to each selecting transistor. A gate signal line 411 is connected to the selecting transistor 401. A gate signal line 412 is connected to the selecting transistor 402. A gate signal line 413 is connected to the selecting transistor 403. By selecting each gate signal line sequentially, a signal can be supplied to each subpixel via the signal line 421.

Here, the gate signal lines are arranged in an upper side and a bottom side of the portion 101. Thus, the gate signal lines can be arrayed as a straight line.

Figure 5:
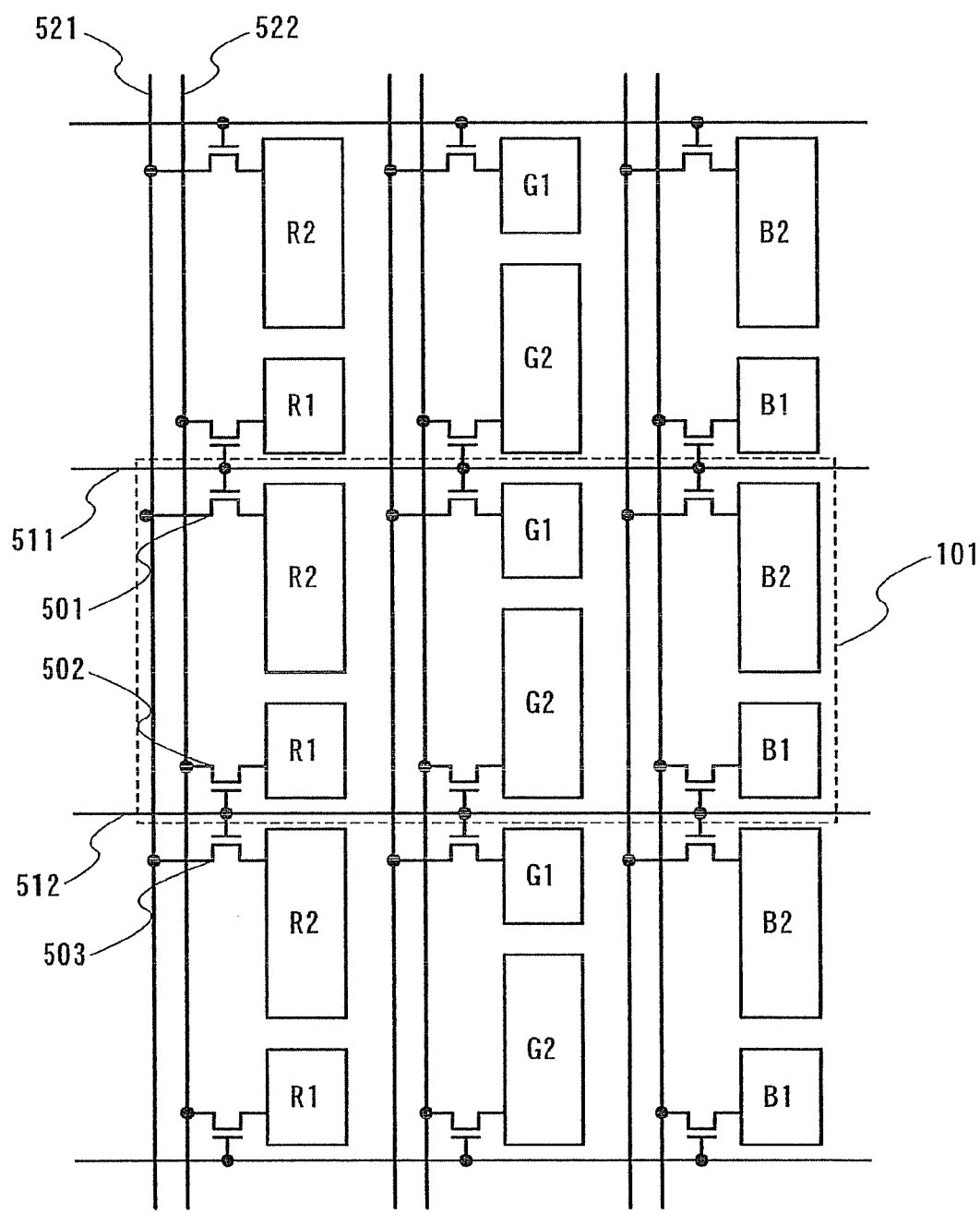
FIG. 5 shows a structure of a display device of the present invention.

Next, FIG. 5 shows a case that the number of gate signal lines is reduced by sharing the gate signal lines.

R2 at a second row is connected to a signal line 521 via a selecting transistor 501. R1 at the second row is connected to a signal line 522 via a selecting transistor 502. In other words, R1 and R2 are connected to different signal lines. Similarly, R2 at a third row is also connected to the signal line 521 via a selecting transistor 503.

Two selecting transistors of the upper and lower subpixels are connected to one gate signal line of the gate signal lines. In other words, one gate signal line is shared. The selecting transistor 501 is connected to a gate signal line 511, the selecting transistor 502 is connected to a gate signal line 512, and the selecting transistor 503 is also connected to the gate signal line 512. When the gate signal line 512 is selected, the selecting transistors 502 and 503 are turned ON at the same time. However, since the signal lines are different, a signal can be supplied to the subpixels without problems.

Note that this embodiment mode has been described in detail, relating to Embodiment Mode 1. Thus, this embodiment mode can be freely combined with Embodiment Mode 1.

Embodiment Mode 3

Figure 6:
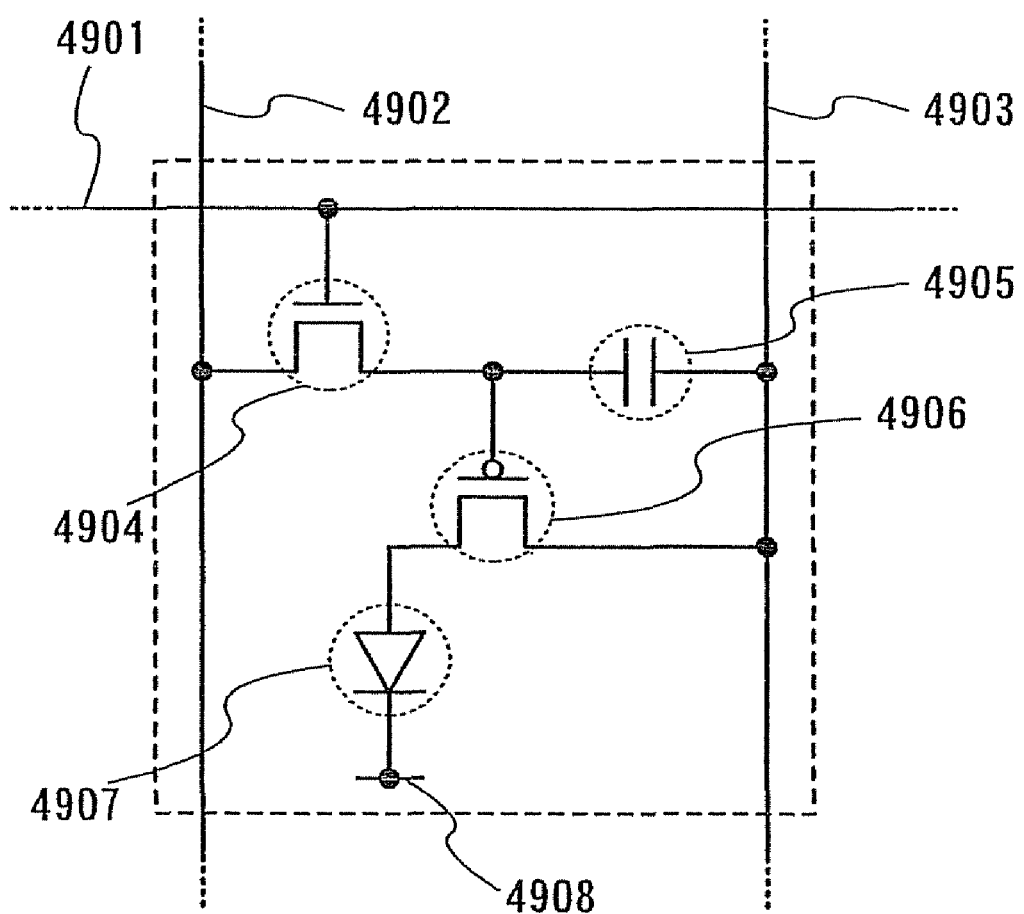
FIG. 6 shows a structure of a display device of the present invention.

Next, an example of a pixel circuit is shown. FIG. 6 shows a pixel of an organic EL. FIG. 6 represents a pixel circuit per one display region.

A selecting transistor 4904 which is a first transistor is controlled by using a gate signal line 4901 which is a first wire. When the selecting transistor 4904 is turned ON, a video signal is input into a storage capacitor 4905 from a source signal line 4902 which is a second wire. At this time, a driving transistor 4906 which is a second transistor is turned ON/OFF depending on the video signal, and a current flows to an opposite electrode 4908 through a light-emitting element 4907 from a power supply line 4903 which is a third wire.

Note that the selecting transistor 4904 of FIG. 6 corresponds to the transistors 401 to 403 of FIG. 4, and the transistors 501 to 503 of FIG. 5. In addition, the source signal line 4902 of FIG. 6 corresponds to the signal line 421 of FIG. 4 and the signal line 521 or 522 of FIG. 5.

Figure 7:
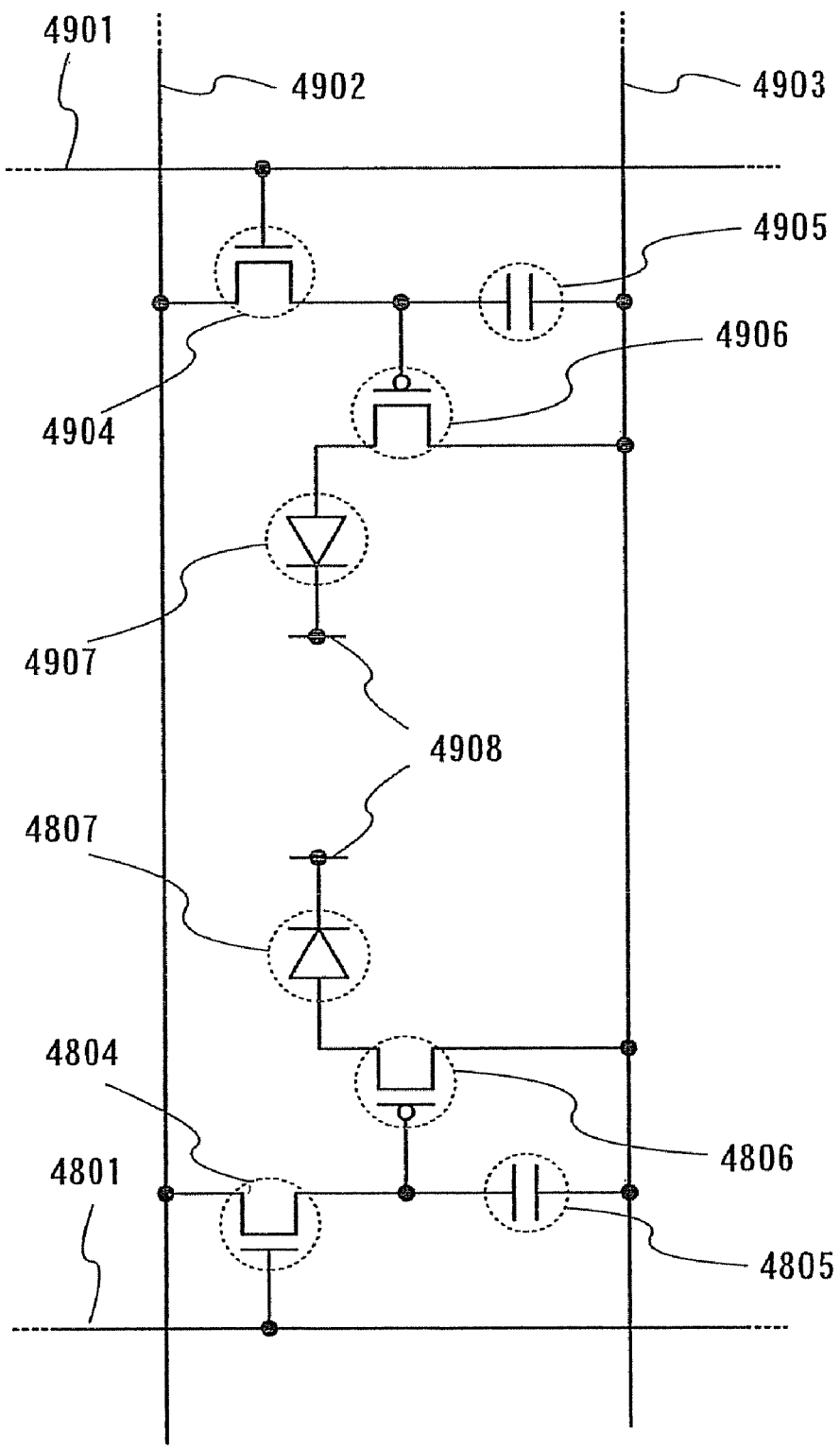
FIG. 7 shows a structure of a display device of the present invention.

Next, FIG. 7 shows a pixel circuit for two display regions. Two light-emitting elements 4907 and 4807 are shown. Sizes of display regions of the two light-emitting elements are set to be suitable, appropriately. The sizes are usually set at 1:2. Although FIG. 7 corresponds to the case of FIG. 4, the configuration of FIG. 7 can be easily applied to FIG. 5.

Note that the selecting transistor 4904 of FIG. 7 corresponds to the transistor 401 of FIG. 4, and a selecting transistor 4804 of FIG. 7 corresponds to the transistor 402 of FIG. 4. In addition, the source signal line 4902 of FIG. 7 corresponds to the signal line 421 of FIG. 4. The gate signal line 4901 of FIG. 7 corresponds to the gate signal line 411 of FIG. 4, and a gate signal line 4801 of FIG. 7 corresponds to the gate signal line 412 of FIG. 4.

The pixel configuration is not limited to those shown in FIGS. 6 and 7. A configuration for correcting characteristic variation of a driving transistor may be applied, for example.

As the pixel configuration for correcting characteristic variation, broadly classified, there is a pixel configuration for correcting variation of a threshold voltage or a pixel configuration in which a current is input as a video signal.

Figure 8:
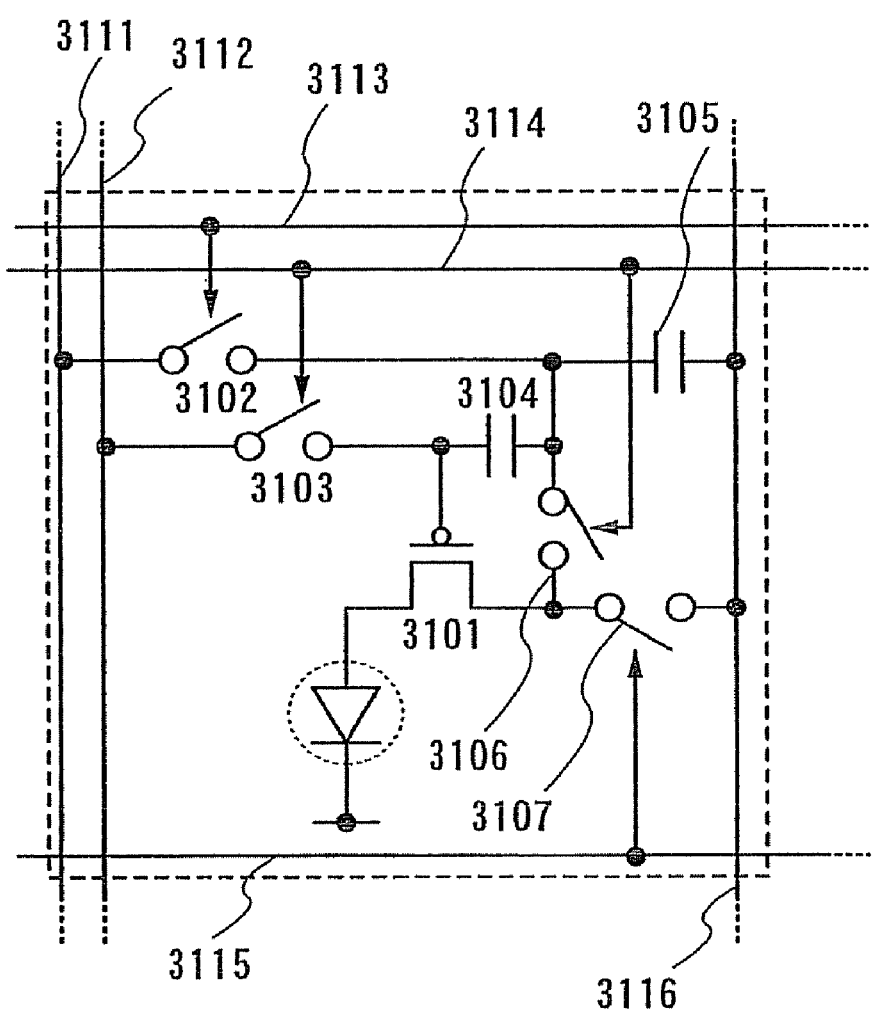
FIG. 8 shows a structure of a display device of the present invention.

FIG. 8 shows a pixel configuration for correcting variation of a threshold voltage. A threshold voltage of a driving transistor 3101 is held in a capacitor element 3104 by controlling a switch 3106. A switch 3103 has a function of initializing a gate electric potential of the driving transistor 3101. A video signal is input from a source signal line 3111 through a switch 3102. This video signal is written in a capacitor element 3105. A switch 3107 controls conduction or non-conduction between a source terminal of the driving transistor 3101 and a power supply line 3116. A first scanning line 3113 controls ON/OFF of the switch 3102. A second scanning line 3114 controls ON/OFF of the switch 3103. A third scanning line 3115 controls ON/OFF of the switch 3107.

Figure 9:
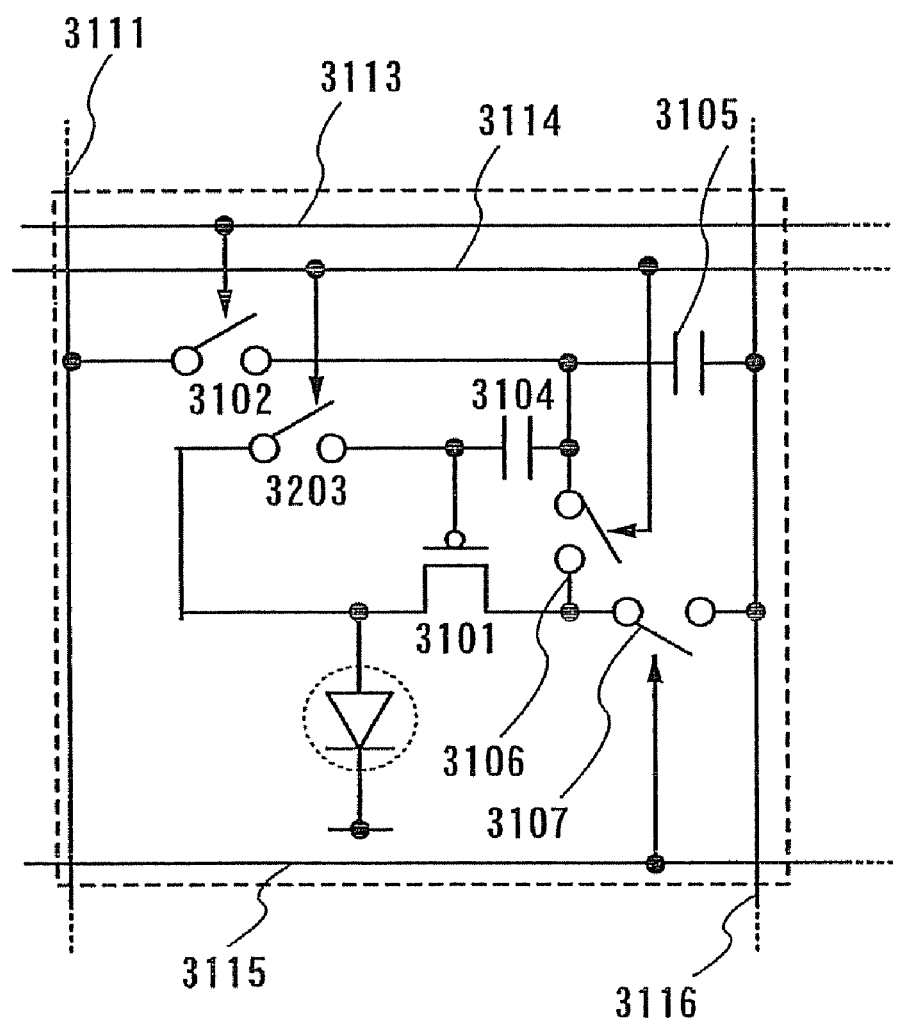
FIG. 9 shows a structure of a display device of the present invention.

The configuration of FIG. 8 needs a wire 3112 for initializing the gate electric potential of the driving transistor 3101. On the other hand, FIG. 9 shows a configuration in which the wire 3112 is eliminated. A gate of the driving transistor 3101 is connected to a drain of the driving transistor 3101 via a switch 3203.

It should be noted that there are various pixel configurations for correcting variation of a threshold voltage; thus, the present invention is not limited to the configurations of FIGS. 8 and 9. In this manner, by using a pixel configuration for correcting variation of a threshold voltage, variation of current flowing to a light-emitting element can be reduced.

Figure 10:
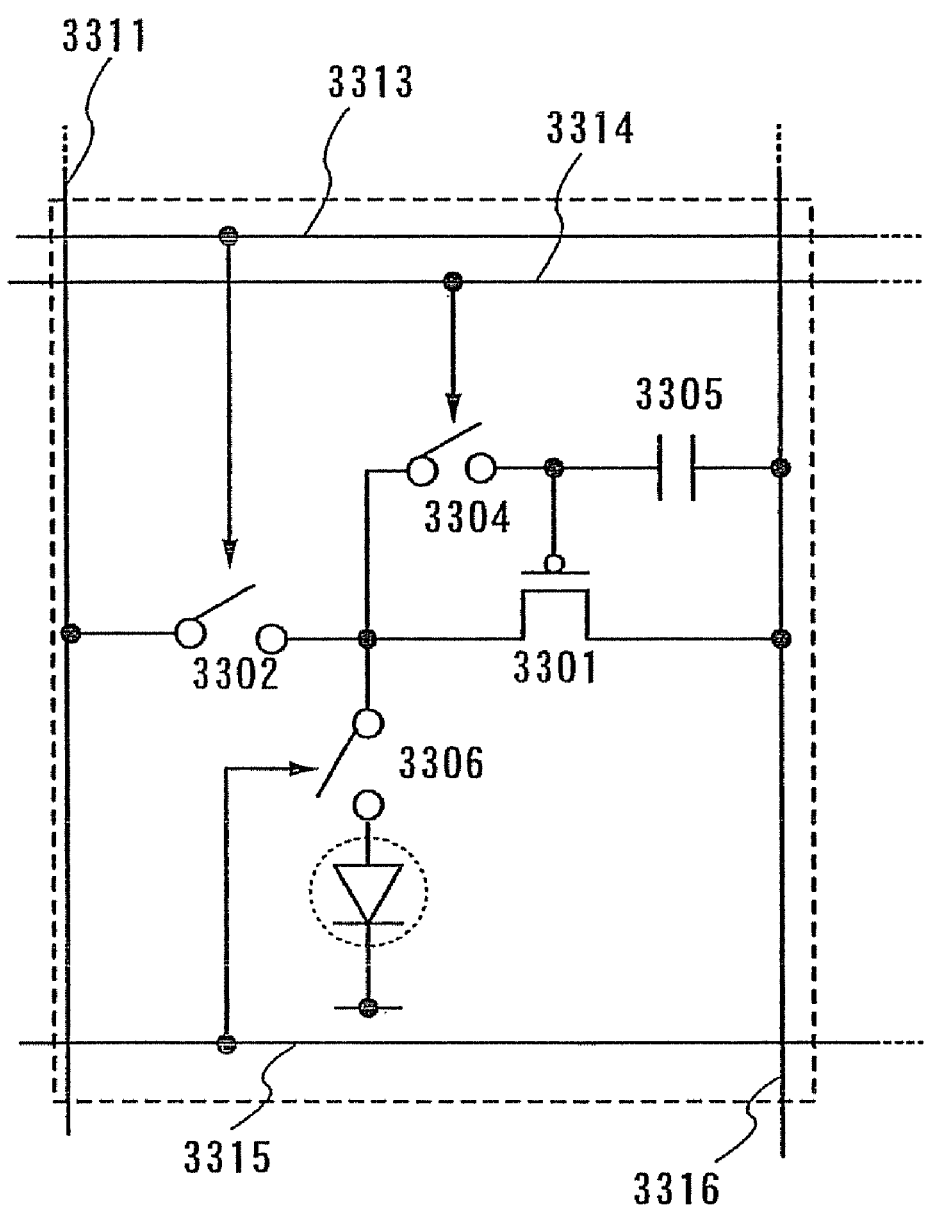
FIG. 10 shows a structure of a display device of the present invention.
Figure 11:
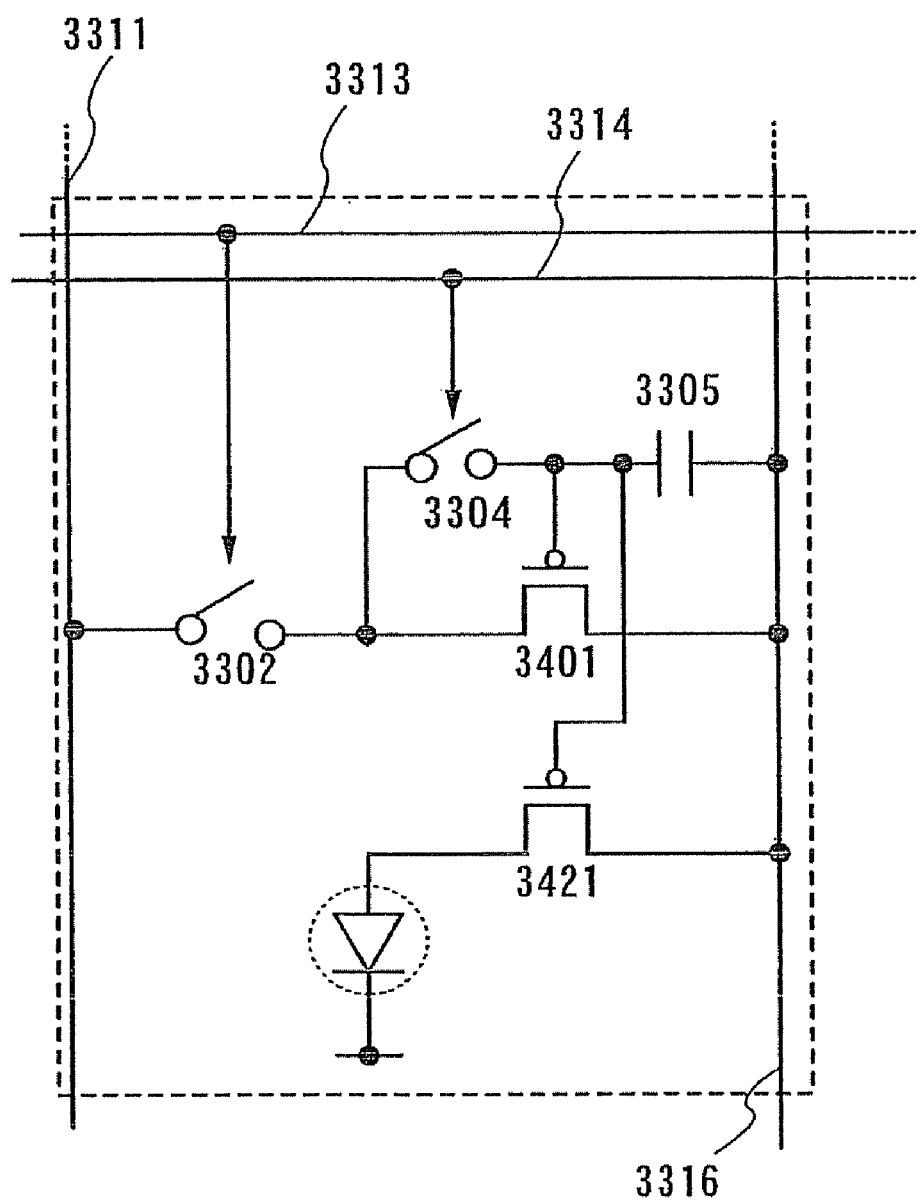
FIG. 11 shows a structure of a display device of the present invention.

Next, FIG. 10 shows a pixel configuration in which a current is input as a video signal. When a current in accordance with a video signal is supplied to the source signal line 3311, and switches 3302 and 3304 are turned ON, the current flows to a driving transistor 3301 and thus, a voltage between a gate and a source is generated by the current. The voltage between the gate and the source is held in a capacitor element 3305, and then, when the switches 3302 and 3304 are turned OFF and a switch 3306 is turned ON, a current is supplied to the light-emitting element from a power supply line 3316. A first scanning line 3313 controls ON/OFF of the switch 3302. A second scanning line 3314 controls ON/OFF of the switch 3304. A third scanning line 3315 controls ON/OFF of the switch 3306. In FIG. 10, the transistor to be supplied with a signal current and the transistor for supplying a current to the light-emitting element are the same; however, they may be different. The case in which the transistors are different is shown in FIG. 11. In FIG. 11, a transistor 3401 to be supplied with a signal current and a transistor 3421 for supplying a current to a light-emitting element are different.

Note that there are various pixel configurations in which a current is input to correct variation; thus, the present invention is not limited to the configurations of FIGS. 10 and 11. As described above, by using a pixel configuration for correcting variation by inputting a current, variation of a current flowing to a light-emitting element can be reduced.

In FIG. 8 to FIG. 11, the pixel circuits per display region are shown; however, as well as the case of FIG. 6, even when plural display regions are provided, the present invention can be easily conducted.

Note that a particular light-emitting element is not necessarily arranged in a pixel. Further, light-emitting elements can employ various modes. For example, there are display media whose contrast changes by an electromagnetic action, such as an EL element (e.g., an organic EL element, an inorganic EL element, or an EL element containing an organic material and an inorganic material), an electron-emissive element, a liquid crystal element, electronic ink, an optical diffractive element, a discharging element, digital a micromirror device (DMD), a piezoelectric element, or a carbon nanotube. In addition, a display device provided with an EL panel using an EL element includes an EL display; a display device using an electron-emissive element includes a field emission display (FED), a surface-conduction electron-emitter display (SED) or the like; a display device provided with a liquid crystal panel using a liquid crystal element includes a liquid crystal display; a digital paper type of a display device using electronic ink includes electronic paper; a display device using an optical diffractive element includes a grating light valve (GLV) type display; and a plasma display panel (PDP) type of a display using a discharging element includes a plasma display; a display device using a digital micromirror device (DMD) includes a digital light processing (DLP) display device; a display device using a piezoelectric element includes a piezoelectric ceramic display; and a display device using a carbon nanotube includes an NED (Nano Emissive Display) and the like.

Note that a storage capacitor, like the storage capacitor 4905, functions to hold a gate potential of the driving transistor 4906. Although the storage capacitor 4905 is connected between a gate of the driving transistor 4906 and the power supply line 4903, the present invention is not limited to this configuration. The storage capacitor 4905 may be provided anywhere as long as it can hold the gate potential of the driving transistor 4906. In addition, the storage capacitor 4905 may be omitted in the case where a gate capacitance of the driving transistor 4906 and the like can be used for holding the gate potential of the driving transistor 4906.

Note that various types of elements, such as an electric switch or a mechanical switch may be used, as an example, for the switches shown in FIGS. 8 to 11. That is, any switch can be used, as long as it can control a current flow, and various elements may be used without limiting to a particular element. For example, it may be a transistor, a diode (e.g., a PN diode, a PIN diode, a Schottky diode, or a diode-connected transistor), a thyristor, or a logic circuit configured with them. Therefore, in the case of using a transistor as a switch, a polarity thereof (conductivity) is not particularly limited because it operates just as a switch. However, when off-current is preferred to be small, a transistor having a polarity with small off-current is desirably used. As a transistor with small off-current, there are a transistor provided with an LDD region, a transistor having a multi-gate structure and the like. Further, it is desirable that an N-channel transistor be employed when a potential of a source terminal of the transistor which is operated as a switch is closer to the low-potential-side power supply potential (e.g., Vss, GND, or 0 V), while a P-channel transistor be employed when the potential of the source terminal is closer to the high-potential-side power supply potential (e.g., Vdd). This helps the switch operate efficiently since the absolute value of the gate-source voltage can be increased. Note also that a CMOS switch may be constructed by using both N-channel and P-channel transistors. In the case of such a CMOS switch, since a current can flow when either the P-channel transistor or the N-channel transistor is conductive, the CMOS can easily operate as a switch. For example, even when a voltage of an input signal to a switch is high or low, an appropriate voltage can be output. In addition, since an amplitude value of a voltage as a signal for turning ON/OFF a switch can be made low, power consumption can be lowered. Note that when a transistor is used as a switch, an input terminal (one terminal of a source terminal and a drain terminal), an output terminal (the other terminal of the source terminal and the drain terminal), and a terminal for controlling conduction (a gate terminal) are included. On the other hand, when a diode is used as a switch, there is a case that a terminal for controlling conduction is not included. Thus, wires for controlling terminals can be reduced.

Figure 12A:
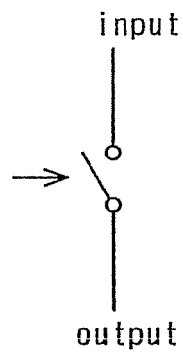
FIGS. 12A to 12D each show a structure of a display device of the present invention.
Figure 12B:
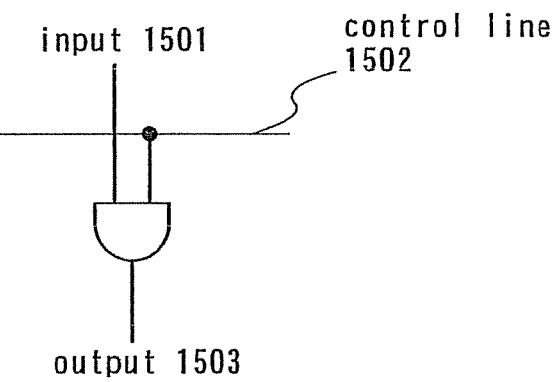

FIGS. 12A to 12D each show an example of a switch. FIG. 12A schematically shows a switch. FIG. 12B shows a switch using an AND circuit. Whether a signal from an input 1501 is transmitted to an output 1503 or not is controlled by a control line 1502. Note that in FIG. 12B, such a control is possible, that an L signal is output from the output 1503 regardless of an input signal. However, the output 1503 is never in a floating state. Accordingly, the switch shown in FIG. 12B is preferably used in the case where the output 1503 is connected to an input of a digital circuit or the like. Provided that an input of a digital circuit is set in a floating state, an output thereof becomes unstable, which is undesirable. Therefore, when a switch is connected to an input of a digital circuit, the switch shown in FIG. 12B can be preferably used.

Although FIG. 12B shows a configuration using an AND circuit, the present invention is not limited to this. A similar function can be implemented by using an OR circuit, a NAND circuit, or a NOR circuit.

Figure 12C:
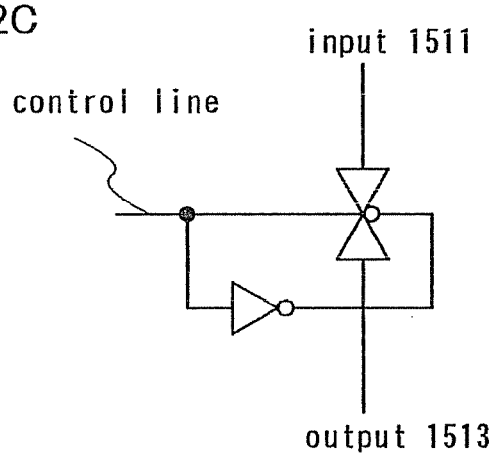
Figure 12D:
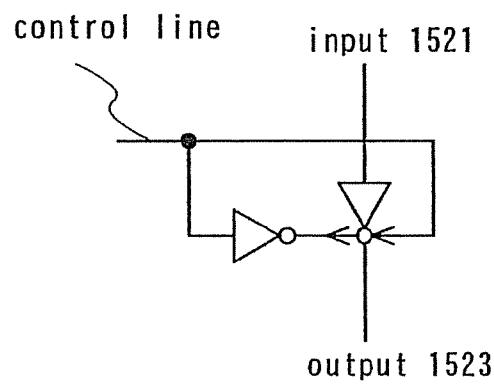

On the other hand, in order to set an input of a circuit on the output side of the switch to be in a floating state, a switch shown in FIG. 12C or FIG. 12D may be used. FIG. 12C shows a circuit called a transmission gate or an analog switch. In FIG. 12C, a potential of an input 1511 is almost directly transmitted to an output 1513. Therefore, this is suitable for transmitting analog signals. FIG. 12D is a circuit called a clocked inverter. In FIG. 12D, a signal from an input 1521 is inverted to be transmitted to an output 1523. Therefore, this is suitable for transmitting digital signals.

Figure 13:
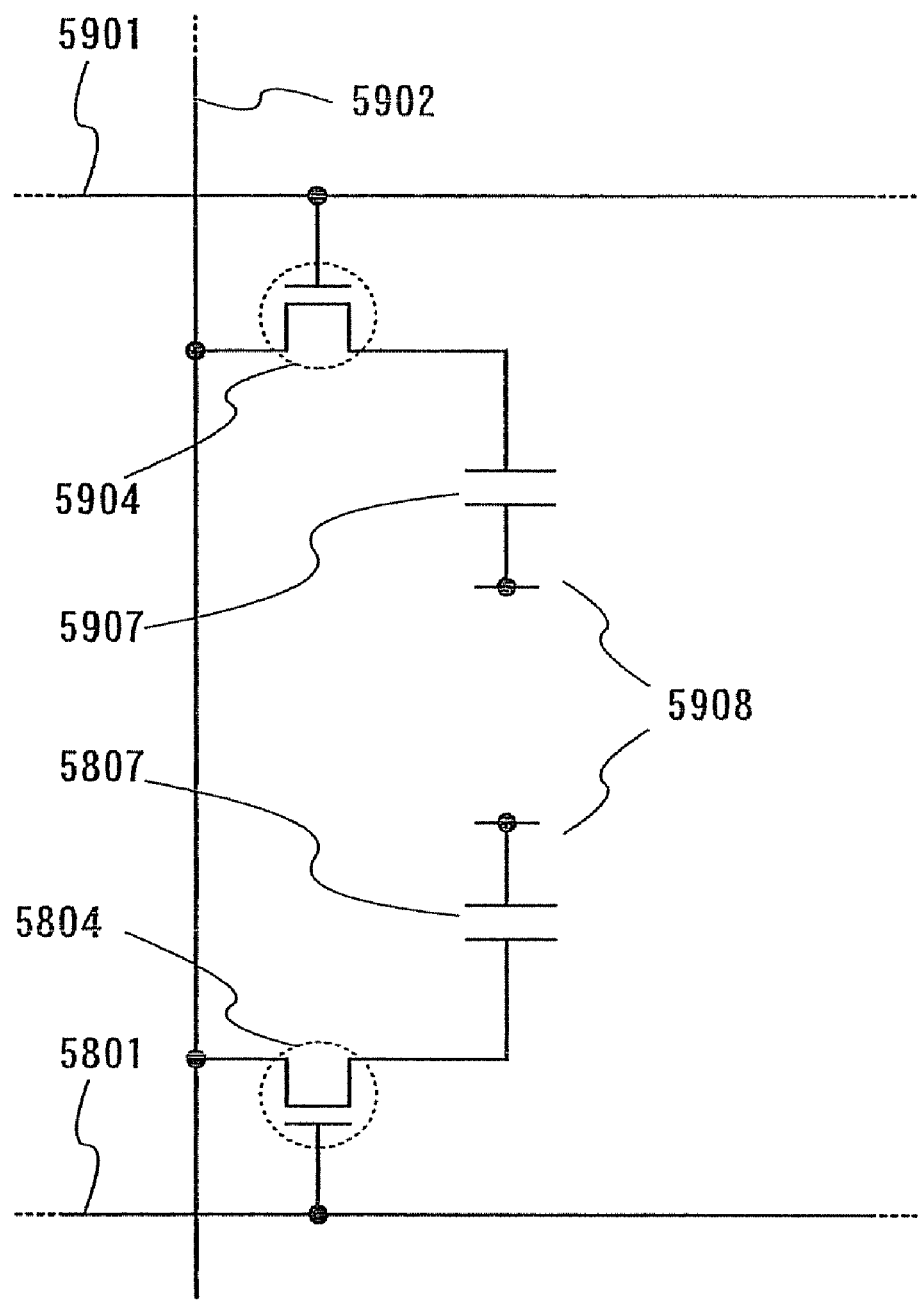
FIG. 13 shows a structure of a display device of the present invention.

In FIGS. 6 to 11, a pixel circuit of an organic EL has been shown; however, the present invention is not limited to this. FIG. 13 shows a case where a liquid crystal element is used, as an example. FIG. 13 shows a pixel circuit for two display regions. Two liquid crystal elements 5907, 5807 and opposite electrode 5908 are shown. Sizes of display regions of the liquid crystal elements are set to be suitable, appropriately. The sizes are usually set at 1:2. Note that the selecting transistor 5904 of FIG. 13 corresponds to the transistor 401 of FIG. 4, and a selecting transistor 5804 of FIG. 13 corresponds to the transistor 402 of FIG. 4. In addition, the source signal line 5902 of FIG. 13 corresponds to the signal line 421 of FIG. 4. The gate signal line 5901 of FIG. 13 corresponds to the gate signal line 411 of FIG. 4, and a gate signal line 5801 of FIG. 13 corresponds to the gate signal line 412 of FIG. 4.

This embodiment mode has been described in detail, regarding to Embodiment Modes 1 and 2. Thus, this embodiment mode can be freely combined with Embodiment Mode 1 or 2.

Embodiment Mode 4

In using a digital gray scale method, only two states of a display element can be expresses, which are a light-emission state (also, referred to as a light-transparent state) and a non-light-emission state (also, referred to as a non-light-transparent state). Thus, the digital gray scale method is often used in combination with another method to achieve multi-grayscale display. A driving method of a pixel for multi-grayscale will be described.

As a method for conducting multi-grayscale, there are a time gray scale method and an area gray scale method. The time gray scale method is a method for expressing a gray scale by changing the length of a light-emitting time during a certain period. The area gray scale method is a method for expressing a gray scale by changing the size of a light-emitting area.

Note that the time gray scale method and the area gray scale method may be combined with each other.

As for the area gray scale method, as shown in FIGS. 1 to 3, a plurality of display regions (region contributing to displaying) are provided and which of the display regions are made to emit light, thereby expressing grays scales.

Herein, the time gray scale method will be described in detail. In a digital time gray scale method, one-frame period is divided into a plurality of sub-frame periods. Then, a gray scale is expressed by changing the combination of a lighting sub-frame period during each frame period.

Figure 14:
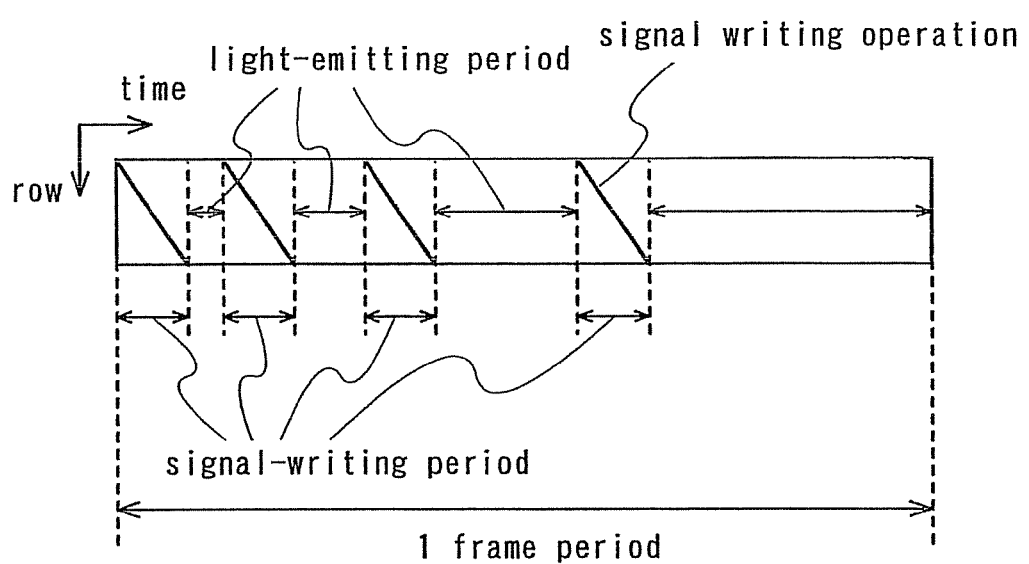
FIG. 14 shows a driving method of a display device of the present invention.

FIG. 14 shows a timing chart in a case where a period for writing a signal to a pixel (also, referred to as a signal-writing period) and a period for light-emission (also, referred to as a light-emitting period) are separated. First, a signal for one screen is input into all pixels in a signal-writing period. During this period, the pixels emit no light. After the signal-writing period is finished, a light-emitting period starts and the pixels emit light. Next, a subsequent sub-frame starts and a signal for one screen is input into all pixels in a signal-writing period. During this period, the pixels emit no light. After the signal-writing period is finished, a light-emitting period starts and the pixels emit light.

By repeating similar operations, a gray scale can be expressed. At this time, it is possible to express various gray scales with a power of 2 for the length of the lighting period in each sub-frame period, like 1:2:4:8: . . . .

Moreover, the area gray scale method is combined with a time gray scale method, thereby expressing more gray scales. For example, in a case that two bits are expressed by the area gray scale method and six bits are expresses by the time gray scale method, 8 bits can be expressed as a whole.

A pixel configuration in this case may have configurations of FIGS. 6 and 7.

Note that, in a signal-writing period, potentials of a power supply line 4903 and an opposite electrode 4908 are controlled so that no voltage is applied to a light-emitting element 4907. For example, the potential of the opposite electrode 4908 is made high, so that no voltage is applied to the light-emitting element 4907, or the opposite electrode 4908 may be made in a floating state without supplying an electric charge. Consequently, the light-emitting element 4907 can be prevented from emitting light in the signal-writing period.

Figure 15:
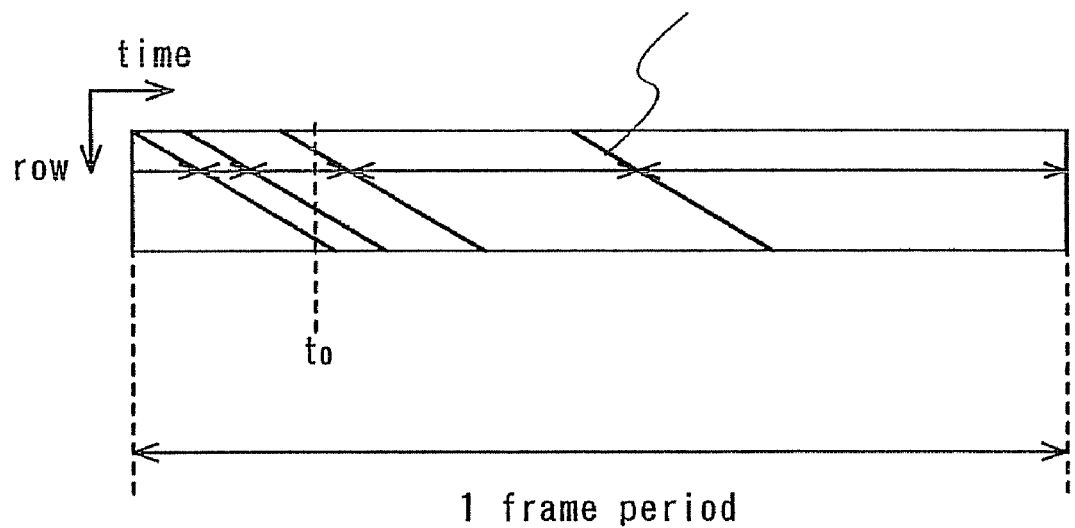
FIG. 15 shows a driving method of a display device of the present invention.

Next, FIG. 15 shows a timing chart in a case where a period for writing a signal (also, referred to as a signal-writing period) to a pixel and a period for light emission (also, referred to as a light-emitting period) are not separated. Immediately after a signal is written in each row, a light-emitting period starts.

In a certain row, after writing of a signal and a predetermined light-emitting period are completed, a signal writing operation starts in a subsequent sub-frame. By repeating such operations, lengths of the light-emitting periods can each be controlled.

In this manner, many sub-frames can be arranged in one frame even if a signal is written slowly. In addition, since the ratio of a light-emitting period during one-frame period (a so-called duty ratio) can be high, it is possible to reduce power consumption, suppress deterioration of the light-emitting element, or suppress a pseudo contouring.

Figure 16:
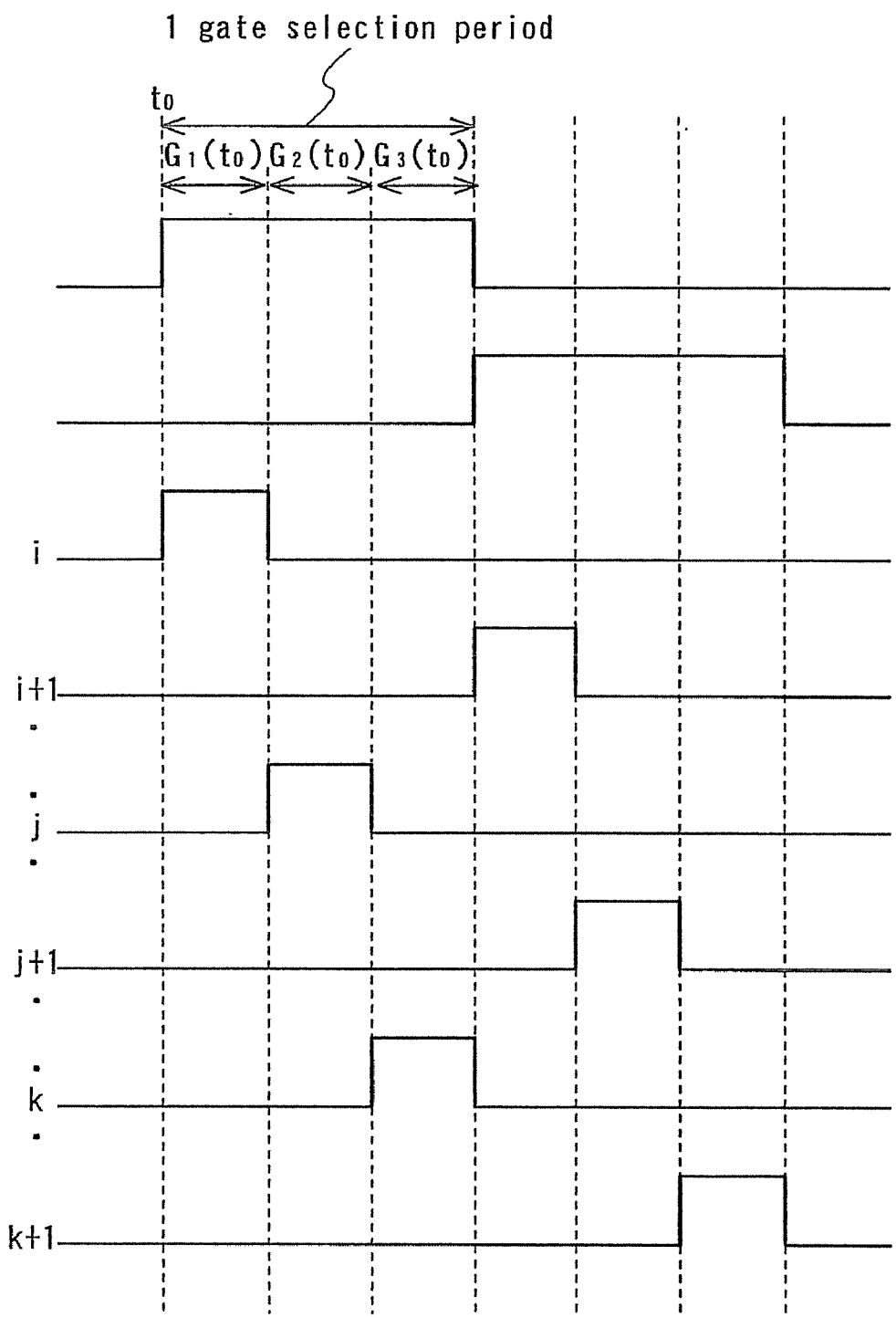
FIG. 16 shows a driving method of a display device of the present invention.

A pixel configuration in this case may have the configurations of FIGS. 6 and 7. In this case, where a time is t0 in FIG. 15, it is necessary to input a signal into pixels of three rows at the same time. Usually, it is impossible to input a signal into pixels of plural rows at the same time. Thus, as shown in FIG. 16, one gate selection period is divided into a plurality of periods (three periods in FIG. 16). Each gate signal line 4901 is selected in each of the divided selection periods and a corresponding signal is input into a source signal line 4902. For example, in one gate selection period, an i-th row is selected in G1(t0), a j-th row is selected in G2(t0), and a k-th row is selected in G3(t0). Accordingly, an operation can be performed as if the three rows are selected at the same time in the one gate selection period.

Note that, although FIGS. 15 and 16 each show the case where a signal is input into pixels of three rows at the same time, the present invention is not limited thereto. A signal may also be input into more rows or fewer rows.

Note that details of such a driving method are disclosed in, for example, Japanese Patent Laid-Open No. 2001-324958, United States Patent Application Publication No. 2001/0022565 or the like, which can be applied in combination with the present invention. And, the entire disclosure of these patents is incorporated herein by reference.

Figure 17:
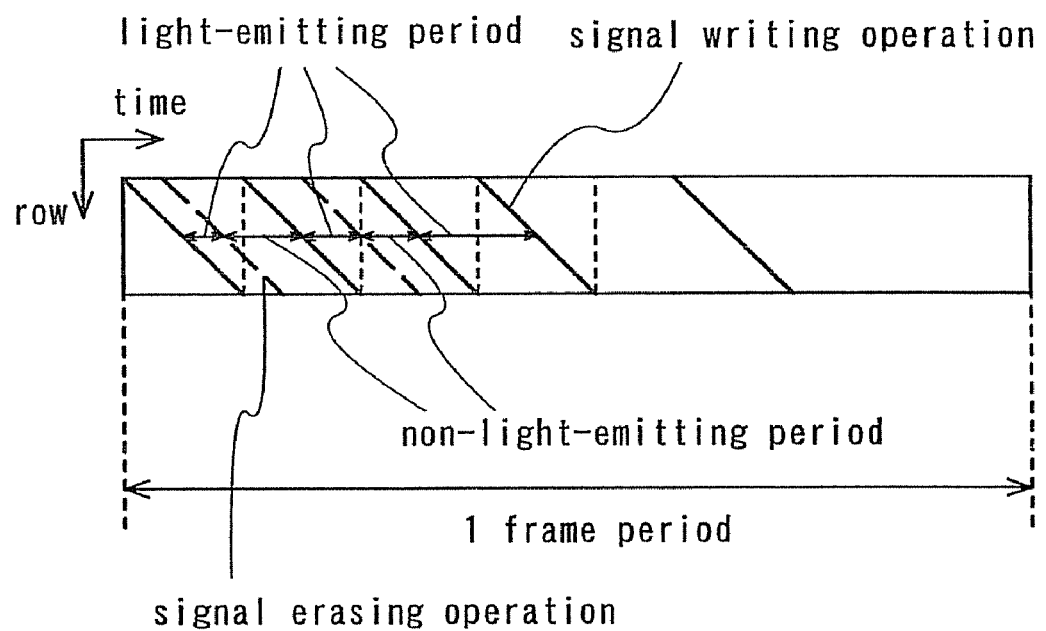
FIG. 17 shows a driving method of a display device of the present invention.

Then, FIG. 17 shows a timing chart in a case where a signal in pixels is erased. In each row, a signal writing operation is performed and a signal in the pixels is erased before a subsequent signal writing operation. According to this, the length of a light-emitting period can be easily controlled.

In a certain row, after writing of a signal and a predetermined light-emitting period are completed, a signal writing operation starts in a subsequent sub-frame. In a case where a light-emitting period is short, a signal erasing operation is performed to provide a non-light-emitting state. By repeating such operations, the lengths of the light-emitting periods can be controlled.

According to this, many sub-frames can be arranged in one frame even if a signal is written slowly. Further, in the case of performing the signal erasing operation, data for erasing is not required to be obtained in a same method as the method of obtaining a video signal; therefore, the driving frequency of a source driver can also be reduced.

Figure 18:
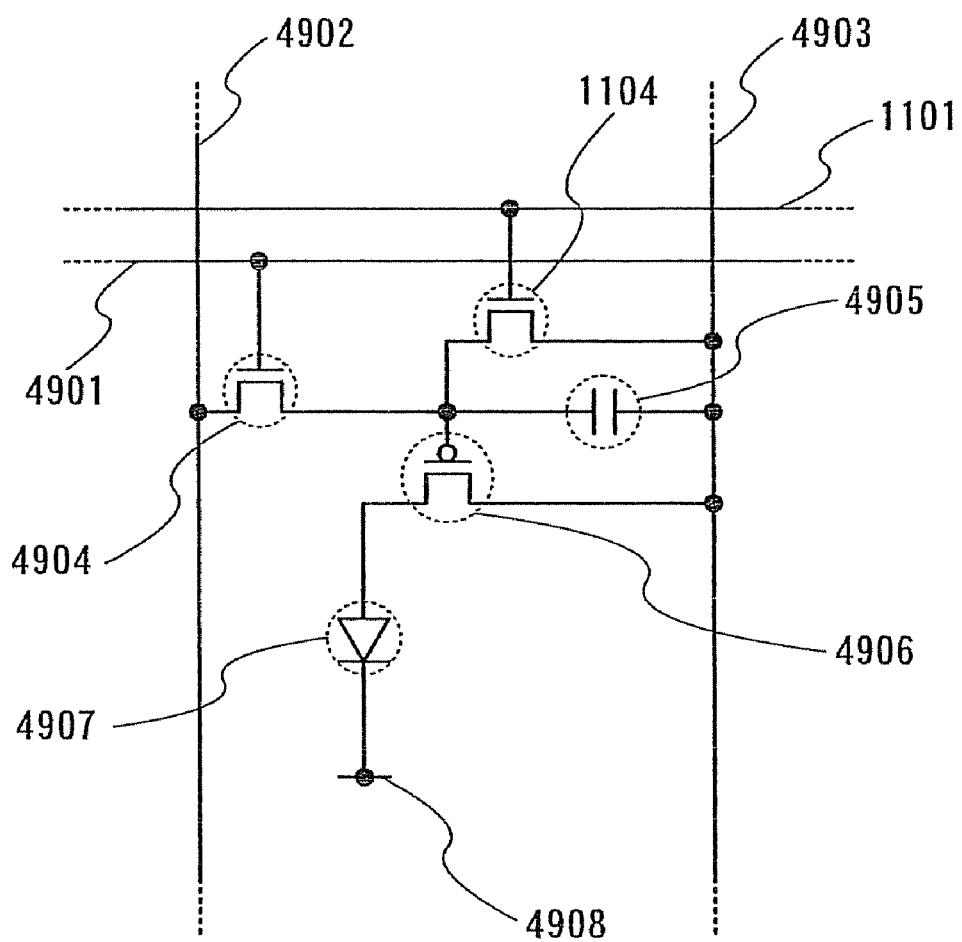
FIG. 18 shows a structure of a display device of the present invention.

FIG. 18 shows a pixel configuration in this case. An erasing transistor 1104 is connected between a gate of a driving transistor 4906 and the power supply line 4903.

A selecting transistor 4904 is controlled using the gate signal line 4901. When the selecting transistor 4904 is turned ON, a video signal is input into a storage capacitor 4905 from the source signal line 4902. Thus, a driving transistor 4906 is turned ON/OFF in accordance with the video signal and current flows to the opposite electrode 4908 through the light-emitting element 4907 from the power supply line 4903.

When a signal is needed to be erased, a second gate line 1101 is selected to turn the erasing transistor 1104 ON, so that the driving transistor 4906 is turned OFF. Then, no current flows from the power supply line 4903 to the opposite electrode 4908 through the light-emitting element 4907. Consequently, a non-light-emitting period can be provided and the length of a light-emitting period can be freely controlled.

Although the erasing transistor 1104 is used in FIG. 18, another method can also be used. This is because a non-light-emitting period may be provided forcibly so that no current is supplied to the light-emitting element 4907. Thus, a non-light-emitting period may be provided by arranging a switch somewhere in a path where a current flows from the power supply line 4903 to the opposite electrode 4908 through the light-emitting element 4907 and controlling ON/OFF of the switch. Alternatively, a gate-source voltage of the driving transistor 4906 may be controlled to forcibly turn the driving transistor OFF.

Figure 19:
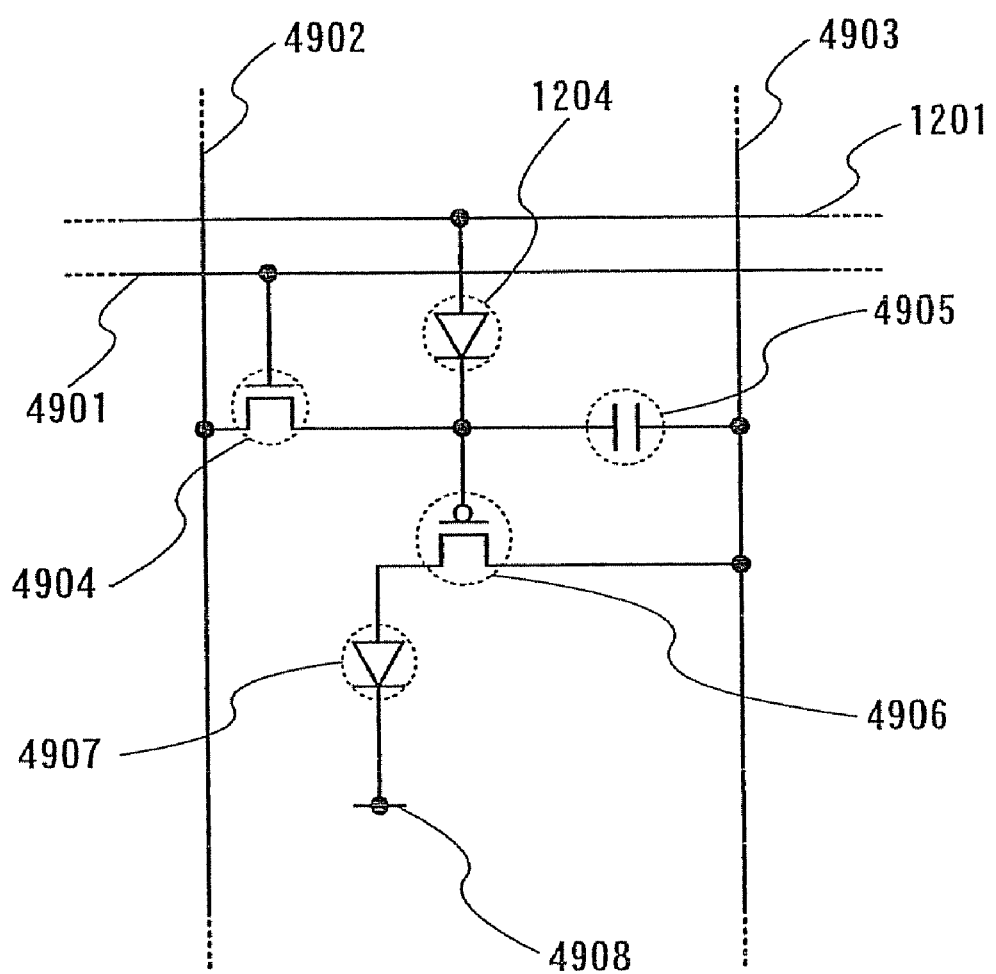
FIG. 19 shows a structure of a display device of the present invention.

FIG. 19 shows an example of a pixel configuration in the case where the driving transistor is forcibly turned off. An erasing diode 1204 is connected between the gate of the driving transistor 4906 and a second gate line 1201.

When a signal is needed to be erased, the second gate line 1201 is selected (a high potential here) to turn the erasing diode 1204 ON, so that a current flows from the second gate line 1201 to the gate of the driving transistor 4906. Consequently, the driving transistor 4906 is turned off. Then, no current flows from the power supply line 4903 to the opposite electrode 4908 through the light-emitting element 4907. Consequently, a non-light-emitting period can be provided and the length of a light-emitting period can be freely controlled.

When a signal is needed to be held, the second gate signal line 1201 is not selected (a low potential here). Then, the erasing diode 1204 is turned OFF and the gate potential of the driving transistor 4906 is thus held.

Note that the erasing diode 1204 may be any element as long as it has a rectifying property. The erasing diode 1204 may be a PN diode, a PIN diode, a Schottky diode, or a zener diode.

Figure 20:
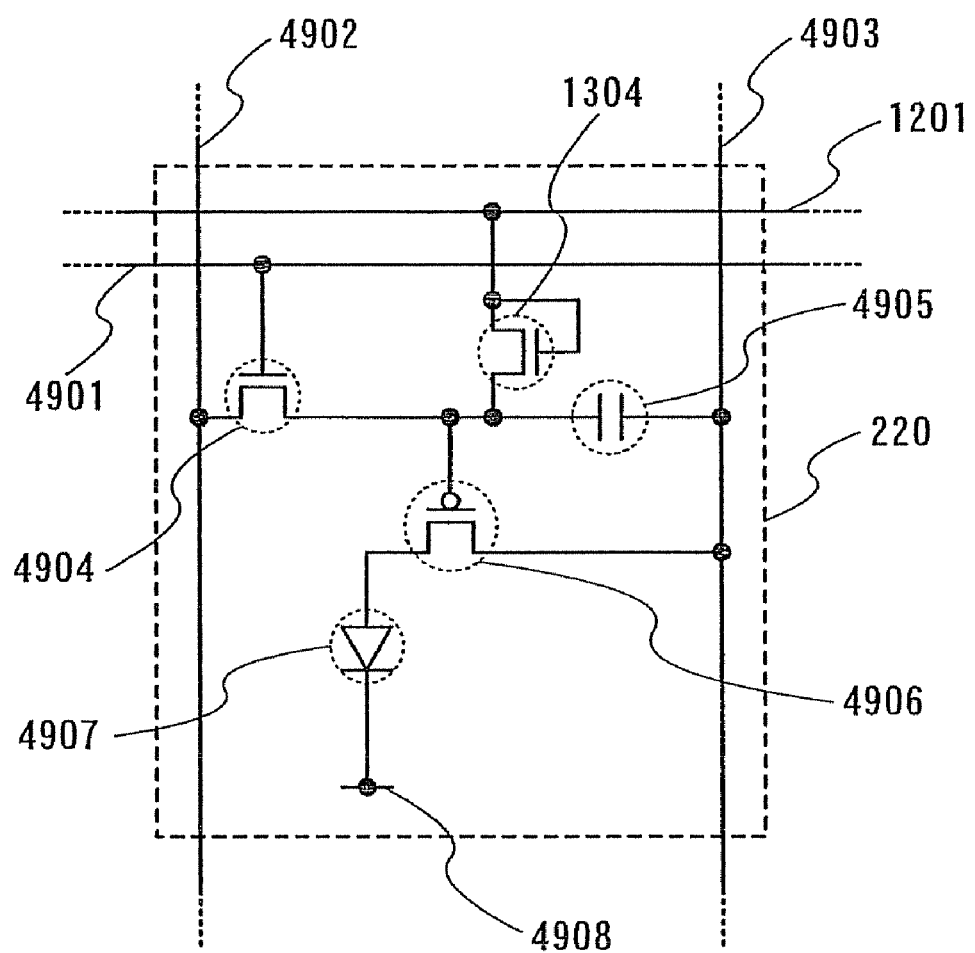
FIG. 20 shows a structure of a display device of the present invention.

In addition, a diode-connected transistor (a gate and a drain thereof are connected) may be used as well. FIG. 20 shows a circuit diagram in this case. As the erasing diode 1204, a diode-connected transistor 1304 is used. Although an N-channel transistor is used here, the present invention is not limited thereto and a P-channel transistor may also be used.

Note that a driving method as shown in FIG. 17 can be achieved using the circuit in FIG. 6 or 7 as still another circuit. A timing chart of this case may be similar to that shown in FIG. 16. As shown in FIG. 16, one gate selection period is divided into three; however, here, one gate selection period is divided into two. A gate line is selected in each of the divided selection periods and a corresponding signal (a video signal and an erasing signal) is input into the source signal line 4902. For example, in one gate selection period, the i-th row is selected in the former half of the period and the j-th row is selected in the latter half of the period. Then, when the i-th row is selected, a video signal is input thereto. On the other hand, when the j-th row is selected, a signal for turning the driving transistor OFF is input. Accordingly, an operation can be performed as if the two rows are selected at the same time in the one gate selection period.

Note that details of such a driving method are disclosed in, for example, Japanese Patent Laid-Open No. 2001-324958, United States Patent Application Publication No. 2001/0022565 or the like, which can be applied in combination with the present invention. And, the entire disclosure of these patents is incorporated herein by reference.

Note that the timing charts, pixel configurations, and driving methods that are shown in this embodiment mode are just examples, and the present invention is not limited to the examples. It is possible to apply various timing charts, pixel configurations, and driving methods.

Then, an operation area of a driving transistor in the case of a digital gray scale method will be described.

For example, in the case where a driving transistor is operated in the saturation region, there is such an advantage that the value of current flowing in a light-emitting element does not change even when the voltage-current characteristics thereof degrade. Therefore, image burn-in is unlikely to occur. However, when the current characteristics of the driving transistor vary, a current flowing therein also varies. In such a case, display unevenness may occur.

On the contrary, when the driving transistor is operated in the linear region, the value of current flowing therein is hardly affected even when the current characteristics of the driving transistor vary. Therefore, display unevenness is unlikely to occur. In addition, since the gate-source voltage of the driving transistor (an absolute value of the voltage) can be prevented from increasing too much, power consumption can be reduced. Further, when the gate-source voltage of the driving transistor (an absolute value of the voltage) is increased, the value of current flowing therein is hardly affected even when the current characteristics of the driving transistor vary. However, when the voltage-current characteristics of the light-emitting element degrade, the value of current flowing therein may change. Therefore, image burn-in becomes more likely to occur.

In this manner, when the driving transistor is operated in the saturation region, the value of current flowing therein does not change even when the characteristics of the light-emitting element change. Therefore, in such a case, the driving transistor can be regarded as operating as a current source. Thus, such a drive is to be called a constant current drive.

In addition, when the driving transistor is operated in the linear region, the value of current flowing therein does not change even when the current characteristics of the driving transistor change. Therefore, in such a case, the driving transistor can be regarded as operating as a switch. In addition, it can be regarded that a voltage of a power supply line is directly applied to the light-emitting element. Thus, such a drive is to be called a constant voltage drive.

This embodiment mode has been described in detail, regarding Embodiment Modes 1 to 3. Thus, this embodiment mode can be freely combined with Embodiment Modes 1 to 3.

Embodiment Mode 5

Figure 21:
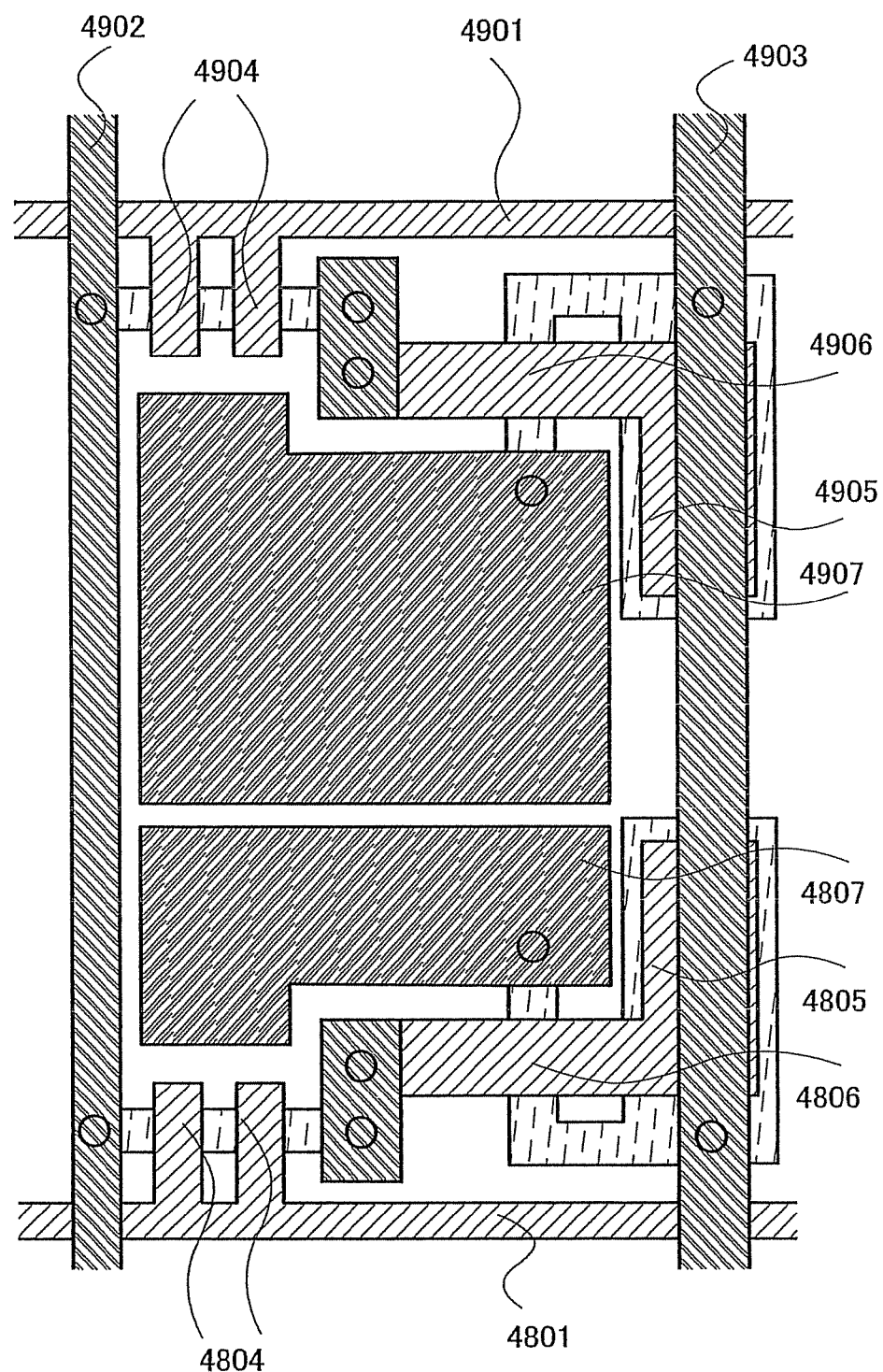
FIG. 21 shows a structure of a display device of the present invention.

Next, a layout of a pixel in the display device of the present invention will be described. FIG. 21 shows a layout view of the circuit diagram shown in FIG. 7, as an example. Note that the circuit diagram and the layout view are not limited to those in FIG. 7 and FIG. 21.

Selecting transistors 4904 and 4804, driving transistors 4906 and 4806 and electrodes of light-emitting elements 4907 and 4807 are disposed. Sources and drains of the selecting transistor 4904 and 4804 are connected to a source signal line 4902 and gates of the driving transistors 4906 and 4806 respectively. A gate of the selecting transistor 4904 is connected to a gate signal line 4901, and a gate of the selecting transistor 4804 is connected to a gate signal line 4801. Sources and drains of the driving transistors 4906 and 4806 are connected to the power supply line 4903 and electrodes of the light-emitting elements 4907 and 4807 respectively. The storage capacitors 4905 and 4805 are each connected between the gate of the driving transistor 4906 or 4806 and the power supply line 4903.

The source signal line 4902 and the power supply line 4903 are formed of a second wire, while the gate signal lines 4901 and 4801 are formed of a first wire.

In the case of a top-gate structure, a substrate, a semiconductor layer, a gate insulating film, a first wire, an interlayer insulating film, and a second wire are formed in this order to form a film. In the case of a bottom-gate structure, a substrate, a first wire, a gate insulating film, a semiconductor layer, an interlayer insulating film, and a second wire are formed in this order to form a film.

Figure 22:
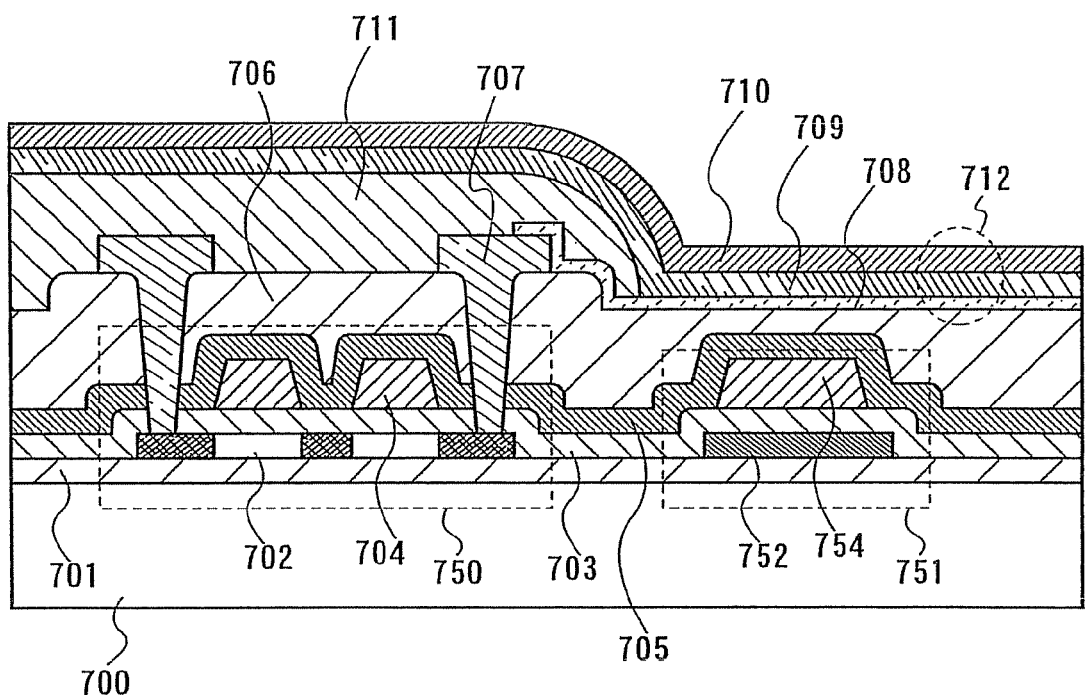
FIG. 22 shows a cross-section of a display device of the present invention.

Next, FIG. 22 shows a cross-sectional view of a pixel including a thin film transistor (TFT) and a light-emitting element connected thereto.

In FIG. 22, a base layer 701, a semiconductor layer 702 for forming a TFT 750, and a semiconductor layer 752 for forming one electrode of a capacitor portion 751 are formed over a substrate 700. A first insulating layer 703 is formed thereover, which functions as a gate insulating layer of the TFT 750 as well as functioning as a dielectric layer for forming a capacitance of the capacitor portion 751.

A gate electrode 704 and a conductive layer 754 for forming the other electrode of the capacitor portion 751 are formed over the first insulating layer 703. A wire 707 connected to the TFT 750 is connected to a first electrode 708 of a light-emitting element 712. The first electrode 708 is formed over a third insulating layer 706. A second insulating layer 705 may be formed between the first insulating layer 703 and the third insulating layer 706. The light-emitting element 712 is formed of the first electrode 708, an EL layer 709, and a second electrode 710. Further, a fourth insulating layer 711 is formed to cover a peripheral end portion of the first electrode 708 and a connecting portion between the first electrode 708 and the wire 707.

Next, the details of the aforementioned structure will be described. The substrate 700 may be, for example, a glass substrate such as barium borosilicate glass or alumino borosilicate glass, a quartz substrate, a ceramic substrate, or the like. Alternatively, it may be a metal substrate containing stainless steel or a semiconductor substrate having a surface covered with an insulating film. In addition, a substrate formed of a flexible synthetic resin such as plastic may be used. The surface of the substrate 700 may be planarized by polishing such as chemical mechanical polishing (CMP).

The base layer 701 may be an insulating film formed of silicon oxide, silicon nitride, silicon nitride oxide, or the like. The base layer 701 can function to prevent diffusion of alkaline metals such as Na or alkaline earth metals which are contained in the substrate 700 into the semiconductor layer 702, which would adversely affect the characteristics of the TFT 750. Although FIG. 22 shows an example where the base layer 701 has a single-layer structure, it may have two or more layers. Note that the base layer 701 is not necessarily required when the diffusion of impurities is not of a big concern such as the case of using a quartz substrate.

In addition, the surface of the glass substrate may be directly treated by high-density plasma with the conditions of microwave excitation, an electron temperature of 2 eV or less, ion energy of 5 eV or less, and an electron density of about $10^{11}$ to $10^{13}$/cm$^3$. Plasma can be generated by using a plasma processing apparatus with microwave excitation with the use of a radial slot antenna. At this time, by introducing a nitrogen gas such as nitrogen ($N_2$), ammonia ($NH_3$), or nitrous oxide (N₂O), the surface of the glass substrate can be nitrided. The nitride layer formed on the surface of the glass substrate has silicon nitride as its main component; therefore, it can be used as a blocking layer against impurities which are diffused from the glass substrate side. A silicon oxide film or a silicon oxynitride film may be formed over the nitride layer by plasma CVD, so as to be used as the base layer 701 as well.

Additionally, when a similar treatment is performed to the surface of the base layer 701 by using silicon oxide, silicon oxynitride, or the like, the surface of the base layer 701 or a part of the base layer 701, which exist in a depth of 1 to 10 nm from the surface, can be nitrided. Such an extremely thin silicon nitride layer can function as a blocking layer without giving an influence of stress to the semiconductor layer formed thereover.

Each of the semiconductor layer 702 and the semiconductor layer 752 is preferably formed with a patterned crystalline semiconductor film. Note that "patterning" means a process of transforming a film into a particular shape by a photolithography technique (e.g., forming a contact hole in photosensitive acrylic or processing photosensitive acrylic into the shape of a spacer), forming a mask pattern by a photolithography technique and etching using the mask pattern, and the like. The crystalline semiconductor film can be obtained by crystallizing an amorphous semiconductor film. As a crystallization method, there are laser crystallization, thermal crystallization using RTA or an annealing furnace, thermal crystallization using metal elements which promote crystallization, and the like. The semiconductor layer 702 has a channel formation region and a pair of impurity regions doped with an impurity element which imparts one conductivity type. Note that an impurity region which is doped with the aforementioned impurity element at a low concentration may be provided between the channel formation region and the pair of the impurity regions. The semiconductor layer 752 can have such a structure that the whole layer is doped with an impurity element which imparts one conductivity type or an impurity element which imparts the opposite conductivity thereto.

The first insulating layer 703 can be formed by stacking silicon oxide, silicon nitride, silicon nitride oxide, or/and the like, as a single layer or a multilayer. In this case, similarly to the aforementioned treatment, the surface of the insulating film may be oxidized or nitrided so as to be densified by a high-density plasma treatment with the conditions of microwave excitation, an electron temperature of 2 eV or less, ion energy of 5 eV or less, and an electron density of about $10^{11}$ to $10^{13}$/cm³. This treatment may precede the film deposition of the first insulating layer 703. That is, a plasma treatment may be performed to the surface of the semiconductor layer 702. At this time, a favorable interface with a gate insulating layer to be stacked thereon can be formed by performing the plasma treatment with the conditions of a substrate temperature of 300 to 450° C. and an oxygen atmosphere (such as $O_2$ or $N_2O$) or a nitrogen atmosphere (such as $N_2$ or $NH_3$).

Each of the gate electrode 704 and the conductive layer 754 may be formed to have a single-layer structure or a stacked-layer structure, with an element selected from Ta, W, Ti, Mo, Al, Cu, Cr, or Nd, or an alloy or compound containing such elements.

The TFT 750 is formed from the semiconductor layer 702, the gate electrode 704, and the first insulating layer 703 between the semiconductor layer 702 and the gate electrode 704. FIG. 22 shows an example where the TFT 750 which constitutes a pixel is connected to the first electrode 708 of the light-emitting element 712. The TFT 750 has a multi-gate structure where a plurality of the gate electrodes 704 are formed over the semiconductor layers 702. That is, a plurality of TFTs are connected in series. With such a structure, off-current can be prevented from increasing more than necessary. Although FIG. 22 shows an example where the TFT 750 is a top-gate TFT, a bottom-gate TFT having a gate electrode below a semiconductor layer, or a dual-gate TFT having gate electrodes above and below a semiconductor layer may be employed as well.

The capacitor portion 751 includes the first insulating layer 703 functioning as a dielectric and a pair of electrodes, namely the semiconductor layer 752 and the conductive layer 754 facing each other by sandwiching the first insulating layer 703. Although FIG. 22 shows an example where the semiconductor layer 752 formed concurrently with the semiconductor layer 702 of the TFT 750 is used as one of a pair of the electrodes of a capacitor element which is provided in a pixel, the conductive layer 754 formed concurrently with the gate electrode 704 is used as the other electrode, the present invention is not limited to such a structure.

The second insulating layer 705 is preferably a barrier insulating film having a blocking property against ionic impurities, such as a silicon nitride film. The second insulating film 705 is formed from silicon nitride or silicon oxynitride. The second insulating layer 705 has a function of a protective film for preventing contamination of the semiconductor layer 702. After depositing the second insulating film 705, it may be hydrogenated by a high-density plasma treatment with microwave excited by introducing a hydrogen gas similarly to the aforementioned treatment. Alternatively, the second insulating film 705 may be nitrided and hydrogenated by introducing an ammonia gas. Further, the second insulating film 705 may be oxynitrided and hydrogenated by introducing an oxygen gas, an $N_2O$ gas, or the like, and a hydrogen gas. By performing a nitriding, oxidizing, or oxynitriding treatment with the aforementioned method, the surface of the second insulating layer 705 can be densified. Accordingly, its function as the protective film can be reinforced. The hydrogen introduced to the second insulating layer 705 made of silicon nitride can be discharged by performing a thermal treatment at 400 to 450° C., thereby hydrogenating the semiconductor layer 702.

The third insulating layer 706 can be formed with an inorganic insulating film or an organic insulating film. The inorganic insulating film includes a silicon oxide film formed by CVD, an SOG (Spin On Glass) film (silicon oxide film formed by coating), and the like. The organic insulating film includes a film made of polyimide, polyamide, BCB (benzocyclobutene), acrylic, a positive photosensitive organic rein, a negative photosensitive organic resin, or the like. In addition, the third insulating layer 706 may be formed with a material having a skeletal structure of silicon (Si) and oxygen (O). As a substituent of the material, an organic group containing at least hydrogen (e.g., an alkyl group or aromatic hydrocarbon) is used. As a substituent, a fluoro group may be used as the substituent. Further, both an organic group containing hydrogen and a fluoro group may be used as a substituent.

The wire 707 may be formed to have a single-layer structure or a stacked-layer structure of an element selected from Al, Ni, C, W, Mo, Ti, Pt, Cu, Ta, Au, or Mn, or an alloy containing such elements.

One or both of the first electrode 708 or the second electrode 710 may be formed as a transparent electrode. As a transparent electrode, there is indium oxide containing tungsten trioxide (IWO), indium oxide containing tungsten oxide (IWZO), indium oxide containing titanium oxide (ITiO), indium tin oxide containing titanium oxide (ITTiO), indium tin oxide containing molybdenum (ITMO), or the like. Needless to say, indium tin oxide (ITO), indium zinc oxide (IZO), indium tin oxide doped with silicon oxide (ITSO), or the like may be used as well.

At least one or both of the first electrode 708 and the second electrode 710 may be formed from a material which does not have a light-transmitting property. For example, it may be formed with alkaline metals such as Li or Cs, alkaline earth metals such as Mg, Ca, or Sr, an alloy containing such metals (e.g., MgAg, AlLi, or MgIn), a compound containing such metals (e.g., $CaF_2$ or $Ca_3N_2$), or rare earth metals such as Yb or Er.

The fourth insulating layer 711 may be formed with a similar material to the third insulating layer 706.

The light-emitting element 712 is formed of the first electrode 708, the second electrode 710, and the EL layer 709 sandwiched therebetween. One or both of the first electrode 708 and the second electrode 710 serves as an anode, while the other thereof serves as a cathode. The light-emitting element 712 emits light with a current flowing through the anode to the cathode when a voltage higher than a threshold voltage is forwardly applied between the anode and the cathode.

The EL layer 709 is formed as a single layer or a multilayer. When the EL layer 709 is formed with a plurality of layers, these layers can be classified into a hole injecting layer, a hole transporting layer, a light-emitting layer, an electron transporting layer, an electron injecting layer, and the like in view of the carrier transporting property. Note that the boundary between each layer is not necessarily clear, and there may be a case where the boundary is unclear since a material for forming each layer is mixed with each other. Each layer may be formed using an organic material or an inorganic material. As the organic material, any of a high molecular compound, a middle molecular compound, and a low molecular compound may be used.

The EL layer 709 is preferably formed with a plurality of layers having different functions such as a hole injecting-transporting layer, a light-emitting layer, and an electron injecting-transporting layer. The hole injecting-transporting layer is preferably formed with a composite material containing an organic compound material with a hole transporting property and an inorganic compound material which exhibits an electron accepting property to the organic compound material. By employing such a structure, many hole carriers are generated in the organic compound which inherently has few carriers, thereby excellent hole injecting and transporting properties can be obtained. According to such an effect, driving voltage can be suppressed than that in a conventional one. Further, since the hole injecting-transporting layer can be formed to be thick without causing an increase of the driving voltage, short circuit of the light-emitting element resulting from dusts or the like can be suppressed.

As an organic compound material with a hole transporting property, there is, for example, copper phthalocyanine (abbreviated as CuPc); 4,4',4''-tris[N-(3-methylphenyl)-N-phenylamino]triphenylamine (abbreviated as MTDATA); 1,3,5-tris[N,N-di(m-tolyl)amino]benzene (abbreviated as m-MTDAB); N,N'-diphenyl-N,N'-bis(3-methylphenyl)-1,1'-biphenyl-4,4'-diamine (abbreviated as TPD); 4,4'-bis[N-(1-naphthyl)-N-phenylamino]biphenyl (abbreviated as NPB); 4,4'-bis-{N-[4-di(m-tolyl)amino]phenyl-N-phenylamino}biphenyl (abbreviated as DNTPD); or the like. However, the present invention is not limited to these.

As an inorganic compound material which exhibits an electron accepting property, there is titanium oxide, zirconium oxide, vanadium oxide, molybdenum oxide, tungsten oxide, rhenium oxide, ruthenium oxide, zinc oxide, or the like. In particular, vanadium oxide, molybdenum oxide, tungsten oxide, and rhenium oxide are preferable since they can be deposited in vacuum, and are easy to be handled.

The electron injecting-transporting layer is formed using an organic compound material with an electron transporting property. Specifically, there is tris(8-quinolinolato)aluminum (abbreviated as $Alq_3$); tris(4-methyl-8-quinolinolato)aluminum (abbreviated as $Almq_3$); bis(2-methyl-8-quinolinolato)(4-phenylphenolato)aluminum (abbreviated as BAlq); bathocuproin (abbreviated as BCP); 2-(4-biphenylyl)-5-(4-tert-buthylphenyl)-1,3,4-oxadiazole (abbreviated as PBD); 3-(4-biphenylyl)-4-phenyl-5-(4-tert-butylphenyl)-1,2,4-triazole (abbreviated as TAZ); or the like. However, the present invention is not limited to these.

The EL layer 709 can be formed with, for example, 9,10-di(2-naphthyl)anthracene (abbreviated as DNA); 9,10-di(2-naphthyl)-2-tert-butylanthracene (abbreviated as t-BuDNA); 4,4'-bis(2,2-diphenylvinyl)biphenyl (abbreviated as DPVBi); coumarin 30; coumarin 6; coumarin 545; coumarin 545T; rubrene; 2,5,8,11-tetra(tert-butyl)perylene (abbreviated as TBP); 9,10-diphenylanthracene (abbreviated as DPA); 5,12-diphenyltetracene (abbreviated as DPT); 4-(dicyanomethylene)-2-methyl-6-(p-dimethylaminostyryl)-4H-pyran (abbreviated as DCM1); 4-(dicyanomethylene)-2-methyl-6-[2-(julolidine-9-yl)ethenyl]-4H-pyran (abbreviated as DCM2); or the like. Alternatively, the following compounds capable of generating phosphorescence can be used: bis{2[3',5'-bis(trifluoromethyl)phenyl]pyridinato-$N,C^{2'}$}iridium(picolinate) (abbreviated as Ir($CF_3$ppy)$_2$(pic)); tris(2-phenylpyridinato-$N,C^{2'}$)iridium (abbreviated as Ir(ppy)$_3$); bis(2-phenylpyridinato-$N,C^{2'}$)iridium(acetylacetonate) (abbreviated as Ir(ppy)$_2$(acac)); bis[2-(2'-thienyl)pyridinato-$N,C^{3'}$]iridium (acetylacetonate) (abbreviated as Ir(thp)$_2$(acac)); bis(2-phenylquinolinato-$N,C^{2'}$)iridium(acetylacetonate) (abbreviated as Ir(pq)$_2$(acac)); or the like.

Further, the EL layer 709 may be formed using a singlet excitation light-emitting material as well as a triplet excitation light-emitting material including a metal complex. For example, among light-emitting pixels for red emission, green emission, and blue emission, the light-emitting pixel for red emission which has a relatively short luminance half decay period is formed using a triplet excitation light-emitting material while the other light-emitting pixels are formed using singlet excitation light-emitting materials. The triplet excitation light-emitting material has high luminous efficiency, which is advantageous in that lower power consumption is required for obtaining the same luminance. That is, when the triplet excitation light-emitting material is applied to the pixel for red emission, the amount of current supplied to the light-emitting element can be reduced, resulting in the improved reliability. In order to suppress the power consumption, the light-emitting pixels for red emission and green emission may be formed using triplet excitation light-emitting materials, while the light-emitting element for blue emission may be formed using a singlet excitation light-emitting material. When forming the light-emitting element for green emission which is highly visible to human eyes using the triplet excitation light-emitting material, further lower power consumption can be achieved.

As a structure of the EL layer 709, a light-emitting layer having a different emission spectrum may be formed in each pixel to perform color display. Typically, light-emitting layers corresponding to the respective colors of R (red), G (green), and B (blue) are formed. Also in this case, color purity can be improved as well as a mirror-like surface (glare) of the pixel portion can be prevented by adopting a structure where a filter for transmitting light with the aforementioned emission spectrum is provided on the emission side of the pixel. By providing the filter, a circularly polarizing plate and the like which have conventionally been required can be omitted, and thus, light emitted from the light-emitting layer can be extracted without loss of the light. Further, changes in color tone, which are recognized when the pixel portion (display screen) is seen obliquely, can be reduced.

As the transistor, a transistor using amorphous silicon may be used, as well as a transistor using polysilicon as a semiconductor layer.

Next, a case of using an amorphous silicon (a-Si:H) film for a semiconductor layer of a transistor will be described. FIGS. 23A and 23B show examples of a top-gate transistor, while FIGS. 24A and 24B and FIGS. 25A and 25B show examples of a bottom-gate transistor.

FIG. 23A shows a cross section of a top-gate transistor which uses amorphous silicon as its semiconductor layer. As shown in FIG. 23A, a base film 2802 is formed over a substrate 2801. Further, a pixel electrode 2803 is formed over the base film 2802. In addition, a first electrode 2804 is formed with the same material and in the same layer as the pixel electrode 2803.

The substrate may be any of a glass substrate, a quartz substrate, a ceramic substrate, and the like. In addition, the base film 2802 may be formed with aluminum nitride (AlN), silicon oxide ($SiO_2$), and/or oxynitride silicon ($SiO_xN_y$), as a single layer or a multilayer thereof.

In addition, a wire 2805 and a wire 2806 are formed over the base film 2802, and an end portion of the pixel electrode 2803 is covered with the wire 2805. Over the wire 2805 and the wire 2806, an n-type semiconductor layer 2807 and an n-type semiconductor layer 2808 each having n-type conductivity are formed. A semiconductor layer 2809 is formed between the wire 2806 and the wire 2805, and over the base film 2802. A part of the semiconductor layer 2809 is extended over the n-type semiconductor layer 2807 and the n-type semiconductor layer 2808. Note that the semiconductor layer 2809 is formed with a non-crystalline semiconductor film such as amorphous silicon (a-Si:H) or a microcrystalline semiconductor (μ-Si:H). A gate insulating film 2810 is formed over the semiconductor layer 2809. In addition, an insulating film 2811 is formed with the same material and in the same layer as the gate insulating film 2810, over the first electrode 2804. Note that the gate insulating film 2810 is formed of a silicon oxide film, a silicon nitride film, or the like.

A gate electrode 2812 is formed over the gate insulating film 2810. In addition, a second electrode 2813 is formed with the same material and in the same layer as the gate electrode 2812, over the first electrode 2804 with the insulating film 2811 therebetween. Thus, a capacitor element 2819 in which where the insulating film 2811 is sandwiched between the first electrode 2804 and the second electrode 2813, is formed. An interlayer insulating film 2814 is formed to cover an end portion of the pixel electrode 2803, a driving transistor 2818, and the capacitor element 2819.

A layer 2815 containing an organic compound and an opposite electrode 2816 are formed over the interlayer insulating film 2814 and the pixel electrode 2803 positioned in an opening portion of the interlayer insulating film 2814. Thus, a light-emitting element 2817 is formed in a region where the layer 2815 containing an organic compound is sandwiched between the pixel electrode 2803 and the opposite electrode 2816.

The first electrode 2804 shown in FIG. 23A may be replaced by a first electrode 2820 as shown in FIG. 23B. The first electrode 2820 is formed with the same material and in the same layer as the wires 2805 and 2806.

FIGS. 24A and 24B show partial cross sections of a panel of a display device which has a bottom-gate transistor using amorphous silicon as its semiconductor layer.

A base film 2902 is formed over a substrate 2901. Further, a gate electrode 2903 is formed over the base film 2902. In addition, a first electrode 2904 is formed in the same layer and with the same material as the gate electrode 2903. As a material of the gate electrode 2903, polysilicon doped with phosphorus can be used. Not only polycrystalline silicon, but also a silicide which is a compound of a metal and silicon may be used as well.

In addition, a gate insulating film 2905 is formed to cover the gate electrode 2903 and the first electrode 2904. The gate insulating film 2905 is formed using a silicon oxide film, a silicon nitride film, or the like.

A semiconductor layer 2906 is formed over the gate insulating film 2905. In addition, a semiconductor layer 2907 is formed with the same material and in the same layer as the semiconductor layer 2906.

The substrate may be any of a glass substrate, a quartz substrate, a ceramic substrate, and the like. In addition, the base film 2902 may be formed with aluminum nitride (AlN), silicon oxide ($SiO_2$), and/or oxynitride silicon ($SiO_xN_y$), as a single layer or a multilayer thereof.

N-type semiconductor layers 2908 and 2909 each having n-type conductivity are formed over the semiconductor layer 2906, while an n-type semiconductor layer 2910 is formed over the semiconductor layer 2907.

Wires 2911 and 2912 are formed respectively over the n-type semiconductor layers 2908 and 2909, and a conductive layer 2913 is formed with the same material and in the same layer as the wires 2911 and 2912, over the n-type semiconductor layer 2910.

A second electrode is formed of the semiconductor layer 2907, the n-type semiconductor layer 2910, and the conductive layer 2913. Note that a capacitor element 2920 is formed to have a structure in which the gate insulating film 2905 is sandwiched between the second electrode and the first electrode 2904.

In addition, a part of the wire 2911 is extended, and a pixel electrode 2914 is formed in contact with the top surface of the extended portion of the wire 2911.

An insulator 2915 is formed to cover an end portion of the pixel electrode 2914, a driving transistor 2919, and the capacitor element 2920.

A layer 2916 containing an organic compound and an opposite electrode 2917 are formed over the pixel electrode 2914 and the insulator 2915, and a light-emitting element 2918 is formed in a region where the layer 2916 containing an organic compound is sandwiched between the pixel electrode 2914 and the opposite electrode 2917.

The semiconductor layer 2907 and the n-type semiconductor 2910 which partially function as a second electrode of the capacitor element are not necessarily provided. That is, the conductive layer 2913 may be used as the second electrode so as to provide a capacitor element having such a structure that the gate insulating film 2905 is sandwiched between the first electrode 2904 and the conductive layer 2913.

Note that by forming the pixel electrode 2914 before forming the wire 2911 shown in FIG. 24A, the capacitor element 2920 as shown in FIG. 24B can be formed, which has a structure where the gate insulating film 2905 is sandwiched between the second electrode 2921 formed of the same material as the pixel electrode 2914 and the first electrode 2904.

Although FIGS. 24A and 24B show examples of an inversely staggered transistor with a channel-etch structure, a transistor with a channel-protective structure may be employed as well. Next, a case of a transistor with a channel-protective structure will be described with reference to FIGS. 25A and 25B.

A transistor with a channel-protective structure shown in FIG. 25A is different from the driving transistor 2919 with a channel-etched structure shown in FIG. 24A in that an insulator 3001 serving as an etching mask is provided over a channel formation region in the semiconductor layer 2906. Common portions between FIGS. 25A and 24A are denoted by common reference numerals.

Similarly, a transistor with a channel-protective structure shown in FIG. 25B is different from the driving transistor 2919 with a channel-etch structure shown in FIG. 24B in that an insulator 3001 serving as an etching mask is provided over a channel formation region in the semiconductor layer 2906. Common portions between FIGS. 25B and 24B are denoted by common reference numerals.

By using an amorphous semiconductor film for a semiconductor layer (e.g., a channel formation region, a source region, or a drain region) of a transistor which constitutes a pixel of the present invention, manufacturing cost can be reduced. For example, an amorphous semiconductor film can be used in the case of using the pixel structure shown in FIG. 6 or 7.

Note that the structures of transistors or capacitor elements to which the pixel structure of the present invention can be applied are not limited to the structures described above, and various structures of transistors or capacitor elements can be employed.

Note also that this embodiment mode can be freely combined with Embodiment Modes 1 to 4.

Embodiment Mode 6

Configurations of a pixel and a driver circuit of a display device of the present invention are described with reference to FIGS. 45 to 47.

Figure 45:
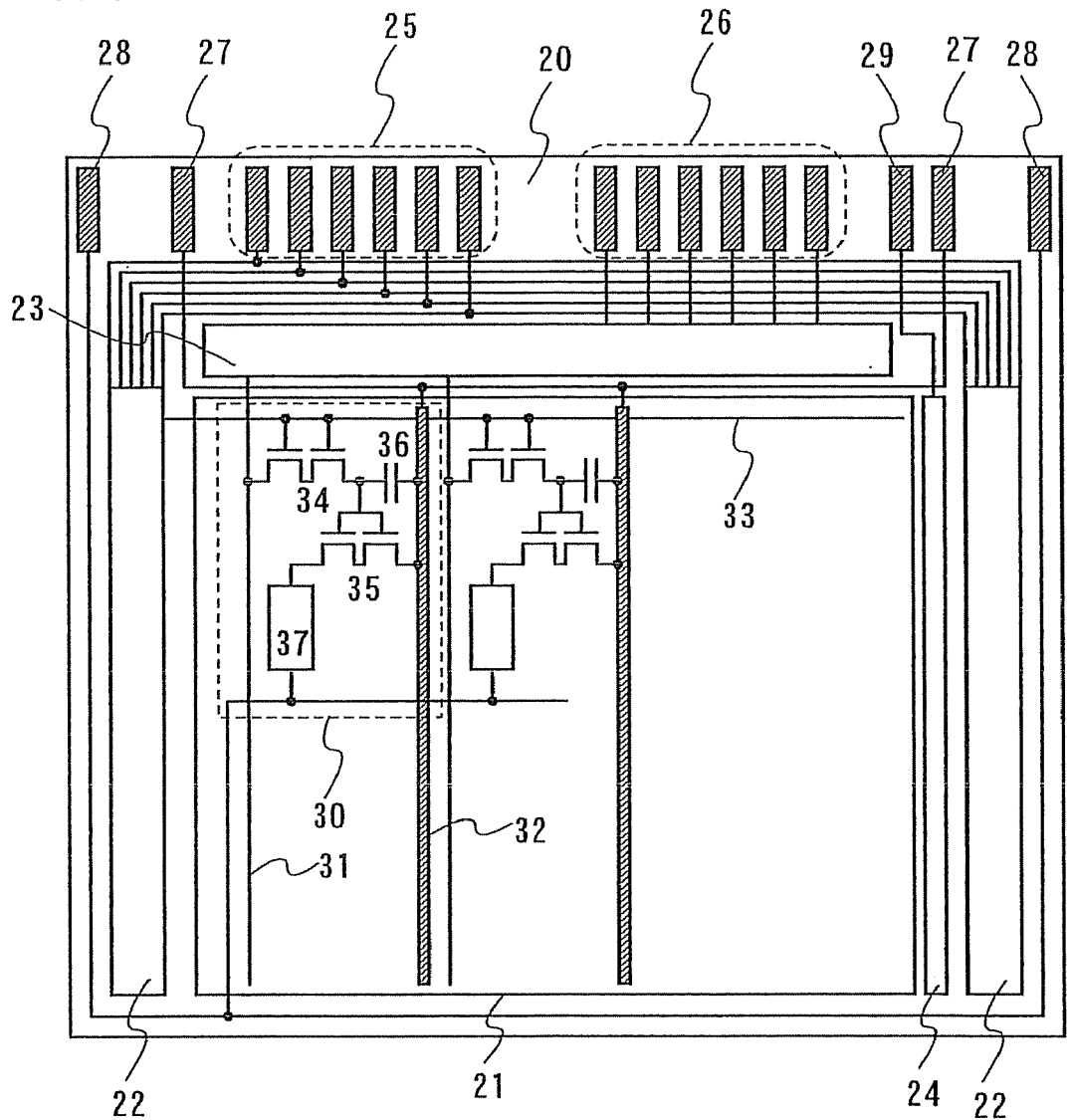
FIG. 45 shows a structure of a display panel of the present invention.

FIG. 45 shows a configuration of a display panel of the present invention. This display panel includes a pixel portion 21 in which a plurality of display regions 30 constituting a subpixel are arranged, a scan line driver circuit 22 which controls a signal of a scan line 33, and a data line driver circuit 23 which controls a signal of a data line 31 over a substrate 20. Moreover, a monitor circuit 24 for correcting a luminance change of a light-emitting element 37 included in the display region 30 constituting a subpixel may be provided as well. A light-emitting element 37 and a light-emitting element included in the monitor circuit 24 have the same structures. The light-emitting element 37 has a structure in which a layer containing a material which exhibits electroluminescence is sandwiched between a pair of electrodes.

An input terminal 25 for inputting signals from an external circuit to the scan line driver circuit 22, an input terminal 26 for inputting signals from an external circuit to the data line driver circuit 23, and an input terminal 29 for inputting signal to the monitor circuit 24 are provided in the periphery portion of the substrate 20.

The display region 30 constituting a subpixel includes a transistor 34 connected to the data line 31 and a transistor 35 which is connected in series between the power supply line 32 and the light-emitting element 37. A gate of the transistor 34 is connected to the scan line 33. When the transistor 34 is selected by a scan signal, it inputs a signal of the data line 31 to the display region 30 constituting a subpixel. The input signal is applied to a gate of the transistor 35 and charges a storage capacitor portion 36. In accordance with this signal, the power supply line 32 and the light-emitting element 37 become conductive, thereby the light-emitting element 37 emits light.

A power is required to be supplied from an external circuit so that the light-emitting element 37 provided in the display region 30 constituting a subpixel emits light. The power supply line 32 provided in the pixel portion 21 is connected to the external circuit at an input terminal 27. As resistance loss occurs in the power supply line 32 depending on the length of a wire to be led, it is preferable to provide input terminals 27 at a plurality of positions in the peripheral portion of the substrate 20. The input terminals 27 are provided at opposite end portions of the substrate 20 so that luminance variations in the area of the pixel portion 21 don't become notable. That is, it is prevented that one side of the screen becomes bright while the other side thereof becomes dark. Further, in the light-emitting element 37 having a pair of electrodes, an electrode on the opposite side to the electrode connected to the power supply line 32 is formed as a common electrode shared by the plurality of display regions 30 constituting subpixels. In order to reduce the resistance loss of this electrode, a plurality of terminals 28 are provided.

Figure 46:
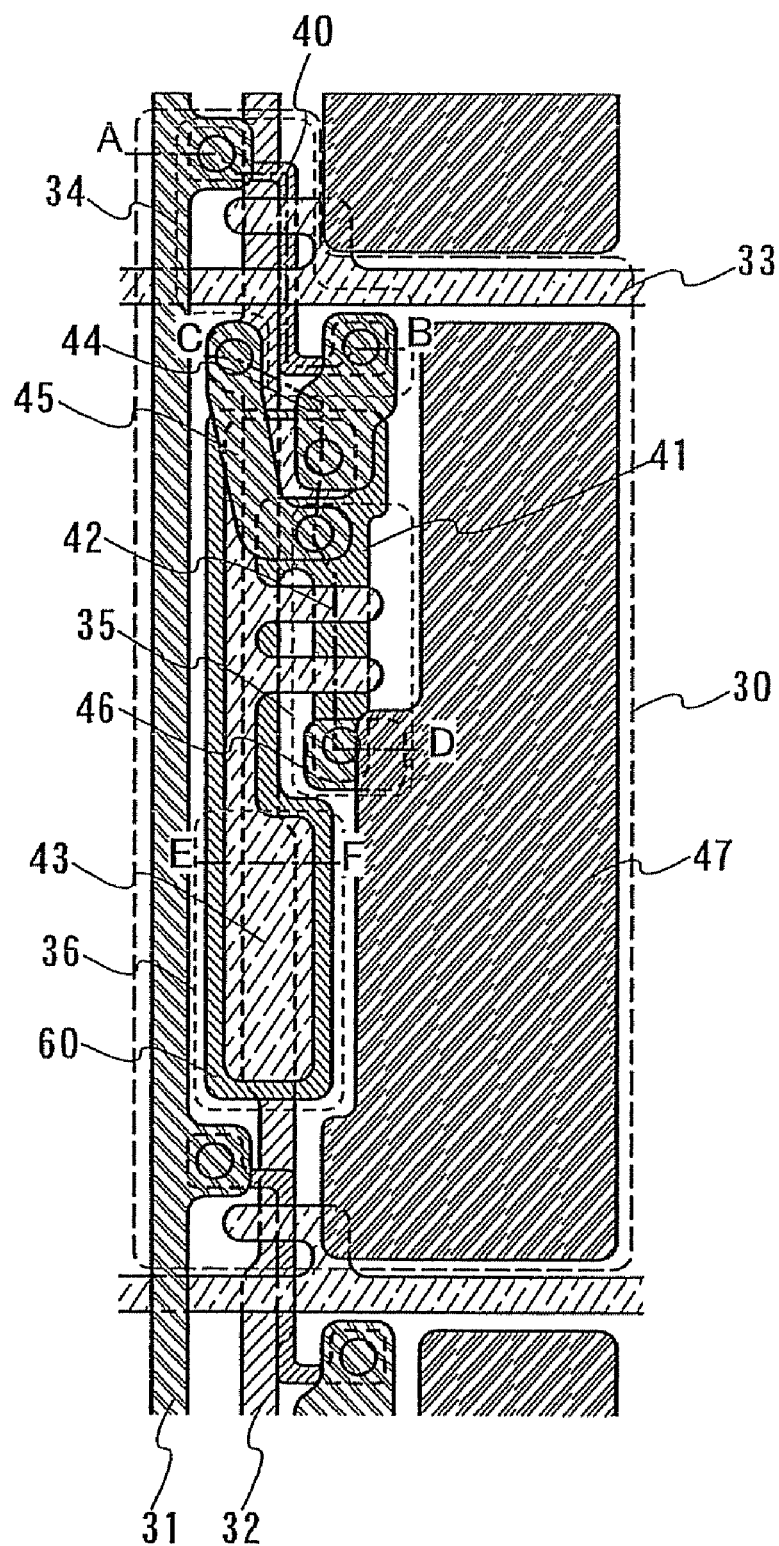
FIG. 46 shows a subpixel configuration of a display panel of the present invention.
Figure 47:
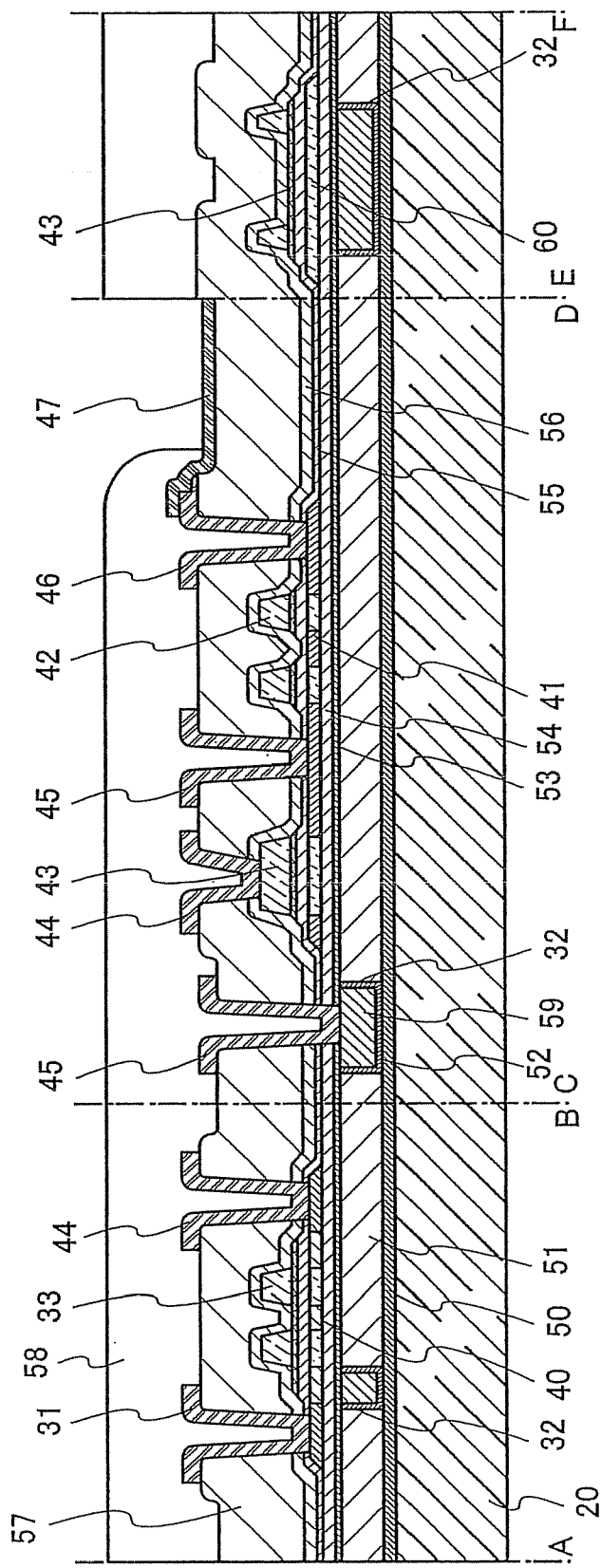
FIG. 47 shows a subpixel configuration of a display panel of the present invention.

Next, an example of the display region 30 constituting a subpixel is described in details with reference to FIGS. 46 and 47. It is to be noted that FIG. 46 shows a top plan view of the display region 30 constituting a subpixel and FIG. 47 shows a longitudinal sectional view taken along lines A-B, C-D, and E-F in FIG. 46. Description to be made below is made with reference to both FIG. 46 and FIG. 47.

The scan line 33 and the data line 31 are formed in different layers and cross each other with an insulating layer 57 interposed therebetween. The scan line 33 functions as a gate electrode of a transistor at a portion where it crosses a semiconductor layer 40 with a gate insulating layer 55 interposed therebetween. In this case, by providing the transistor 34 in accordance with the arrangement of the semiconductor layer 40 and making the scan line 33 diverge to cross the semiconductor layer 40 at plural portions, a so-called multi-gate transistor in which a plurality of channel formation regions are arranged in series between a pair of source and a drain can be provided.

It is preferable that the resistance of the power supply line 32 connected to the transistor 35 be low, therefore, it is preferable to use Al, Cu, or the like having particularly low resistance. In the case of forming a Cu wire, the Cu wire can be formed in an insulating layer in combination with a barrier layer. FIG. 47 shows an example where the power supply line 32 is formed over the substrate 20 and under the semiconductor layer 41. A barrier layer 50 is formed Over the surface of the substrate 20, thereby preventing impurities such as alkali metal contained in the substrate 20 from seeping. The power supply line 32 is formed of a barrier layer 52 and a Cu layer 59 in an opening formed in the insulating layer 51. The barrier layer 52 is formed from tantalum (Ta), tantalum nitride (TaN), tungsten nitride (WN), titanium nitride (TiN), or the like. The Cu layer 59 is formed by forming a seed layer by sputtering and accumulated in a thickness of 1 to 5 μm by plating, and planarized by chemical mechanical polishing. That is, by using damascene process, the Cu wire can be embedded in the insulating layer 51.

A base insulating layer for semiconductor layers 40 and 41 is formed over the insulating layer 51. The structure of the base insulating layer is not limited; however, it is preferably formed from a silicon nitride layer 53 and a silicon oxide layer 54. Besides, as a structure of the insulating layer, an insulating layer 56 is formed of silicon nitride or the like as a protective film over the semiconductor layers 40 and 41 in addition to the gate insulating layer 55.

The power supply line 32 and the transistor 35 are connected by a wire 45 through a contact hole which passes through the aforementioned insulating layer. Moreover, a gate electrode 42 is connected to the transistor 34 by a wire 44. The gate electrodes of the transistors 34 and 35 may be formed by stacking a plurality of layers. For example, a first conductive layer and a second conductive layer may be combined in consideration of adhesion with a gate insulating layer and resistance. In addition, the shapes of the overlaying and underlying layers may be changed (for example, a hat-like shape having a visor) so that source and drain regions and a low concentration impurity (LDD) region may be formed in a semiconductor layer in a self-aligned manner.

An electrode 43 of a storage capacitor portion 36 provided by extending the gate electrode 42 is preferably formed to have low resistance by utilizing the combination of the first conductive layer and the second conductive layer, i.e., by providing a thin film portion of the first conductive layer and adding an impurity element imparting one conductivity type to the semiconductor layer as a lower layer. That is, the storage capacitor portion 36 is formed from the electrode 43 of the storage capacitor portion 36 provided by extending the gate electrode 42, a semiconductor layer 60 which is obtained by extending the semiconductor layer 41 of the transistor 35, and a gate insulating layer 55 sandwiched by them. The storage capacitor 36 can function efficiently by adding an impurity element imparting one conductivity type to the semiconductor layer 60 so as to have low resistance.

A pixel electrode of a light-emitting element may have a direct contact with the semiconductor layer 41 of the transistor 35, however, they can be connected through a wire 46 as shown in FIG. 47. In this case, it is preferable to provide a plurality of steps at an end portion of the wire 46 since a contact area with the pixel electrode 47 can be increased. Such steps can be formed by using a photomask using a light reducing function such as a slit or a semi-transmissive film.

A display panel described in this embodiment mode has a power supply line formed of a low resistant material such as Cu, therefore, it is efficient when a screen size is large in particular. For example, when a screen size is about 13-inch, a diagonal length of the screen is 340 mm while it is 1500 mm or longer in a screen of about 60-inch. In such a case, wire resistance cannot be ignored, therefore, a wire is preferably formed of a low resistant material such as Cu. Moreover, a data line and a scan line may be similarly formed when wire delay is considered.

It is to be noted that this embodiment mode can be freely combined with Embodiment Modes 1 to 5.

Embodiment Mode 7

In Embodiment Mode 7, an evaporation apparatus used for manufacturing a display panel is described with reference to the drawings.

The display panel is manufactured by forming an EL layer over an element substrate in which a pixel circuit and/or a driver circuit is/are formed using transistors. The EL layer is formed so as to contain a material which exhibits electroluminescence at least in a portion thereof. The EL layer may be formed of a plurality of layers with different functions. In that case, the EL layer is, in some cases, formed by using layers with different functions, which are also called a hole injecting-transporting layer, a light-emitting layer, an electron injecting-transporting layer, and the like.

Figure 48:
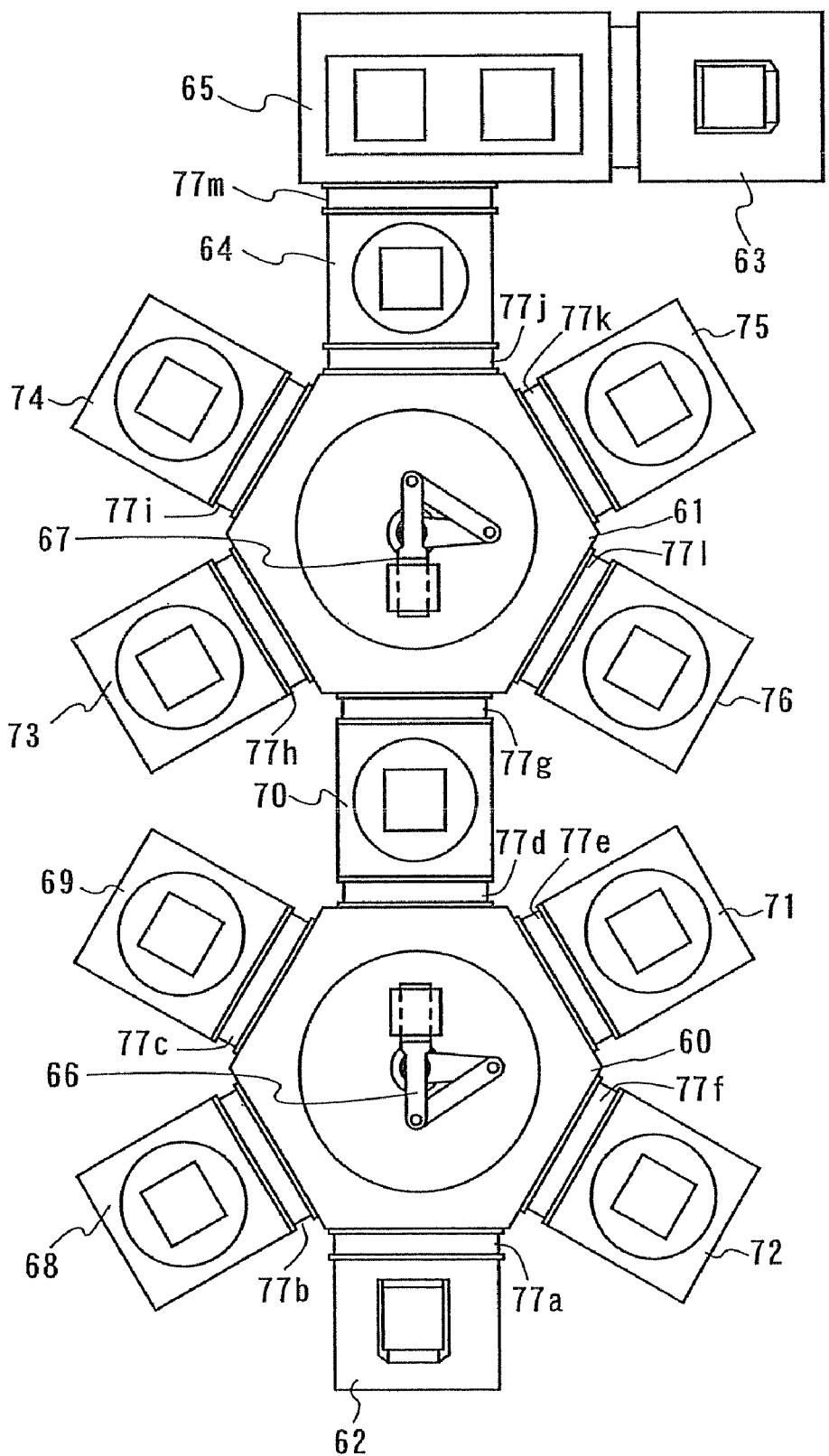
FIG. 48 shows a structure of an evaporation apparatus for forming an EL layer.

FIG. 48 shows a structure of an evaporation apparatus for forming an EL layer over the element substrate in which transistors are formed. This evaporation apparatus has a plurality of treatment chambers connected to transfer chambers 60 and 61. The treatment chambers include a load chamber 62 for providing a substrate, an unload chamber 63 for collecting a substrate, a thermal treatment chamber 68, a plasma treatment chamber 72, film forming treatment chambers 69 to 71 and 73 to 75 for evaporating an EL material, and a film forming treatment chamber 76 for forming aluminum or a conductive film containing aluminum as a main component as one electrode of an EL element. Further, gate valves 77a to 77m are provided between the transfer chamber and each treatment chamber. The pressure of each treatment camber can be independently controlled, thereby preventing mutual contamination between the treatment chambers.

A substrate introduced from the load chamber 62 to the transfer chamber 60 is transferred to a predetermined treatment chamber by an arm type transfer means 66 capable of rotating. The substrate is transferred by the transfer means 66 from a certain treatment chamber to another treatment chamber. The transfer chambers 60 and 61 are connected by a film forming treatment chamber 70, where delivery of the substrate between the transfer unit 66 and a transfer means 67 is conducted.

Each treatment chamber connected to the transfer chambers 60 and 61 is kept under a reduced pressure. Therefore, in this evaporation apparatus, film forming treatment of an EL element is conducted continuously without exposing the substrate to air. A display panel having an EL layer to which film forming treatment has been applied may deteriorate by moisture or the like. Therefore, a sealing treatment chamber 65 is connected to the transfer chamber 61 for performing a sealing treatment to keep the quality before contacting to the air. The sealing chamber 65 is kept at an atmospheric pressure or under a reduced pressure close to the atmospheric pressure, therefore, an intermediate treatment chamber 64 is provided between the transfer chamber 61 and the sealing treatment chamber 65. The intermediate treatment chamber 64 is provided for deliver of the substrate and buffering the pressure between the chambers.

The load chamber 62, the unload chamber 63, the transfer chambers, and the film forming treatment chambers are provided with exhausting means for keeping the reduced pressure. As such exhausting means, various vacuum pumps such as a dry pump, a turbo molecular pump, and a diffusion pump can be used.

In the evaporation apparatus shown in FIG. 48, the number and constitution of the treatment chambers connected to the transfer cambers 60 and 61 may be combined in accordance with a stacked-layer structure of an EL element. An example of the combination is described below.

The thermal treatment chamber 68 performs a degasification treatment by heating a substrate over which a lower electrode, an insulating partition, or the like is formed. The plasma treatment chamber 72 performs a plasma treatment with rare gas or oxygen to the surface of the lower electrode. This plasma treatment is performed for cleaning the surface, stabilizing the surface condition, and stabilizing the surface physically or chemically (for example, a work function or the like).

The film forming treatment chamber 69 is a treatment chamber for forming an electrode buffer layer which contacts one electrode of an EL element. The electrode buffer layer has a carrier injecting property (a hole injecting property or an electron injecting property) and suppresses a short-circuit of an EL element and a dark spot defect. The electrode buffer layer is typically formed of an organic and inorganic mixture material so as to have a resistance of $5\times10^4$ to $1\times10^6$ Ωcm with a thickness of 30 to 300 nm. The film forming treatment chamber 71 is a treatment chamber for forming a hole transporting layer.

A light-emitting layer of an EL element has a different structure in the case of a mono-color light emission and the case of white light emission. In the evaporation apparatus, film forming treatment chambers are preferably arranged in accordance with the light emission color. For example, in the case of forming three kinds of EL elements with different light emission colors in a display panel, a light-emitting layer in accordance with each light emission color is required to be formed. In this case, the film forming treatment chamber 70 can be used for forming a first light-emitting layer, the film forming treatment chamber 73 can be used for forming a second light-emitting layer, and the film forming treatment chamber 74 can be used for forming a third light-emitting layer. By changing the film forming treatment chamber for each light-emitting layer, mutual contamination of different light emission materials can be prevented, thereby improving the throughput of the film forming treatment.

Further, each of the film forming treatment chambers 70, 73, and 74 may be used to evaporate sequentially three kinds of EL materials with different light emission colors. In this case, evaporation is performed by moving a shadow mask in accordance with a region to be deposited.

In the case of forming an EL element which exhibits white light emission, light-emitting layers with different light emission colors are stacked vertically. In that case also, an element substrate sequentially can move from one film forming treatment chamber to another so as form each light-emitting layer. Alternatively, different light-emitting layers can be continuously formed in the same film forming treatment chamber as well.

In the film forming treatment chamber 76, an electrode is formed over the EL layer. The electrode can be formed by an electron beam evaporation method or a sputtering method, but a resistant thermal evaporation method is preferably used.

The element substrate in which up to the electrode has been formed is transferred into the sealing treatment chamber 65 through the intermediate treatment chamber 64. Inert gas such as helium, argon, neon, or nitrogen fills the sealing treatment chamber 65. In such an atmosphere, a sealing substrate is attached to a side of the element substrate where the EL layer is formed. In the sealed condition, inert gas or a resin material may fill a space between the element substrate and the sealing substrate. In the sealing treatment chamber 65, a dispenser for drawing a sealing material, a mechanical component such as an arm or a fixing stage for fixing the sealing substrate so as to oppose the element substrate, a dispenser or a spin coater for filling the resin material, and the like are provided.

Figure 49:
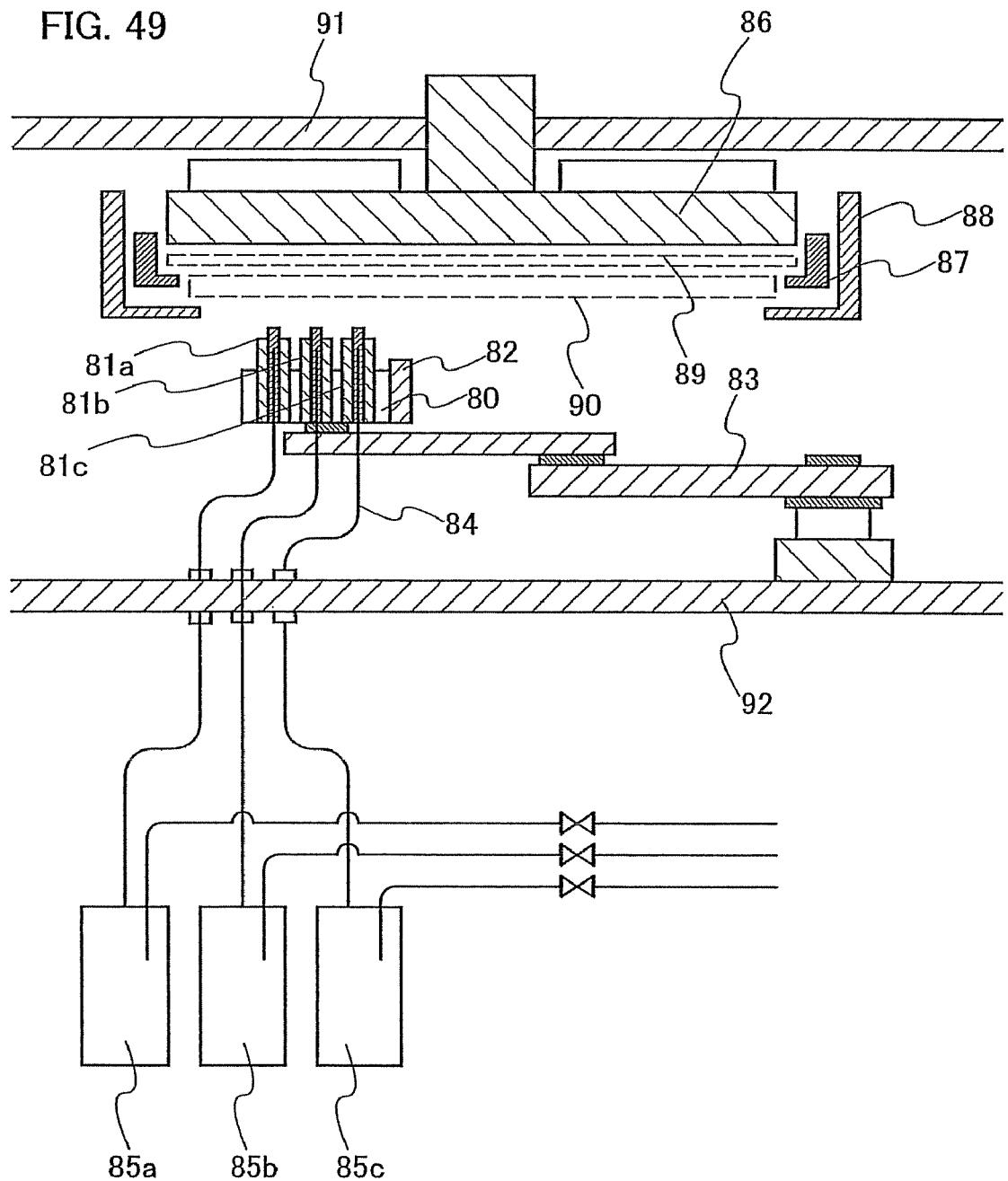
FIG. 49 shows a structure of an evaporation apparatus for forming an EL layer.

FIG. 49 shows an internal structure of the film forming treatment chamber. The film forming treatment chamber is kept under a reduced pressure. A space sandwiched between a top plate 91 and a bottom plate 92 is the interior which is kept at a reduced pressure.

In the treatment chamber, one or a plurality of evaporation sources is provided. In the case of forming a plurality of layers with different compositions or co-evaporating different materials, a plurality of evaporation sources are preferably provided. In FIG. 49, evaporation sources 81*a*, 81*b*, and 81*c* are set in an evaporation source holder 80. The evaporation source holder 80 is held by a multi-joint arm 83. The multi-joint arm 83 can freely move the evaporation source holder 80 within its movable region by expansion and contraction of joints. Moreover, a distance sensor 82 may be provided in the evaporation source holder 80 to monitor a distance between evaporation sources 81*a* to 81*c* and a substrate 89 so as to control an optimum distance for evaporation. In that case, the multi-joint arm may move in top and bottom directions'(Z direction) as well.

A substrate stage 86 and a substrate chuck 87 as a pair fix the substrate 89. The substrate stage 86 may be constituted with a heater incorporated therein so that the substrate 89 can be heated. The substrate 89 is transferred while being fixed on the substrate stage 86 by the substrate chuck 87. A shadow mask 90 provided with an opening portion can be used in accordance with a pattern to be deposited as required. In that case, the shadow mask 90 is provided between the substrate 89 and the evaporation sources 81*a* to 81*c*. The shadow mask 90 is fixed on the substrate or with a certain distance from the substrate by a mask chuck 88. When the shadow mask 90 requires alignment, a camera is provided in the treatment chamber and a positioning means is provided for the mask chuck 88 for slightly moving in X-Y-θ direction. Thus, positioning alignment is done.

An evaporation material supplying means for continuously supplying an evaporation material to the evaporation source is attached to the evaporation source 81. The evaporation material supplying means includes evaporation material supplying sources 85*a*, 85*b*, and 85*c* which are provided apart from the evaporation source 81, and a material supplying tube 84 which connects them. The material supplying sources 85*a*, 85*b*, and 85*c* are typically provided corresponding to the evaporation source 81. In FIG. 49, the material supplying source 85*a* and the evaporation source 81*a* correspond to each other. The same applies to the material supplying source 85*b* and the evaporation source 81*b*, and the material supplying source 85*c* and the evaporation source 81*c*.

The evaporation material can be supplying by an air current transfer method, an aerosol method, or the like. By the air current transfer method, impalpable powder of the evaporation material is transferred on the air current such as inert gas to the evaporation source 81. The aerosol method is a kind of an evaporation method, in which a material liquid in which an evaporation material is dissolved or dispersed in a solvent is transferred and formed into aerosol by a sprayer so that the solvent in the aerosol is vaporized. In either case, a heating means is provided for the evaporation source 81, which vaporizes the transferred evaporation material to be formed as a film over the substrate 89. In the case of FIG. 49, the material supplying tube 84 is formed of a narrow tube which can be flexibly bent and has enough rigidity not to be deformed even in the reduced pressure.

In the case of applying the air current transfer method or the aerosol method, it is preferable that the films be formed in the film forming treatment chamber at an atmospheric pressure or lower, and preferably at a reduced pressure of 133 to 13300 Pa. The film forming treatment chamber is filled with inert gas such as helium, argon, neon, krypton, xenon, or nitrogen. Alternatively, the pressure can be controlled while supplying the gas (exhausting at the same time). Moreover, the film forming treatment chamber for forming an oxide film may have an oxygen atmosphere by introducing a gas such as oxygen or nitrous oxide. Further, a gas such as hydrogen may be introduced to the film forming treatment chamber for evaporating an organic material so as to have a reduction atmosphere.

As another method for supplying an evaporation material, a screw may be provided in the material supplying tube 184 so as to continuously push the evaporation material toward the evaporation source.

With the evaporation apparatus of this embodiment mode, a film can be continuously formed uniformly even for a large display panel. Moreover, an evaporation material is not required to be supplied every time the evaporation material is used up in the evaporation source, therefore, the throughput can be improved.

It is to be noted that this embodiment mode can be freely combined with Embodiment Modes 1 to 6.

Embodiment Mode 8

In Embodiment Mode 8, hardware for controlling the display devices which have been described in Embodiment Modes 1 to 5, will be described.

FIG. 26 shows a schematic view. A pixel array 2704 is provided over a substrate 2701. A source driver 2706 and a gate driver 2705 are formed over the substrate 2701 in many cases. Besides, a power supply circuit, a precharge circuit, a timing generating circuit, or the like may also be provided over the substrate 2701. There is also a case where the source driver 2706 or the gate driver 2705 is not provided. In that case, a circuit which is not provided on the substrate 2701 is often formed in an IC. The IC is often mounted on the substrate 2701 by COG (Chip On Glass) bonding. Alternatively, the IC may be mounted on a connecting board 2707 for connecting a peripheral circuit substrate 2702 to the substrate 2701.

In other words, transistors in the present invention may be any type of transistors and may be formed over any type of substrates. Therefore, all of the circuits may be formed over a glass substrate, a plastic substrate, a single crystalline substrate, an SOI substrate, or other substrates. Alternatively, such a structure may be employed that a part of the driver circuits is formed over a substrate, while another part of the driver circuits is formed over another substrate. That is, all circuits are not required to be formed over the same substrate. For example, in FIG. 26 etc., such a structure may be employed that the pixel array and the gate driver are formed over a glass substrate by using TFTs, while the source driver (or a part of it) is formed over a single crystalline substrate so that the IC chip is attached onto the glass substrate by COG (Chip on Glass). Alternatively, the IC chip may be connected to the glass substrate by TAB (Tape Automated Bonding) or by use of a printed board.

A signal 2703 is input to the peripheral circuit substrate 2702, and a controller 2708 controls the signal so as to be stored in a memory 2709, a memory 2710, or the like. In a case where the signal 2703 is an analog signal, it is often subjected to analog-digital conversion and then, is stored in the memory 2709, the memory 2710, or the like. The controller 2708 outputs a signal to the substrate 2701 by using the signal stored in the memory 2709, the memory 2710, or the like.

In order to realize the driving methods described in Embodiment Modes 1 to 5, the controller 2708 controls various types of pulse signals, and outputs them to the substrate 2701.

Note that this embodiment mode can be freely combined with any of Embodiment Modes 1 to 6.

Embodiment Mode 9

Figure 27:
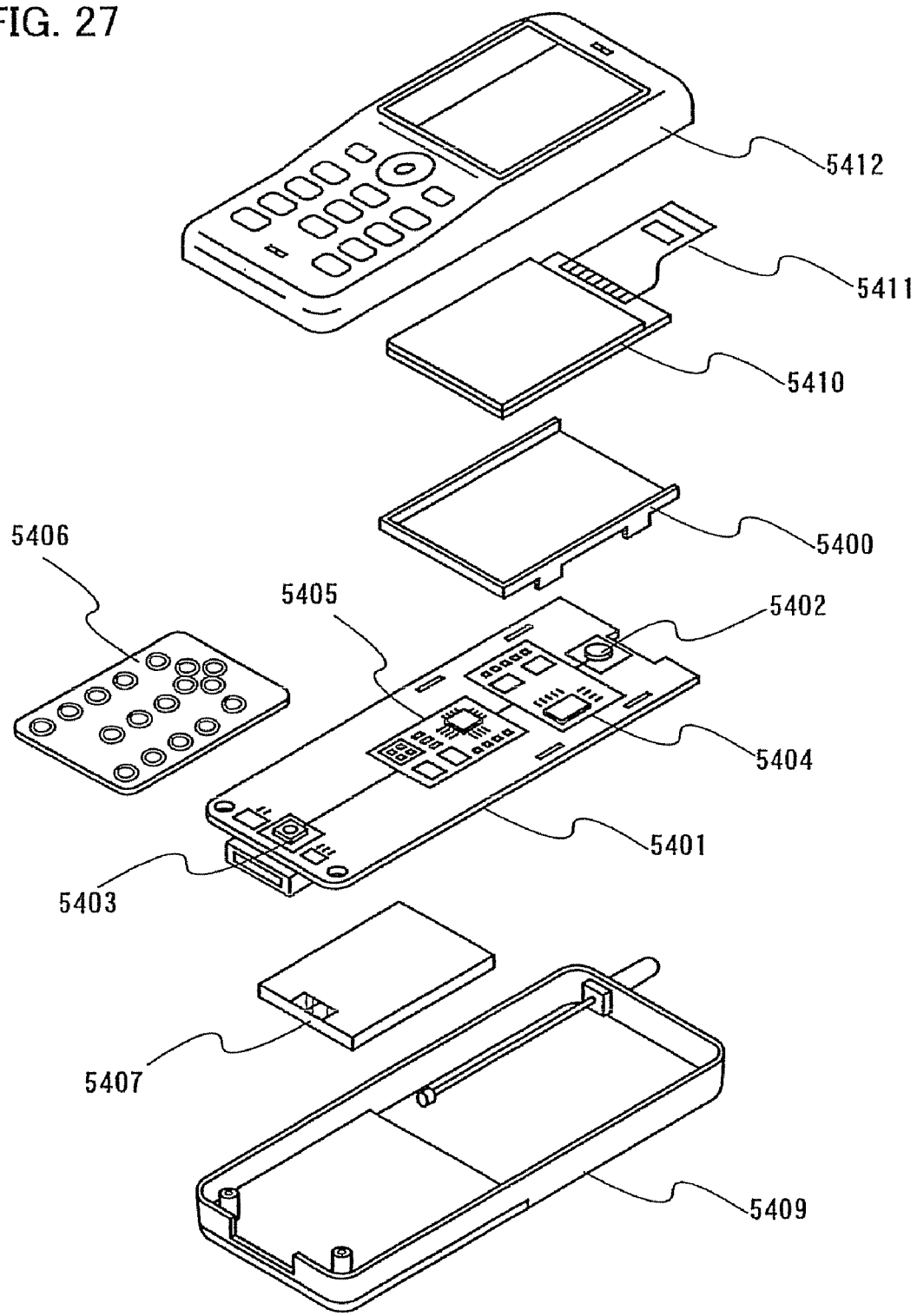
FIG. 27 shows a structure of a display device of the present invention.

An exemplary structure of a mobile phone which has the display device of the present invention, will be described with reference to FIG. 27.

A display panel 5410 is incorporated in a housing 5400 in an attachable/detachable manner. The shape and size of the housing 5400 can be appropriately changed in accordance with the size of the display panel 5410. The housing 5400 to which the display panel 5410 is fixed is set into a printed board 5401 so as to assemble a module.

The display panel 5410 is connected to the printed board 5401 through an FPC 5411. On the printed board 5401, a speaker 5402, a microphone 5403, a transmission-reception circuit 5404, and a signal processing circuit 5405 including a CPU, a controller or the like are formed. Such a module is combined with an input means 5406 and a battery 5407, and then incorporated into a housing 5409. A pixel portion of the display panel 5410 is disposed so that it can be seen from an open window formed in the housing 5412.

Figure 28A:
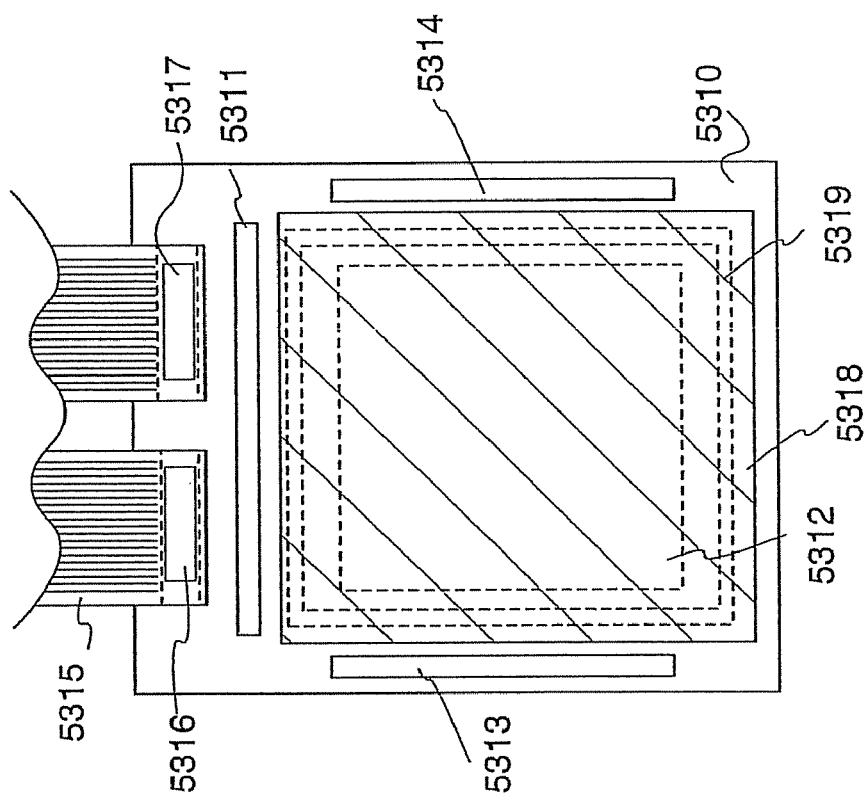
FIGS. 28A and 28B each show a structure of a display device of the present invention.

The display panel 5410 may be constructed in such a manner that a part of peripheral driver circuits (e.g., a driver circuit having a low operating frequency among a plurality of driver circuits) is formed over the same substrate as a pixel portion by using TFTs, while another part of the peripheral driver circuits (a driver circuit having a high operating frequency among the plurality of driver circuits) is formed in an IC chip. Then, the IC chip may be mounted on the display panel 5410 by a COG (Chip On Glass) method. Alternatively, the IC chip may be connected to a glass substrate by TAB (Tape Automated Bonding) or by use of a printed board. FIG. 28A shows an exemplary structure of such a display panel where a part of peripheral driver circuits is formed over the same substrate as a pixel portion, while another part of the peripheral driver circuits is formed in an IC chip to be mounted on the substrate by a COG method or the like. Note that the display panel shown in FIG. 28A includes a substrate 5300, a signal line driver circuit 5301, a pixel portion 5302, a first scan line driver circuit 5303, a second scan line driver circuit 5304, an FPC 5305, an IC chip 5306, an IC chip 5307, a sealing substrate 5308, and a sealing material 5309, and the signal line driver circuit 5301 formed in the IC chip is mounted by a COG method or the like. By employing such a structure, power consumption of a display device can be reduced and an operating time per charge of a mobile phone can be lengthened. In addition, cost reduction of a mobile phone can be achieved.

In addition, by impedance-converting signals set to scan lines or signal lines with a buffer, time required for writing signals into pixels in each row can be shortened. Thus, a high-resolution display device can be provided.

In addition, in order to further reduce power consumption, such a structure may be employed that a pixel portion is formed over a substrate with TFTs, and all the peripheral circuits are formed in IC chips to be mounted on the display panel by COG (Chip On Glass).

With such a display device of the present invention, fine and high-contrast images can be provided.

Note that the configuration shown in this embodiment mode is just an illustrative example of a mobile phone, and therefore, the display device of the present invention can be applied to mobile phones with various structures, without limiting to the mobile phone with the aforementioned structure.

Note also that this embodiment mode can be freely combined with any of Embodiment Modes 1 to 8.

Embodiment Mode 10

Figure 29:
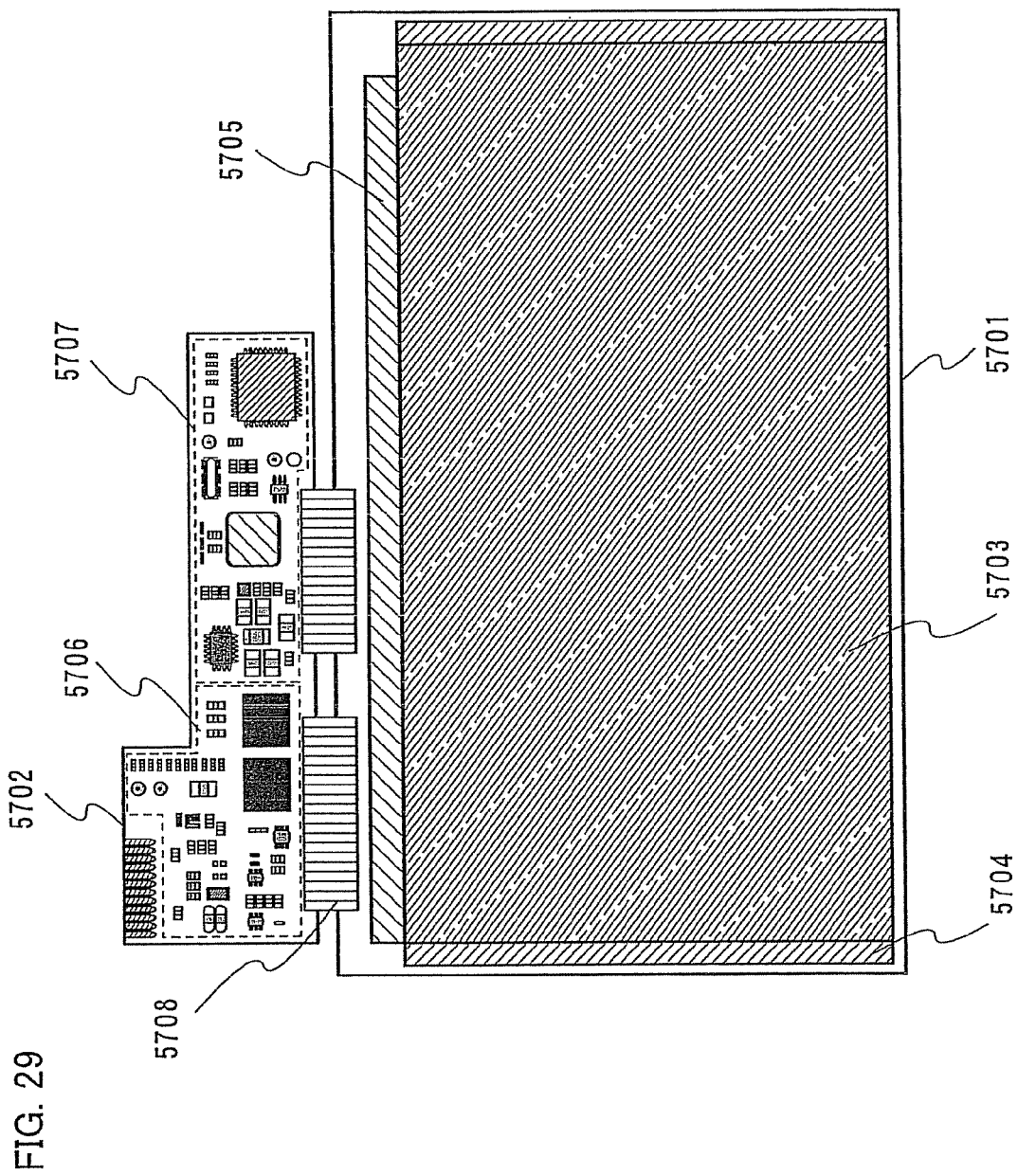
FIG. 29 shows a structure of a display device of the present invention.

FIG. 29 shows an EL module constructed by combining a display panel 5701 with a circuit board 5702. The display panel 5701 includes a pixel portion 5703, a scan line driver circuit 5704, and a signal line driver circuit 5705. Over the circuit board 5702, a control circuit 5706, a signal dividing circuit 5707, and the like are formed, for example. The display panel 5701 and the circuit board 5702 are connected to each other with a connecting wire 5708. An FPC or the like can be used for the connecting wire.

The control circuit 5706 corresponds to the controller 2708, the memory 2709, the memory 2710, or the like in Embodiment Mode 8. The control circuit 5706 mainly controls the arranging order of subframes or the like.

The display panel 5701 may be constructed in such a manner that a part of peripheral driver circuits (e.g., a driver circuit having a low operating frequency among a plurality of driver circuits) is formed over the same substrate with a pixel portion by using TFTs, while another part of the peripheral driver circuits (a driver circuit having a high operating frequency among the plurality of driver circuits) is formed in an IC chip, so that the IC chip is mounted on the display panel 5701 by COG (Chip On Glass) bonding or the like. Alternatively, the IC chip may be mounted on the display panel 5701 by TAB (Tape Automated Bonding) or by use of a printed board. FIG. 28A shows an exemplary configuration where a part of the peripheral driver circuits is formed over the same substrate as the pixel portion, and another part of the peripheral driver circuits is formed in an IC chip, so that the IC chip is mounted on the substrate by COG bonding or the like. By employing such a structure, power consumption of a display device can be reduced and an operating time per charge of a mobile phone can be lengthened. In addition, cost reduction of a mobile phone can be achieved.

In addition, by impedance-converting signals set to scan lines or signal lines with a buffer, time required for writing signals into pixels in each row can be shortened. Thus, a high-resolution display device can be provided.

In addition, in order to further reduce power consumption, such a structure may be employed that a pixel portion is formed over a glass substrate with TFTs, and all signal line driver circuits are formed in IC chips to be mounted onto the display panel by COG (Chip On Glass) bonding.

Figure 28B:
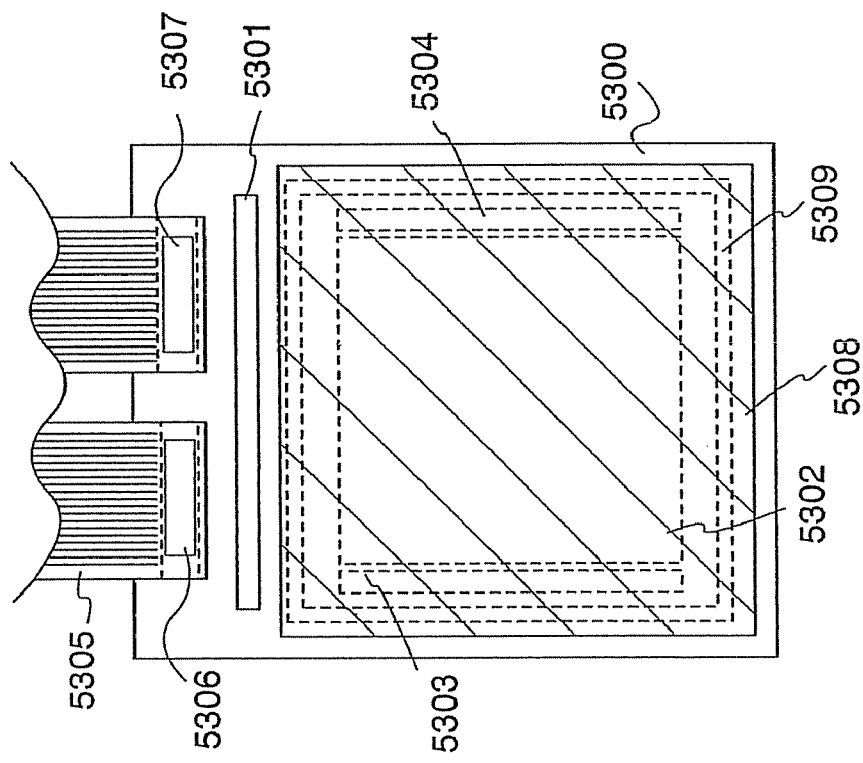

Note that such a structure is also desirable that a pixel portion is formed over a substrate with TFTs, and all of the peripheral driver circuits are formed in IC chips to be mounted onto the display panel by COG (Chip On Glass) bonding. FIG. 28B shows an exemplary structure where a pixel portion is formed over a substrate with TFTs, and signal line driver circuits formed in IC chips are mounted on the substrate by a COG method or the like. Note that a display panel shown in FIG. 28B includes a substrate 5310, a signal line driver circuit 5311, a pixel portion 5312, a first scan line driver circuit 5313, a second scan line driver circuit 5314, an FPC 5315, an IC chip 5316, an IC chip 5317, a sealing substrate 5318, and a sealing material 5319, and the signal line driver circuit 5311, the first scan line driver circuit 5313 and the second scan line driver circuit 5314 formed in the IC chips are mounted by a COG method or the like.

Figure 30:
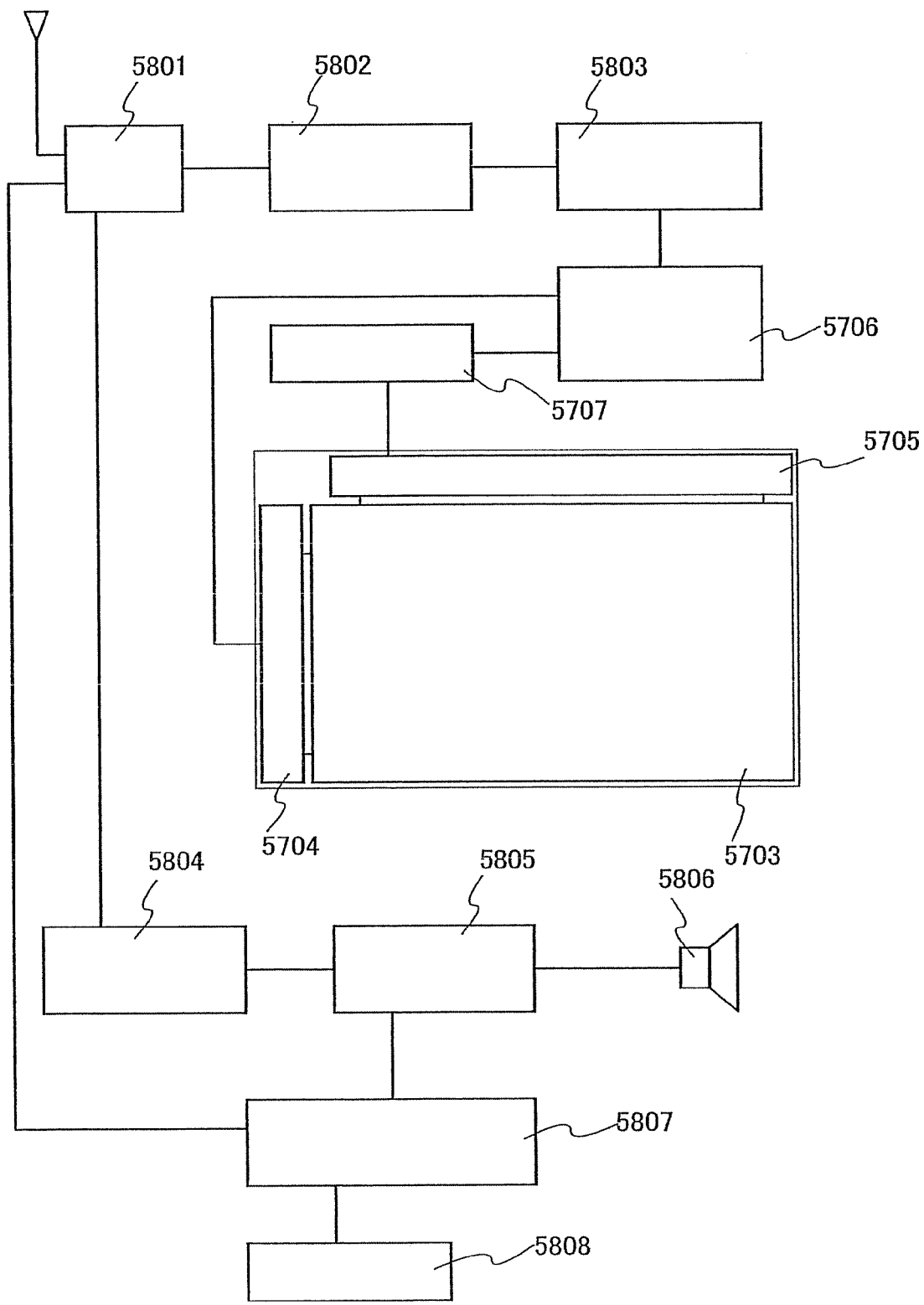
FIG. 30 shows a structure of a display device of the present invention.

With such an EL module, an EL television receiver can be completed. FIG. 30 is a block diagram showing a main configuration of an EL Television receiver. A tuner 5801 receives video signals and audio signals. The video signals are processed by a video signal amplifier circuit 5802, a video signal processing circuit 5803 for converting a signal output from the video signal amplifier circuit 5802 into a color signal corresponding to each color of red, green, and blue, and a control circuit 5706 for converting the video signal to be input into a driver circuit. The control circuit 5706 outputs signals to each of the scan line side and the signal line side. In the case of performing digital drive, a signal dividing circuit 5007 may be provided on the signal line side, so as to divide an input digital signal into m (m is natural number) signals so as to be supplied to a pixel portion.

Among the signals received at the tuner 5801, audio signals are transmitted to an audio signal amplifier circuit 5804, and an output thereof is supplied to a speaker 5806 through an audio signal processing circuit 5805. A control circuit 5807 receives control data on a receiving station (reception frequency) or sound volume from an input portion 5808 and transmits signals to the tuner 5801 as well as the audio signal processing circuit 5805.

By incorporating the EL module in a housing, a TV receiver can be completed. A display portion of the TV receiver is formed with such an EL module. In addition, a speaker, a video input terminal, and the like are provided as appropriate.

It is needless to mention that the present invention is not limited to the TV receive; and can be applied to various devices as a display medium having a large area such as a monitor of a personal computer, an information display board at the train station, airport, or the like, or an advertisement display board on the street.

In this manner, by using the display device of the present invention, fine and high-contrast images can be provided.

Note also that this embodiment mode can be freely combined with Embodiment Modes 1 to 9.

Embodiment Mode 11

Embodiment Mode 11 will explain a method for manufacturing a semiconductor device using a plasma treatment as a method for manufacturing a semiconductor device including a transistor.

Figure 32A:
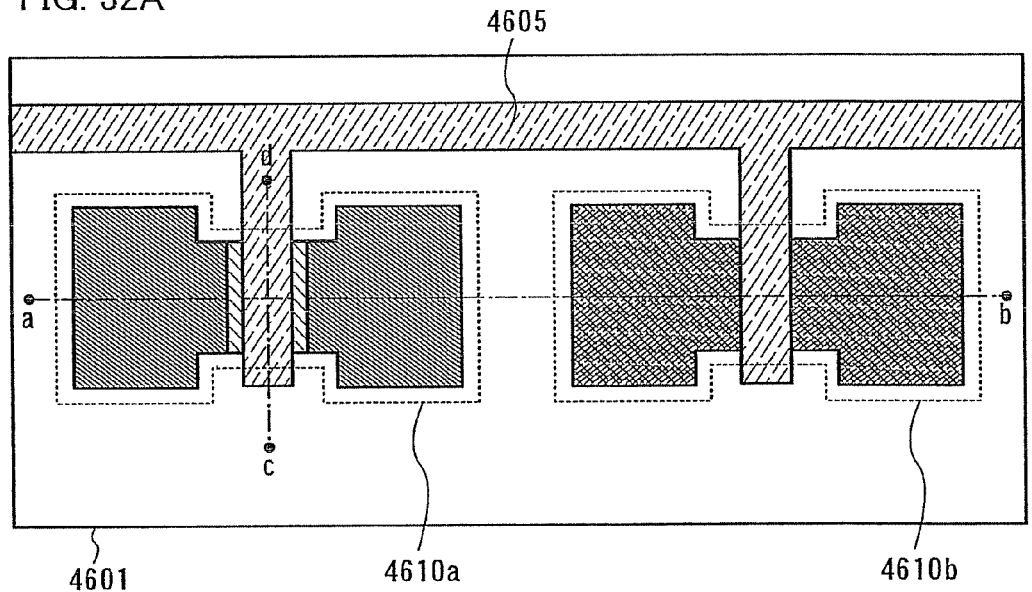
FIGS. 32A to 32C are a top view and cross-sectional views of a display device of the present invention.
Figure 32B:
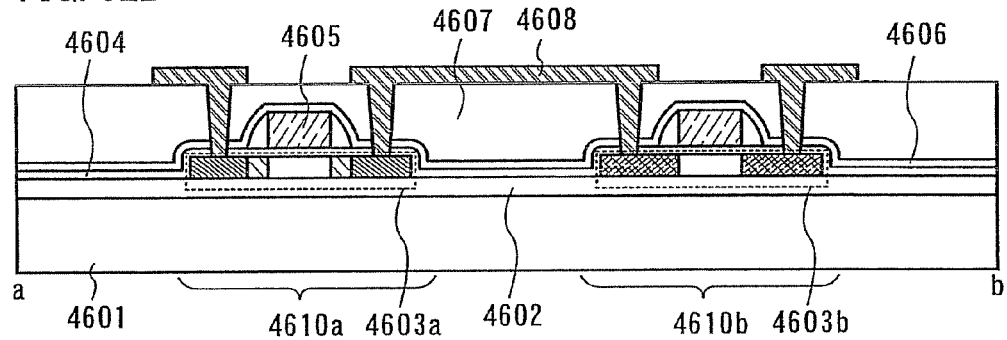
Figure 32C:
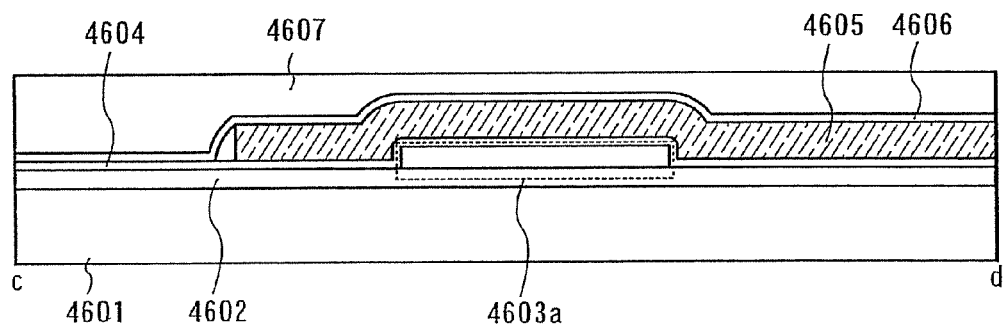

FIGS. 32A to 32C are views each showing a structure example of a semiconductor device including a transistor. Note that, in FIGS. 32A to 32C, FIG. 32B corresponds to a cross-sectional view taken along a-b of FIG. 32A, and FIG. 32C is a cross-sectional view taken along c-d of FIG. 32A.

A semiconductor device shown in FIGS. 32A to 32C include semiconductor films 4603a and 4603b provided over a substrate 4601 with an insulating film 4602 therebetween, a gate electrode 4605 provided over the semiconductor films 4603a and 4603b with a gate insulating film 4604 therebetween, insulating films 4606 and 4607 provided to cover the gate electrode, and a conductive film 4608 which is electrically connected to source and drain regions of the semiconductor films 4603a and 4603b and provided over the insulating film 4607. Note that FIGS. 32A to 32C each show a case of providing an N-channel transistor 4610a using a part of the semiconductor film 4603a as a channel region and a P-channel transistor 4610b using a part of the semiconductor film 4603b as a channel region; however, the present invention is not limited to this structure. For example, although in FIGS. 32A to 32C an LDD region is provided in the N-channel transistor 4610a but not in the P-channel transistor 4610b, a structure in which an LDD region can be provided in the both transistors or a structure in which an LDD region is not provided in the both transistors may be employed.

Note that, in this embodiment mode, a semiconductor device shown in FIGS. 32A to 32C is manufactured by oxidizing or nitriding at least one of the substrate 4601, the insulating film 4602, the semiconductor films 4603a and 4603b, the gate insulating film 4604, the insulating film 4606, and the insulating film 4607 by a plasma treatment, so that the semiconductor film or the insulating film is oxidized or nitrided. In this manner, by oxidizing or nitriding the semiconductor film or the insulating film by a plasma treatment, the surface of the semiconductor film or the insulating film is modified. Consequently, a denser insulating film can be formed as compared to an insulating film formed by a CVD method or a sputtering method. Therefore, a defect such as a pinhole can be suppressed and the characteristics or the like of a semiconductor device can be improved.

In this embodiment mode, a method for manufacturing a semiconductor device by performing a plasma treatment to the semiconductor film 4603a, the semiconductor film 4603b, or the gate insulating film 4604 in the above FIGS. 32A to 32C and oxidizing or nitriding the semiconductor film 4603a, the semiconductor film 4603b, or the gate insulating film 4604 will be explained with reference to the drawings.

Initially, the end portions of an island-shaped semiconductor film provided over a substrate are formed to be almost perpendicular.

First, the island-shaped semiconductor films 4603a and 4603b are formed over the substrate 4601 (FIG. 33A). The island-shaped semiconductor films 4603a and 4603b are formed by forming an amorphous semiconductor film with the use of a material containing silicon (Si) as a main component (for example, $Si_xGe_{1-x}$ or the like) over the insulating film 4602 formed in advance over the substrate 4601, by a sputtering method, an LPCVD method, a plasma CVD method, or the like, and then the amorphous semiconductor film is crystallized and selectively etched. Note that the amorphous semiconductor film can be crystallized by a crystallization method such as a laser crystallization method, a thermal crystallization method using RTA or an annealing furnace, a thermal crystallization method using a metal element which promotes crystallization, or a method using these methods in combination. Note that, in FIGS. 33A to 33D, the end portions of the island-shaped semiconductor films 4603a and 4603b are formed to be almost perpendicular ($\theta$=85° to 100°).

Next, the semiconductor films 4603a and 4603b are oxidized or nitrided by a plasma treatment to form insulating films 4621a and 4621b over the surfaces of the semiconductor films 4603a and 4603b, respectively (FIGS. 33B). Note that an oxide film or a nitride film can be used as the insulating films 4621a and 4621b. In a case of using Si for the semiconductor films 4603a and 4603b, for example, silicon oxide ($SiO_x$) or silicon nitride ($SiN_x$) is formed as the insulating films 4621a and 4621b. In addition, after oxidizing the semiconductor films 4603a and 4603b by a plasma treatment, they may be nitrided by a plasma treatment again. In this case, silicon oxide ($SiO_x$) is formed in contact with the semiconductor films 4603a and 4603b and silicon nitride oxide ($SiN_xO_y$) (x>y) is formed over the surface of the silicon oxide. Note that, in the case of oxidizing the semiconductor films by a plasma treatment, the plasma treatment is performed under an oxygen atmosphere (for example, under an atmosphere containing oxygen ($O_2$) and a rare gas (at least one of He, Ne, Ar, Kr, and Xe), an atmosphere containing oxygen, hydrogen ($H_2$), and a rare gas, or an atmosphere containing dinitrogen monoxide and a rare gas). On the other hand, in the case of nitriding the semiconductor films by a plasma treatment, the plasma treatment is performed under a nitrogen atmosphere (for example, under an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As a rare gas, for example, Ar can be used. A gas in which Ar and Kr are mixed may also be used as well. Accordingly, the insulating films 4621a and 4621b contain the rare gas (containing at least one of He, Ne, Ar, Kr, and Xe) used for the plasma treatment. When Ar is used, the insulating films 4621a and 4621b contain Ar.

In addition, the plasma treatment is performed with an electron density of $1\times10^{11}$ to $1\times10^{13}$ cm$^{-3}$ and an electron temperature of plasma of 0.5 to 1.5 eV in the atmosphere containing the gas described above. The electron density of plasma is high and the electron temperature around an object (here, the semiconductor films 4603a and 4603b) formed over the substrate 4601 is low. Thus, plasma damages to the object can be avoided. In addition, since the electron density of plasma is $1\times10^{11}$ cm$^{-3}$ or higher, the oxide film or the nitride film formed by oxidizing or nitriding the object by the plasma treatment has a superior evenness in film thickness as compared to a film formed by a CVD method, a sputtering method, or the like, and thus, can be a dense film. Moreover, since the electron temperature of plasma is 1 eV or lower, the oxidation treatment or the nitriding treatment can be performed at a lower temperature than a conventional plasma treatment or a thermal oxidation method. For example, the oxidation treatment or the nitriding treatment can be performed sufficiently even when the plasma treatment is performed at a lower temperature by at least 100° C. than a distortion point of a glass substrate. As the frequency for producing plasma, a high frequency wave such as a microwave (2.45 GHz) can be employed. Hereinafter, the plasma treatment is performed with the above conditions unless specifically referred.

Next, the gate insulating film 4604 is formed to cover the insulating films 4621a and 4621b (FIG. 33C). The gate insulating film 4604 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) by a sputtering method, an LPD method, a plasma CVD method, or the like. For example, when Si is used for the semiconductor films 4603a and 4603b, and silicon is oxidized by the plasma treatment, silicon oxide is formed as the insulating films 4621a and 4621b over the surfaces of the semiconductor films 4603a and 4603b. In this case, silicon oxide ($SiO_x$) is formed as the gate insulating film over the insulating films 4621a and 4621b. In addition, in FIG. 33B, when the thickness of the insulating films 4621a and 4621b which are formed by oxidizing or nitriding the semiconductor films 4603a and 4603b by the plasma treatment, are sufficiently thick, the insulating films 4621a and 4621b can be used as the gate insulating films.

Then, by forming the gate electrode 4605 or the like over the gate insulating film 4604, it is possible to manufacture a semiconductor device having the N-channel transistor 4610a and the P-channel transistor 4610b each using the island-shaped semiconductor films 4603a and 4603b as channel regions (FIG. 33D).

Before forming the gate insulating film 4604 over the semiconductor films 4603a and 4603b, the surface of each of the semiconductor films 4603a and 4603b is oxidized or nitrided by the plasma treatment. Consequently, a short-circuit or the like between the gate electrode and the semiconductor film due to a coverage defect of the gate insulating film 4604 in end portions 4651a and 4651b etc., of the channel regions can be prevented. In other words, in a case where the angles of the end portions of the island-shaped semiconductor films are formed to be almost perpendicular ($\theta$=85 to 100°), when the gate insulating film is formed to cover the semiconductor films by a CVD method, a sputtering method or the like, there is a risk of a coverage defect due to breakage of the gate insulating film, or the like at the end portions of the semiconductor films. However, when the plasma treatment is performed to the surface of the semiconductor film to oxide or nitride the surface, coverage defects and the like of the gate insulating film at the end portion of the semiconductor film can be prevented.

In FIGS. 33A to 33D, the gate insulating film 4604 may be oxidized or nitrided by performing a plasma treatment after forming the gate insulating film 4604. In this case, the gate insulating film 4604 is formed to cover the semiconductor films 4603a and 4603b (FIG. 34A), and a plasma treatment is performed to the gate insulating film 4604 to oxidize or nitride the gate insulating film 4604; therefore, an insulating film 4623 is formed over the surface of the gate insulating film 4604 (FIG. 34B). Note that an oxide film or a nitride film can be used as the insulating film 4623. The conditions for the plasma treatment can be similar to those of FIG. 33B. In addition, the insulating film 4623 contains a rare gas used in the plasma treatment, for example, in a case of using Ar, Ar is contained in the insulating film 4623.

In FIG. 34B, after the plasma treatment is performed in an atmosphere containing oxygen to oxidize the gate insulating film 4604, a plasma treatment may be performed again in an atmosphere containing nitrogen to nitride the gate insulating film 4604. In this case, silicon oxide ($SiO_x$) or silicon oxynitride ($SiO_xN_y$) (x>y) is formed over the semiconductor films 4603a and 4603b, and silicon nitride oxide ($SiN_xO_y$) (x>y) is formed in contact with the gate electrode 4605. After that, by forming the gate electrode 4605 or the like over the insulating film 4623, it is possible to manufacture a semiconductor device having the N-channel transistor 4610a and the P-channel transistor 4610b using the island-shaped semiconductor films 4603a and 4603b as channel regions (FIG. 34C). In this manner, by performing the plasma treatment to the gate insulating film, the surface of the gate insulating film is oxidized or nitrided to be enhanced in its film quality. Thus, a dense film can be obtained. The insulating film obtained by the plasma treatment is denser and has fewer defects such as pinholes as compared to an insulating film formed by a CVD method or a sputtering method, and thus, the characteristics of a thin film transistor can be enhanced.

In FIGS. 34A to 34C, the case is described, where the plasma treatment is performed to the semiconductor films 4603a and 4603b in advance, and the surfaces of the semiconductor films 4603a and 4603b is oxidized or nitrided. However, a method may be employed, in which a plasma treatment is performed after forming the gate insulating film 4604 without performing the plasma treatment to the semiconductor films 4603a and 4603b. In this manner, by performing the plasma treatment before forming the gate electrode, even when coverage defects due to breakage of the gate insulating film occurs at the end portions of the semiconductor films, the semiconductor film exposed due to the coverage defects can be oxidized or nitrided, and thus, a short-circuit between the gate electrode and the semiconductor film caused by the coverage defect of the gate insulating film at the end portions of the semiconductor films, or the like can be prevented.

Even when the end portions of the island-shaped semiconductor films are formed to be almost perpendicular, the plasma treatment is performed to the semiconductor films or the gate insulating film to oxidize or nitride the semiconductor films or the gate insulating film, thereby avoiding a short-circuit between the gate electrode and the semiconductor films caused by coverage defects of the gate insulating film at the end portions of the semiconductor films.

Next, a case will be described where the end portion of the island-semiconductor film has a tapered shape (θ=30° to less than 85°) in the island-shaped semiconductor film provided over the substrate.

First, the island-shaped semiconductor films 4603a and 4603b are formed over the substrate 4601 (FIG. 35A). As for the island-shaped semiconductor films 4603a and 4603b, an amorphous semiconductor film is formed using a material mainly containing silicon (Si) (for example, $Si_xGe_{1-x}$, or the like) over the insulating film 4602 formed in advance over the substrate 4601, by a sputtering method, an LPCVD method, a plasma CVD method, or the like. Then, the amorphous semiconductor film is crystallized by a crystallization method such as a laser crystallization method, a thermal crystallization method using RTA or an annealing furnace, or a thermal crystallization method using a metal element promoting crystallization. Then, the semiconductor film is selectively etched and removed. In FIGS. 35A to 35D, the end portions of the island-shaped semiconductor films 4603a and 4603b are tapered (θ=30° to less than 85°).

Next, the gate insulating film 4604 is formed to cover the semiconductor films 4603a and 4603b (FIG. 35B). The gate insulating film 4604 can be formed to have a single layer structure or a multilayer structure of insulating films containing nitrogen or oxygen such as silicon oxide ($SiO_x$), silicon nitride ($SiN_x$), silicon oxynitride ($SiO_xN_y$)(x>y), or silicon nitride oxide ($SiN_xO_y$) (x>y) by a sputtering method, an LPCVD method, a plasma CVD method, or the like.

Then, the gate insulating film 4604 is oxidized or nitrided by a plasma treatment, and thus, an insulating film 4624 is formed over the surface of the gate insulating film 4604 (FIG. 35C). Note that an oxide film or a nitride film can be used as the insulating film 4624. In addition, the conditions for the plasma treatment can be similar to those described above. For example, when silicon oxide ($SiO_x$) or silicon oxynitride ($SiO_xN_y$) (x>y) is used as the gate insulating film 4604, a plasma treatment is performed in an atmosphere containing oxygen to oxidize the gate insulating film 4604. The film obtained over the surface of the gate insulating film by the plasma treatment can be dense and have fewer defects such as pinholes as compared with a gate insulating film formed by a CVD method, a sputtering method, or the like. On the other hand, a plasma treatment is performed in an atmosphere containing nitrogen to nitride the gate insulating film 4604, silicon nitride oxide ($SiN_xO_y$) (x>y) can be provided as the insulating film 4624 over the surface of the gate insulating film 4604. In addition, after a plasma treatment is performed in an atmosphere containing oxygen to oxidize the gate insulating film 4604 once, a plasma treatment may be performed again in an atmosphere containing nitrogen to nitride the gate insulating film 4604. In addition, the insulating film 4624 contains a rare gas used in the plasma treatment, for example, in a case of using Ar, Ar is contained in the insulating film 4624.

Next, by forming the gate electrode 4605 or the like over the gate insulating film 4604, it is possible to manufacture a semiconductor device having the N-channel transistor 4610a and the P-channel transistor 4610b each using the island-shaped semiconductor films 4603a and 4603b as channel regions (FIG. 35D).

In this manner, by performing the plasma treatment to the gate insulating film, an insulating film formed of an oxide film or a nitride film is formed over the surface of the gate insulating film, and the surface of the gate insulating film can be enhanced in its film quality. The oxidized or nitrided insulating film by the plasma treatment is denser and has fewer defects such as pinholes as compared to a gate insulating film formed by a CVD method or a sputtering method, and thus, the characteristics of a thin film transistor can be enhanced. Further, it is possible to prevent a short-circuit between the gate electrode and the semiconductor film caused by the coverage defect of the gate insulating film or the like at the end portion of the semiconductor film, by forming the end portion of the semiconductor film into a tapered shape. However, by performing the plasma treatment after forming the gate insulating film, a short-circuit between the gate electrode and the semiconductor film, or the like can further be prevented.

A manufacturing method of a semiconductor device which is different from that in FIGS. 35A to 35D will be explained with reference to the drawings. Specifically, a case is described where a plasma treatment is selectively conducted to an end portion of a semiconductor film having a tapered shape.

First, the island-shaped semiconductor films 4603a and 4603b are formed over the substrate 4601 (FIG. 36A). As for the island-shaped semiconductor films 4603a and 4603b, an amorphous semiconductor film is formed using a material mainly containing silicon (Si) (e.g., $Si_xGe_{1-x}$, etc.) over the insulating film 4602 formed in advance over the substrate 4601, by a sputtering method, an LPCVD method, a plasma CVD method, or the like. Then, the amorphous semiconductor film is crystallized and the semiconductor film is selectively etched using resists 4625a and 4625b as masks. A crystallization method such as a laser crystallization method, a thermal crystallization method using RTA or an annealing furnace, a thermal crystallization method using a metal element promoting crystallization, or a combination of the methods can be adopted to crystallize the amorphous semiconductor film.

Next, before removing the resists 4625a and 4625b used for etching the semiconductor film, a plasma treatment is performed to selectively oxidize or nitride the end portions of the island-shaped semiconductor films 4603a and 4603b. An insulating film 4626 is formed at each end portion of the semiconductor films 4603a and 4603b (FIG. 36B). An oxide film or a nitride film can be sued as the insulating film 4626. The plasma treatment is performed with the above conditions. In addition, the insulating film 4626 contains a rare gas used in the plasma treatment.

Then, the gate insulating film 4604 is formed to cover the semiconductor films 4603a and 4603b (FIG. 36C). The gate insulating film 4604 can be formed similarly as described above.

Next, by forming the gate electrode 4605 or the like over the gate insulating film 4604, it is possible to manufacture a semiconductor device having the N-channel transistor 4610a and the P-channel transistor 4610b each using the island-shaped semiconductor films 4603a and 4603b as channel regions (FIG. 36D).

When the end portions of the semiconductor films 4603a and 4603b are tapered, end portions 4652a and 4652b of the channel regions formed in parts of the semiconductor films 4603a and 4603b are also tapered. Thus, the thickness of the semiconductor film or the gate insulating film varies as compared to the center portion, and there is a risk that the characteristics of a transistor are affected. Thus, by selectively oxidizing or nitriding the end portions of the channel regions by the plasma treatment, an insulating film is formed over the semiconductor film which becomes the end portions of the channel region. Thus, an influence on the transistor due to the end portions of the channel region can be reduced.

FIGS. 36A to 36D show an example in which the plasma treatment is performed to only the end portions of the semiconductor films 4603a and 4603b for oxidation or nitriding. Needless to say, a plasma treatment can also be performed to the gate insulating film 4604 for oxidation or nitriding as shown in FIGS. 35A to 35D (FIG. 38A).

Next, a manufacturing method of a semiconductor device will be explained with reference to the drawings. The method is different from the method described above. Specifically, a plasma treatment is applied to a semiconductor film having a tapered shape.

First, island-shaped semiconductor films 4603a and 4603b are formed over the substrate 4601 similarly as described above (FIG. 37A).

Next, a plasma treatment is performed to the semiconductor films 4603a and 4603b to oxidize or nitride the semiconductor films 4603a and 4603b, and thus insulating films 4627a and 4627b are formed on the surfaces of the semiconductor films 4603a and 4603b (FIG. 37B). An oxide film or a nitride film can be used for the insulating films 4627a and 4627b. The plasma treatment can be performed with the above conditions. For example, when Si is used for the semiconductor films 4603a and 4603b, silicon oxide ($SiO_x$) or silicon nitride ($SiN_x$) is formed as the insulating films 4627a and 4627b. In addition, after oxidizing the semiconductor films 4603a and 4603b by the plasma treatment, a plasma treatment may be performed again to nitride the semiconductor films 4603a and 4603b. In this case, silicon oxide ($SiO_x$) or silicon oxynitride ($SiO_xN_y$) (x>y) is formed in contact with the semiconductor films 4603a and 4603b, and silicon nitride oxide ($SiN_xO_y$) (x>y) is formed over the surface of the silicon oxide. Therefore, the insulating films 4627a and 4627b contain a rare gas used for the plasma treatment. By the plasma treatment, the end portions of the semiconductor films 4603a and 4603b are oxidized or nitrided at the same time.

Then, the gate insulating film 4604 is formed to cover the insulating films 4627a and 4627b (FIG. 37C). As the gate insulating film 4604, a single layer structure or a stacked-layer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) can be employed by a sputtering method, an LPCVD method, a plasma CVD method, or the like. For example, in a case where the semiconductor films 4603a and 4603b using Si are oxidized by a plasma treatment to form silicon oxide as the insulating films 4627a and 4627b on the surface of the semiconductor films 4603a and 4603b, silicon oxide ($SiO_x$) is formed as the gate insulating film over the insulating films 4627a and 4627b.

Next, by forming the gate electrode 4605 or the like over the gate insulating film 4604, it is possible to manufacture a semiconductor device having the N-channel transistor 4610a and the P-channel transistor 4610b using the island-shaped semiconductor films 4603a and 4603b as channel regions (FIG. 37D).

When the end portions of the semiconductor films are tapered, end portions 4603a and 4603b of the channel regions formed in a portion of the semiconductor films are also tapered. Thus, there is a risk that the characteristics of a semiconductor element are affected. By oxidizing or nitriding the end portions of the channel regions as a result of oxidizing or nitriding the semiconductor films by the plasma treatment, an influence on a semiconductor element can be reduced.

In FIGS. 37A to 37D, the example is shown in which only the semiconductor films 4603a and 4603b are subjected to oxidization or nitriding by the plasma treatment; however, a plasma treatment can be performed to the gate insulating film 4604 for oxidation or nitriding as shown in FIGS. 35A to 35D (FIG. 38B). In this case, after the plasma treatment is performed in an atmosphere containing oxygen once to oxide the gate insulating film 4604, a plasma treatment may be performed again in an atmosphere containing nitrogen to nitride the gate insulating film 4604. In this case, silicon oxide ($SiO_x$) or silicon oxynitride ($SiO_xN_y$) (x>y) is formed in the semiconductor films 4603a and 4603b, and silicon nitride oxide ($SiN_xO_y$) (x>y) is formed to be in contact with the gate electrode 4605.

Figure 39A:
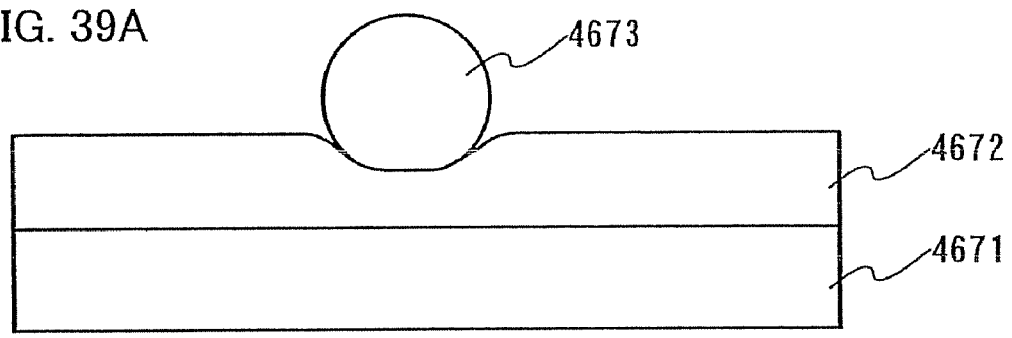
FIGS. 39A and 39B show cross-sectional structures of a display device of the present invention.
Figure 39B:
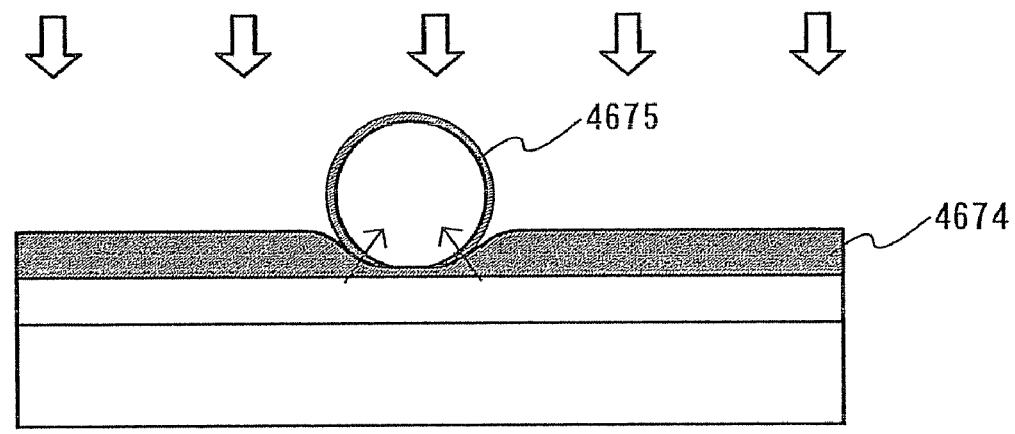

By performing the plasma treatment in this manner, impurities such as dusts attached to the semiconductor film or the insulating film can be easily removed. In general, in some cases, dusts (also referred to as particles) are attached to the film formed by a CVD method, a sputtering method, or the like. For example, as shown in FIG. 39A, there is a case that a dust 4673 is formed over an insulating film 4672 formed by a CVD method, a sputtering method, or the like, which is formed over a film 4671 such as an insulating film, a conductive film, or a semiconductor film. In such a case, the insulating film 4672 is oxidized or nitrided by a plasma treatment and an insulating film 4674 is formed on the surface of the insulating film 4672. An oxide film or a nitride film can be used for the insulating film 4674. As for the insulating film 4674, a portion under the dust 4673 as well as a portion in which the dust 4673 does not exist are oxidized or nitrided, and thus the volume of the insulating film 4674 is increased. The surface of the dust 4673 is also oxidized or nitrided by the plasma treatment to form an insulating film 4675, and as a result, the volume of the dust 4673 is also increased (FIG. 39B).

At this time, the dust 4673 can be easily removed from the surface of the insulating film 4674 by simple cleaning such as brush cleaning. In this manner, by the plasma treatment, even a minute dust attached to the insulating film or a semiconductor film can be removed easily. It is noted that this is an effect obtained by performing the plasma treatment, and this is true of other embodiment modes as well as this embodiment mode.

As described above, by improving the film quality of the surface of the semiconductor film or the gate insulating film by oxidation or nitriding by the plasma treatment, a dense insulating film having good film quality can be formed. In addition, dusts or the like attached to the surface of the insulating film can be removed easily by cleaning. Consequently, even when the insulating film is formed to be thin, defects such as pinholes can be avoided, and miniaturization and higher performance of a semiconductor element such as a thin film transistor can be realized.

Note that, in this embodiment mode, a plasma treatment is performed to the semiconductor films 4603a and 4603b or the gate insulating film 4604 in the above FIGS. 32A to 32C to oxidize or nitride the semiconductor films 4603a and 4603b or the gate insulating film 4604; however, a layer that is oxidized or nitrided by a plasma treatment is not limited thereto. For example, a plasma treatment may be performed to the substrate 4601 or the insulating film 4602, or a plasma treatment may be performed to the insulating film 4606 or 4607.

Note that this embodiment mode can be freely combined with Embodiment Modes 1 to 10.

Embodiment Mode 12

Embodiment Mode 12 will explain a half-tone method as a process of manufacturing a semiconductor device including a transistor.

FIG. 40 is a view showing a cross-sectional structure of a semiconductor device including a transistor, a capacitor element, and a resistor element. FIG. 40 shows N-channel transistors 4001 and 4002, a capacitor element 4004, a resistor element 4005, and a P-channel transistor 4003. Each transistor is provided with a semiconductor layer 5505, an insulating film 5508, and a gate electrode 5509. The gate electrode 5509 is formed in a stacked structure of first and second conductive layers 5503 and 5502. In addition, FIGS. 41A to 41E are each a top view corresponding to the transistors, capacitor element, and resistor element shown in FIG. 40, which can be referred to as well.

In FIG. 40, the N-channel transistor 4001 has impurity regions 5507 formed in the semiconductor layer 5505 on opposite sides of a channel formation region in the channel length direction (the direction in which carriers flow), which are also referred to as lightly doped drains (LDDs) and in which doping is conducted at a concentration lower than the impurity concentration of impurity regions 5506 forming source and drain regions in contact with wires 5504. In a case of arranging the N-channel transistor 4001, the impurity regions 5506 and 5507 are doped with phosphorus or the like as an impurity imparting N-type conductivity. The LDDs are formed as a means of suppressing hot electron degradation and short channel effect.

Figure 41A:
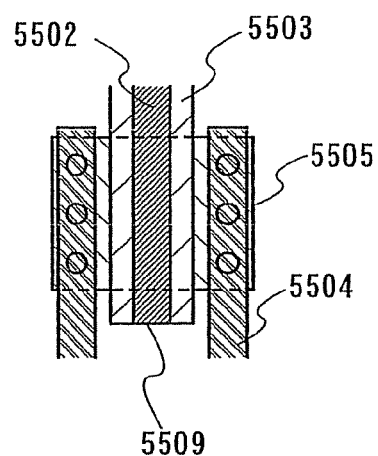
FIGS. 41A to 41E each show a structure of a display device of the present invention.

As shown in FIG. 41A, the gate electrode 5509 of the N-channel transistor 4001 has the first conductive layer 5503 formed to extend on opposite sides of the second conductive layer 5502. In this case, the first conductive layer 5503 is formed to have such a thinner film thickness than the second conductive layer. The first conductive layer 5503 is formed to have a thickness that allows ion species accelerated by an electric field of 10 to 100 kV to pass. The impurity regions 5507 are formed to overlap with the first conductive layer 5503 of the gate electrode 5509, that is, form LDD regions overlapping with the gate electrode 5509. In this structure, the impurity regions 5507 are formed in a self-aligned manner by adding one conductivity-type impurity through the first conductive layer 5503 of the gate electrode 5509 using the second conductive layer 5502 as a mask. In other words, the LDD overlapping with the gate electrode is formed in a self-aligned manner.

Figure 41B:
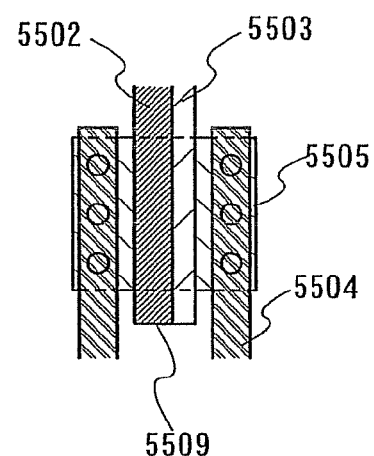

In FIG. 40, the N-channel transistor 4002 has the impurity region 5507 formed in the semiconductor layer 5505 on one side of the gate electrode, in which doping is conducted to have a concentration lower than the impurity concentration of impurity regions 5506. As shown in FIG. 41B, the gate electrode 5509 of the N-channel transistor 4002 has the first conductive layer 5503 formed to extend on one side of the second conductive layer 5502. Also in this case, the LDD can be formed in a self-aligned manner by adding one conductivity-type impurity through the first conductive layer 5503 using the second conductive layer 5502 as a mask.

The transistor with the LDD on one side may be applied to a transistor where only positive voltage or negative voltage is applied between source and drain electrodes, and specifically may be applied to a transistor constituting a logic gate such as an inverter circuit, a NAND circuit, a NOR circuit, or a latch circuit, and to a transistor constituting an analog circuit such as a sense amplifier, a constant voltage generation circuit, or a VCO.

Figure 41C:
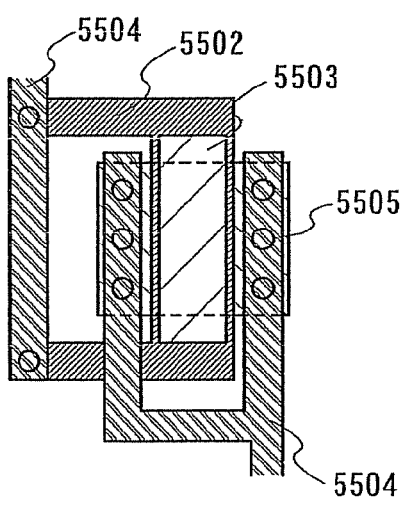

In FIG. 40, the capacitor element 4004 is formed to have the insulating film 5508 sandwiched between the first conductive layer 5503 and the semiconductor layer 5505. The semiconductor layer 5505 forming the capacitor element 4004 includes impurity regions 5510 and an impurity region 5511. The impurity region 5511 is formed in a position overlapping with the first conductive layer 5503 in the semiconductor layer 5505. In addition, the impurity regions 5510 are in contact with the wires 5504. Since the impurity region 5511 can be doped with one conductivity-type impurity through the first conductive layer 5503, the concentration of the impurity included in the impurity regions 5510 can be the same as or different from the concentration of the impurity included in the impurity region 5511. In any case, since the semiconductor layer 5505 is made to function as an electrode in the capacitor element 4004, it is preferable that the semiconductor layer 5505 be doped with one conductivity-type impurity to make the resistance lower. In addition, the first conductive layer 5503 can be made to function sufficiently as an electrode by using the second conductive layer 5502 as an auxiliary electrode as shown in FIG. 41C. In this manner, the capacitor element 4004 can be formed in a self-aligned manner by using a composite electrode structure in which the first and second conductive layers 5503 and 5502 are combined.

In FIG. 40, the resistor element 4005 is formed with the first conductive layer 5503. Since the first conductive layer 5503 is formed to have a thickness of approximately 30 to 150 nm, the width and length thereof can be appropriately set to arrange the resistor element.

Figure 41D:
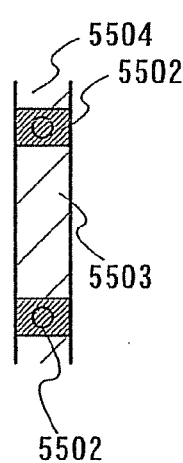

The resistor element may be made using a semiconductor layer including an impurity element at a high concentration or a metal layer that has a thin film thickness. The resistance of the semiconductor layer depends on the film thickness, the film quality, the impurity concentration, the activation rate, or the like. However, the metal layer is preferable, because the resistance of the metal layer is determined by the film thickness and the film quality, and thus it is less variable. FIG. 41D shows a top view of the resistor element 4005.

Figure 41E:
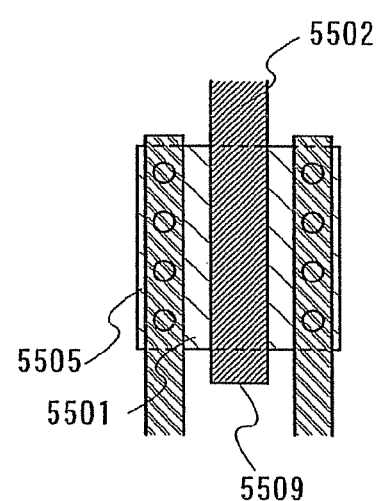

In FIG. 40, the P-channel transistor 4003 has the semiconductor layer 5505 including impurity regions 5512. The impurity regions 5512 form source and drain regions in contact with the wires 5504. The gate electrode 5509 has a structure in which the first and second conductive layers 5503 and 5502 are overlapped with each other. The P-channel transistor 4003 is a transistor that has a single drain structure without an LDD. In the case of forming the P-channel transistor 4003, the impurity regions 5512 are doped with boron or the like as an impurity imparting P-type conductivity. On the other hand, when the impurity regions 5512 are doped with phosphorus, an N-channel transistor having a single drain structure can be formed. FIG. 41E shows a top view of the P-channel transistor 4003.

One or both of the semiconductor layer 5505 and the insulating layer 5508 may be subjected to an oxidation or nitriding treatment by a microwave-excited high-density plasma treatment that has an electron temperature of 2 eV or less, ion energy of 5 eV or less, and an electron density on the order of $10^{11}$ to $10^{13}/cm^3$. In this case, the defect level at the interface between the semiconductor layer 5505 and the insulating film 5508 can be reduced by performing the treatment at a substrate temperature of 300 to 450° C. in an oxidising atmosphere ($O_2$, $N_2O$, or the like) or a nitriding atmosphere ($N_2$, $NH_3$, or the like). By performing this treatment for the insulating film 5508, this insulating film can be made dense. In other words, generation of a charged defect can be suppressed to prevent variation in the threshold voltage of the transistor. In addition, in a case of driving the transistor at a voltage of 3 V or less, an insulating film oxidized or nitrided by this plasma treatment can be applied as the insulating film 5508. Alternatively, in a case where the driving voltage of the transistor is 3 V or more, an insulating film formed by this treatment on the surface of the semiconductor layer 5505 and an insulating film deposited by a CVD method (a plasma CVD method or a thermal CVD method) can be combined to form the insulating film 5508. Also, this insulating film can be used as the dielectric layer of the capacitor element 4004. In this case, a capacitor element with a large charge capacity can be formed because this insulating film formed by the plasma treatment has a thickness of 1 to 10 nm and is a dense film.

As explained with reference to FIG. 40 and FIGS. 41A to 41E, elements that have various structures can be formed by combining conductive layers that are different in film thickness. A region where only the first conductive layer is formed and a region where the first conductive layer and the second conductive layer are stacked can be formed by using a photomask or a reticle provided with an assist pattern that is composed of a diffraction grating pattern or a semi-transparent film and has a function of reducing a light intensity. In other words, when a photoresist is exposed to light in a photolithography process, the amount of light passing through the photomask is controlled to make a thickness for a resist mask to be developed different. In this case, the photomask or reticle provided with slits of the resolution limit or less may be used to form a resist that has the complicated shape described above. In addition, baking at about 200° C. may be performed after the development, to change the shape of the mask pattern formed from a photoresist material.

In addition, a region where only the first conductive layer is formed and a region where the first conductive layer and the second conductive layer are stacked can be formed continuously by using a photomask or a reticle provided with an assist pattern that is composed of a diffraction grating pattern or a semi-transparent film and has a function of reducing a light intensity. As shown in FIG. 41A, the region where only the first conductive layer is formed can be formed selectively over the semiconductor layer. This region is effective over the semiconductor layer but not necessary in a region (a wire region continued from the gate electrode) other than that. Since a region where only the first conductive layer is formed is not required to be formed in the wire region as a result of the use of this photomask or reticle, the wire density can be substantially increased.

In the case of FIG. 40 and FIGS. 41A to 41E, the first conductive layer is formed to have a thickness of 30 to 50 nm by using a high melting point metal such as tungsten (W), chromium (Cr), tantalum (Ta), tantalum nitride (TaN), or molybdenum (Mo), or an alloy or compound including a high melting point metal described above as its main component. In addition, the second conductive layer is formed to have a thickness of 300 to 600 nm by using a high melting point metal such as tungsten (W), chromium (Cr), tantalum (Ta), tantalum nitride (TaN), or molybdenum (Mo), or an alloy or compound including a high melting point metal describe above as its main component. For example, different conductive materials are used for the first and second conductive layers to result in a difference in etching rate in an etching process to be performed later. As an example, TaN can be used for the first conductive layer, and a tungsten film can be used as the second conductive layer.

This embodiment mode shows that transistors that have different electrode structures, a capacitor element, and a resistor element can be formed to be separated in the same patterning process by using a photomask or a reticle provided with an assist pattern that is composed of a diffraction grating pattern or a semi-transparent film and has a function of reducing a light intensity. This allows elements having different modes to be integrated based on circuit characteristics without increasing the number of steps.

Note that this embodiment mode can be freely combined with Embodiment Modes 1 to 11.

Embodiment Mode 13

Embodiment Mode 13 will explain an example of a mask pattern in manufacturing a semiconductor device such as a transistor with reference to FIGS. 42A and 42B, FIGS. 43A and 43B, and FIGS. 44A and 44B.

Figure 42A:
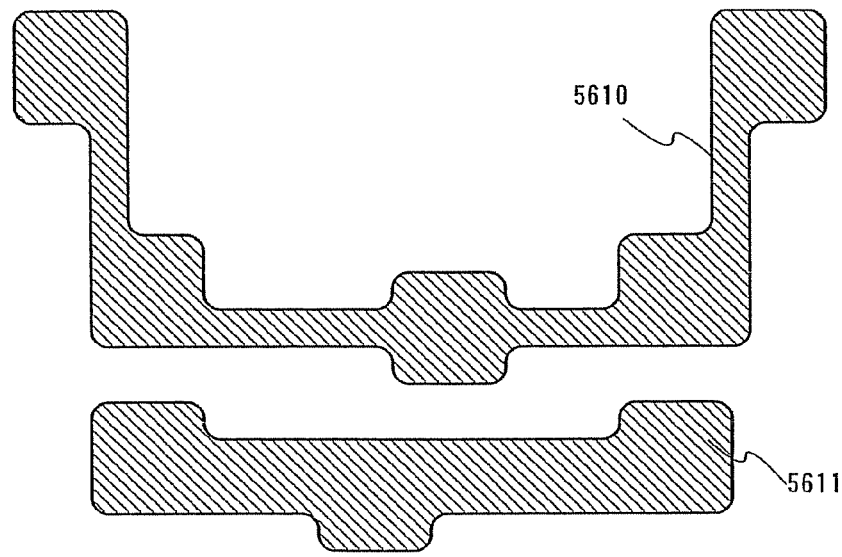
FIGS. 42A and 42B show a structure of a display device of the present invention.

It is preferable to form semiconductor layers 5610 and 5611 shown in FIG. 42A with silicon or a crystalline semiconductor containing silicon as its main component. For example, polycrystalline silicon, single crystal silicon, or the like that is a silicon film crystallized by laser annealing or the like is used. Besides, it is also possible to use a metal-oxide semiconductor, amorphous silicon, or an organic semiconductor that shows semiconductor characteristics.

In either case, the semiconductor layer to be formed first is formed over an entire surface or a part (a region having an area larger than a region to be determined as a semiconductor region of a transistor) of a substrate having an insulating surface. Then, a mask pattern is formed over the semiconductor layer by a photolithography technique. Island-shaped semiconductor layers 5610 and 5611 which have specific shapes and include source and drain regions and channel formation regions of transistors are formed by performing an etching treatment of the semiconductor layers with the use of the mask pattern.

Figure 42B:
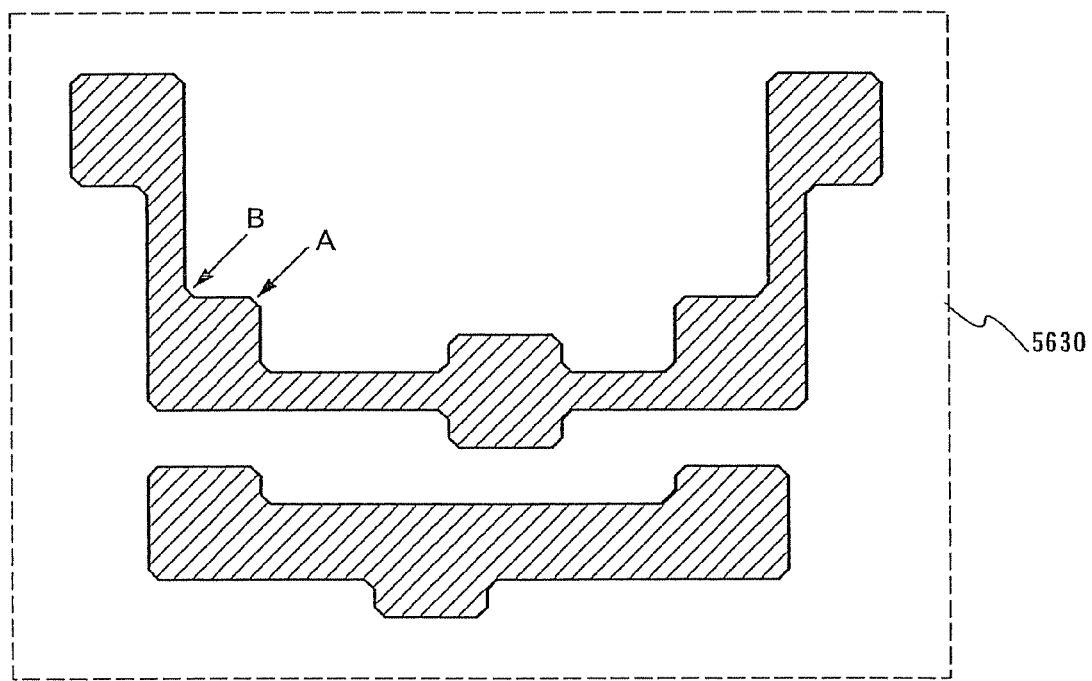

A photomask for forming the semiconductor layers 5610 and 5611 shown in FIG. 42A is provided with a mask pattern 5630 shown in FIG. 42B. The mask pattern 5630 differs depending on the type of a resist used for a photolithography process, i.e., a positive type or a negative type. In a case where the positive resist is used, the mask pattern 5630 shown in FIG. 42B is manufactured as a light shielding portion. The mask pattern 5630 has a polygon shape in which a top portion A is removed. In addition, a bent portion B has a shape that the corner is bended over plural levels so as not to be orthogonal. This photomask pattern has a corner portion. In the corner portion, a pattern having a rectangular triangle shape whose hypotenuse is 10 μm or less, or a length which is from ⅕ to ½ of the line width, is removed.

The shape of the mask pattern 5630 shown in FIG. 42B is reflected in the semiconductor layers 5610 and 5611 shown in FIG. 42A. In this case, a shape similar to the mask pattern 5630 may be transferred or may be transferred so that the corner of the mask pattern 5630 is more rounded. In other words, a pattern shape may be made smoother than the mask pattern 5630 to have roundness.

Figure 43A:
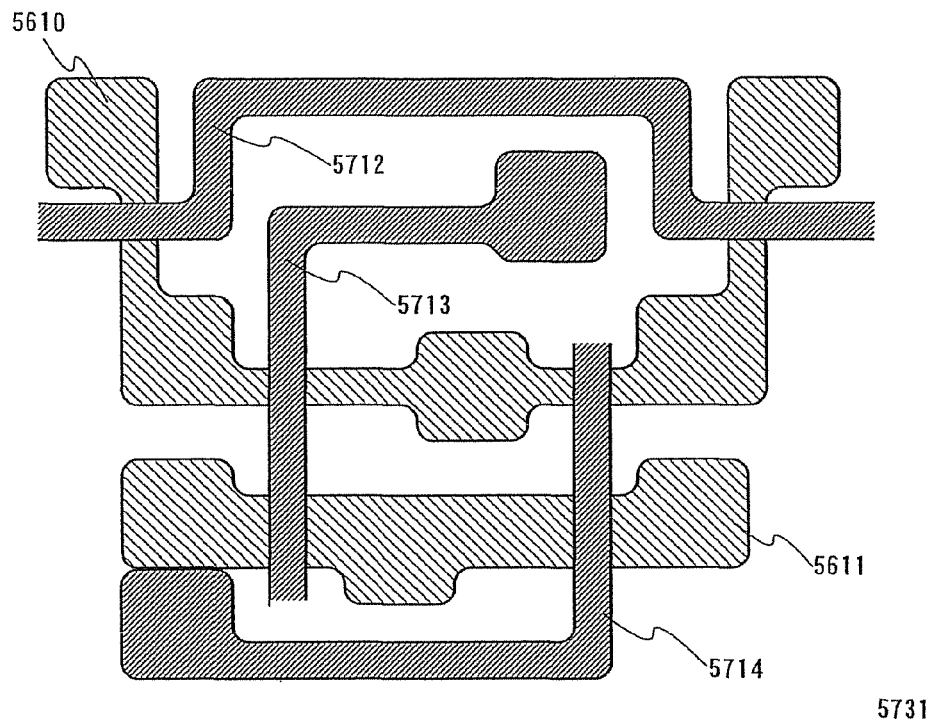
FIGS. 43A and 43B show a structure of a display device of the present invention.

An insulating layer partially containing at least silicon oxide or silicon nitride is formed over the semiconductor layers 5610 and 5611. One of purposes of forming the insulating layer is that it is used as a gate insulating layer. Then, as shown in FIG. 43A, gate wires 5712, 5713, and 5714 are formed so as to partially overlap with the semiconductor layers. The gate wire 5712 is formed to correspond to the semiconductor layer 5610. The gate wire 5713 is formed to correspond to the semiconductor layers 5610 and 5611. In addition, the gate wire 5714 is formed to correspond to the semiconductor layers 5610 and 5611. By forming a metal layer or a semiconductor layer having high conductivity, the shapes of the gate wires are formed over the insulating layer by a photolithography technique.

Figure 43B:
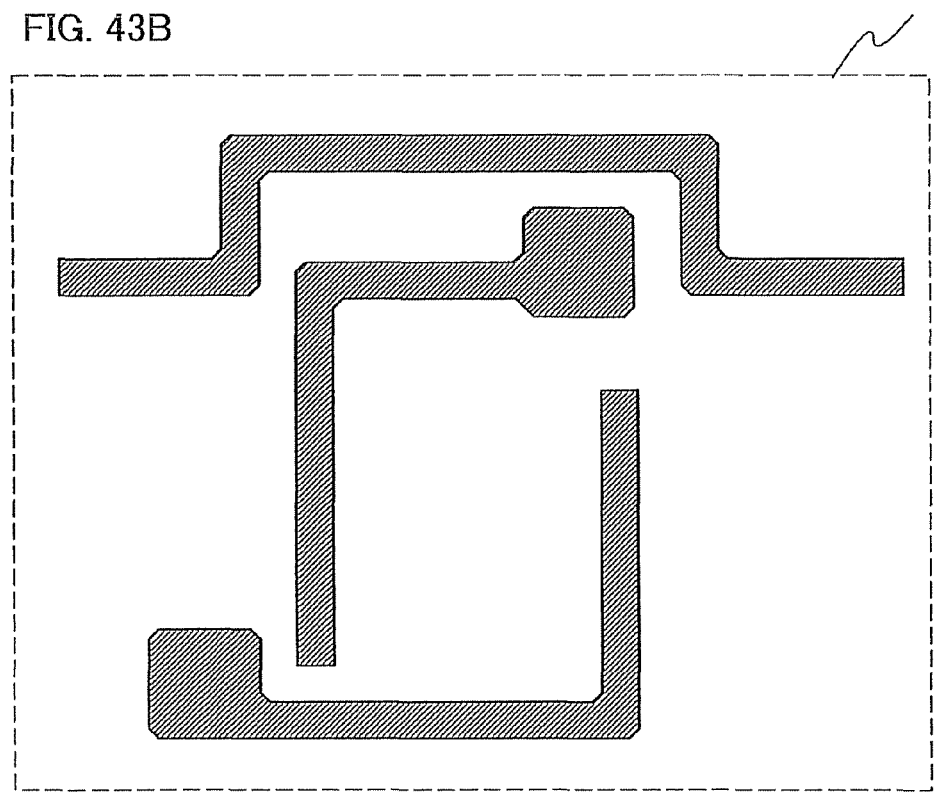

A photomask for forming these gate wires is provided with a mask pattern 5731 shown in FIG. 43B. The mask pattern 5731 has corner portions. In some of the corner portions, a rectangular triangle having hypotenuse which is 10 μm or less, or a length which is from ⅕ to ½ of the line width is removed. The shape of the mask pattern 5731 shown in FIG. 43B is reflected in the gate wires 5712, 5713, and 5714 shown in FIG. 43A. In this case, a shape similar to the mask pattern 5731 may be transferred or may be transferred so that the corner of the mask pattern 5731 is further rounded. In other words, a pattern shape may be made smoother than the mask pattern 5731 to have roundness. Specifically, the corner portions of the gate wires 5712, 5713, and 5714 may be rounded by removing a rectangular triangle having hypotenuse which is 10 μm or less, or a length which is from a ⅕ to a ½ of the line width. Generation of fine particles due to overdischarge can be suppressed in a convex portion when dry etching is performed by plasma. On the other hand, in a concave portion, even when fine particles are generated by overdischarge in dry etching with use of plasma, the fine particles can be prevented from gathering at the corner, thus can be washed away easily at the time of cleaning. Consequently, there is an effect that improvement of yield can be fully expected.

An interlayer insulating layer is a layer that is formed following the gate wires 5712, 5713, and 5714. The interlayer insulating layer is formed using an inorganic insulating material such as silicon oxide or an organic insulating material such as polyimide or acrylic resin. An insulating layer such as silicon nitride or silicon nitride oxide may be interposed between the interlayer insulating layer and the gate wires 5712, 5713, and 5714. In addition, an insulating layer such as silicon nitride or silicon nitride oxide may be provided over the interlayer insulating layer. The insulating layer can prevent the semiconductor layer and the gate insulating layer from being contaminated with impurities such as exogenous metal ions or moisture that is not preferable for a transistor.

Figure 44A:
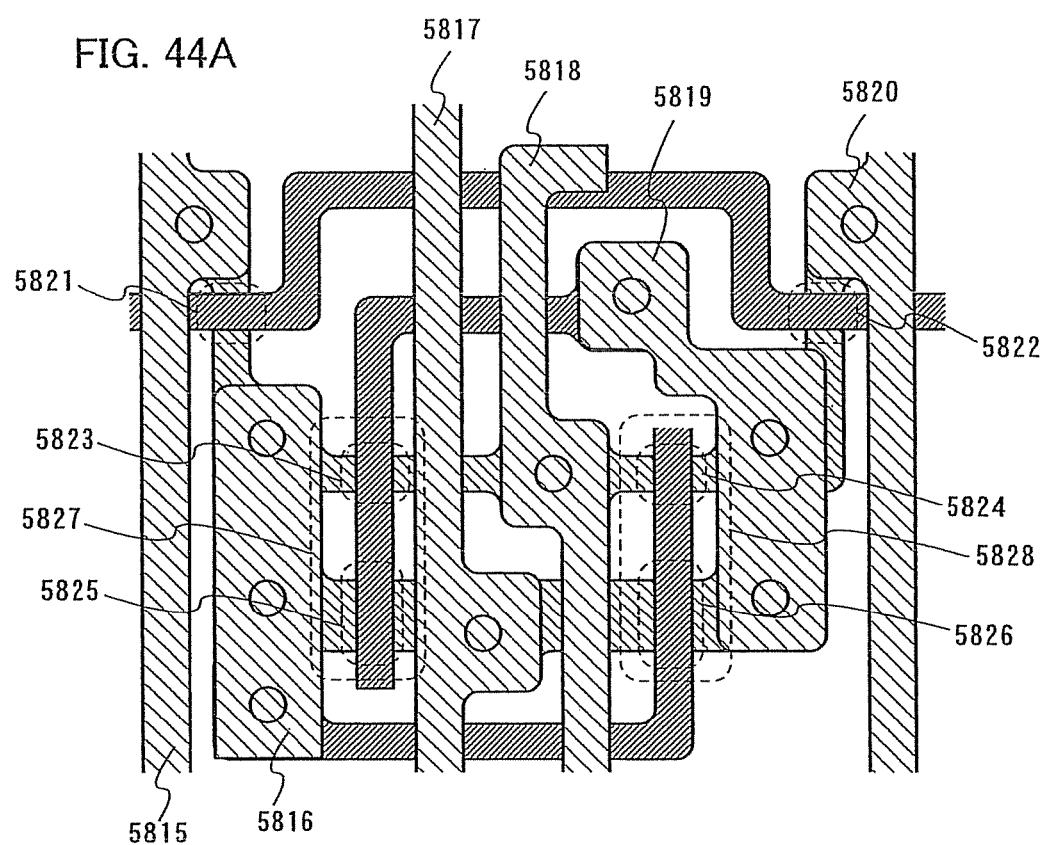
FIGS. 44A and 44B show a structure of a display device of the present invention.

An opening is formed in a predetermined position of the interlayer insulating layer. For example, the opening is provided corresponding to the gate wire or the semiconductor layer in a lower layer. In a wire layer formed from a layer or a plurality of layers of a metal or a metal compound, a mask pattern thereof is formed by a photolithography technique and a predetermined pattern is formed by an etching process. Then, as shown in FIG. 44A, wires 5815 to 5820 are formed so as to partially overlap with semiconductor layers. Specific elements are connected by the wires. The wires do not connect the specific elements in a straight line, but connect them to have a bent portion as a result of limitation of the layout. In addition, widths of the wires are each changed in a contact portion or in other regions. When the size of a contact hole is the same or larger than a width of a wire, the width of the wire becomes larger in the contact portion.

Figure 44B:
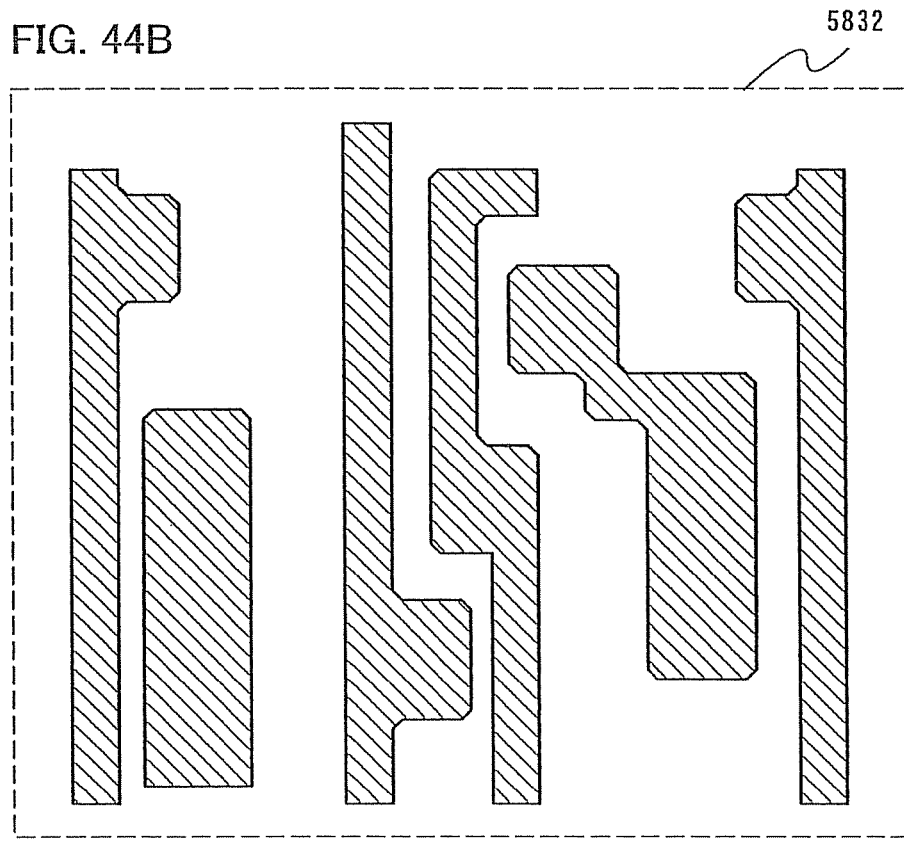

A photomask for forming these wires 5815 to 5820 is provided with a mask pattern 5832 shown in FIG. 44B. In this case also, the wires have a pattern whose corner is rounded, which is bent into an L shape, and in which a rectangular triangle having hypotenuse which is 10 μm or less, or a length which is from ⅕ to ½ of the line width, is removed. Specifically, in order to form a round outer circumference of the corner portion, a part of the wire is removed, which corresponds to an isosceles right triangle having two first straight lines that are perpendicular to each other making the corner portion, and a second straight line that makes an angle of about 45 degrees with the two first straight lines. When it is removed, two obtuse angles are formed in the wire. At this time, the wire is preferably etched by appropriately adjusting the etching conditions and/or a mask design so that a curved line in contact with the first straight line and the second straight line is formed in each obtuse angle portion. Note that the length of the two sides of the isosceles right triangle, which are equal to each other, is a length from a ⅕ to a ½ of the wire length. In addition, the inner circumference of the corner portion is also made curved in accordance with the outer circumference of the corner portion. In such wires, generation of fine particles due to overdischarge can be suppressed in a convex portion when dry etching is performed by plasma. On the other hand, in a concave portion, even when fine particles are generated by overdischarge in dry etching with use of plasma, the fine particles can be prevented from gathering at the corner, thus can be washed away easily at the time of cleaning. Consequently, there is an effect that improvement of yield can be fully expected. It can be expected that electrical conduction of the wires can be made preferably by making the corner portions of the wires rounded. In addition, it is extremely advantageous in washing dusts away to use the wires with the rounded corner portions in a structure where a number of wires are provided in parallel.

In FIG. 44A, N-channel transistors 5821 to 5824, and P-channel transistors 5825 and 5826 are formed. The N-channel transistor 5823 and the P-channel transistor 5825, the N-channel transistor 5824 and the P-channel transistor 5826 constitute an inverter 5827 and an inverter 5828, respectively. Circuits including these six transistors form a SRAM. An insulating layer such as silicon nitride or silicon oxide may be formed in the upper layer of these transistors.

Note that this embodiment mode can be freely combined with Embodiment Modes 1 to 12.

Embodiment Mode 14

The present invention can be applied to various electronic devices. Specifically, the present invention can be applied to display portions of electronic devices. As examples of such electronic devices, there are cameras such as a video camera and a digital camera, goggle displays, navigation systems, audio reproducing devices (e.g., car audios or audio component sets), computers, game machines, portable information terminals (e.g., mobile computers, mobile phones, portable game machines, or electronic books), image reproducing devices provided with a recording medium (specifically, a device for reproducing the content of a recording medium such as a digital versatile disc (DVD) and having a light-emitting device for displaying the reproduced image), and the like.

Figure 31A:
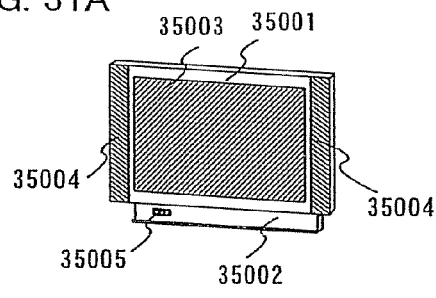
FIGS. 31A to 31H each show an electronic device to which the present invention is applied.

FIG. 31A shows a light-emitting device which includes a housing 35001, a supporting base 35002, a display portion 35003, speaker portions 35004, a video input terminal 35005, and the like. The display device of the present invention can be applied to the display portion 35003. Note that the light-emitting device includes all light-emitting devices for information display, such as light-emitting devices for a personal computer, television broadcast reception, or advertisement display. With the light-emitting device having the display portion 35003 using the display device of the present invention, fine and high-contrast images can be provided.

Figure 31B:
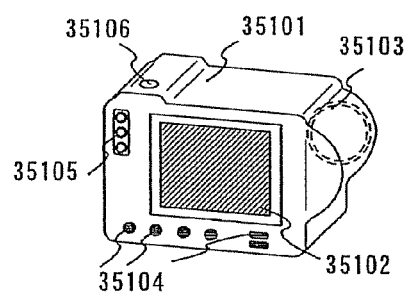

FIG. 31B shows a camera which includes a main body 35101, a display portion 35102, an image receiving portion 35103, operating keys 35104, an external connecting port 35105, a shutter switch 35106, and the like.

With the digital camera having the display portion 35102 using the display device of the present invention, fine and high-contrast images can be provided.

Figure 31C:
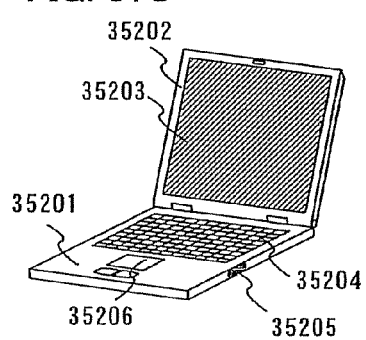

FIG. 31C shows a computer which includes a main body 35201, a housing 35202, a display portion 35203, a keyboard 35204, an external connecting port 35205, a pointing mouse 35206, and the like. With the computer having the display portion 35203 using the display device of the present invention, fine and high-contrast images can be provided.

Figure 31D:
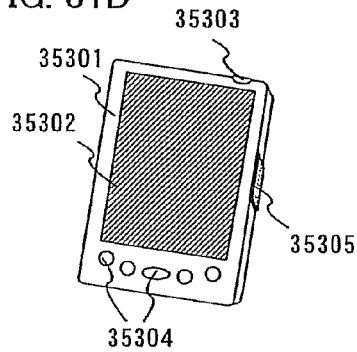

FIG. 31D shows a mobile computer which includes a main body 35301, a display portion 35302, a switch 35303, operating keys 35304, an IR port 35305, and the like. With the mobile computer having the display portion 35302 which employs the display device of the present invention, fine and high-contrast images can be provided.

Figure 31E:
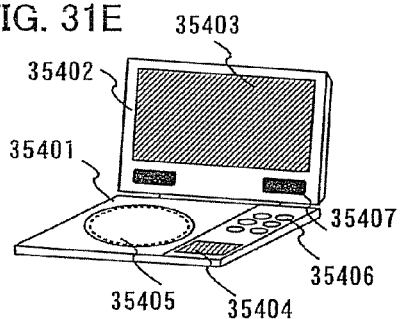

FIG. 31E shows a portable image reproducing device provided with a recording medium (specifically, a DVD player) which includes a main body 35401, a housing 35402, a display portion A 35403, a display portion B 35404, a recording medium (DVD) reading portion 35405, an operating key 35406, a speaker portion 35407, and the like. The display portion A 35403 can mainly display images, while the display portion B 35404 can mainly display characters. With the image reproducing device having the display portion A 35403 and the display portion B 35404 using the display device of the present invention, fine and high-contrast images can be provided.

Figure 31F:
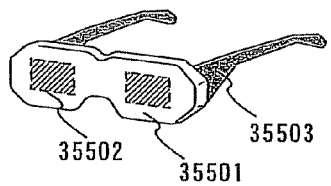

FIG. 31F shows a goggle type display which includes a main body 35501, a display portion 35502, and an arm portion 35503. With the goggle type display having the display portion 35502 which employs the display device of the present invention, fine and high-contrast images can be provided.

Figure 31G:
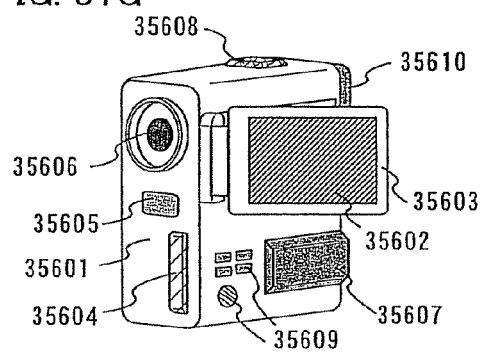

FIG. 31G shows a video camera which includes a main body 35601, a display portion 35602, a housing 35603, an external connecting port 35604, a remote controller receiving portion 35605, an image receiving portion 35606, a battery 35607, an audio input portion 35608, operating keys 35609, an eyepiece portion 35610 and the like. With the video camera having the display portion 35602 which employs the display device of the present invention, fine and high-contrast images can be provided.

Figure 31H:
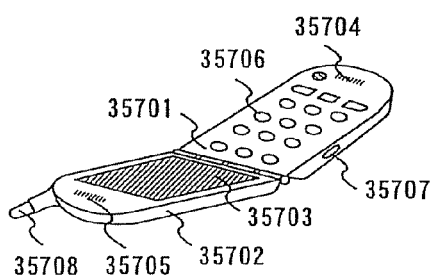

FIG. 31H shows a mobile phone which includes a main body 35701, a housing 35702, a display portion 35703, an audio input portion 35704, an audio output portion 35705, an operating key 35706, an external connecting port 35707, an antenna 35708, and the like. With the mobile phone having the display portion 35703 using the display device of the present invention, fine and high-contrast images can be provided.

As described above, the applicable range of the present invention is so wide that the present invention can be applied to electronic devices of various fields. The electronic devices of this embodiment mode may use a display device having any structure shown in Embodiment Modes 1 to 11.

The present application is based on Japanese Patent application No. 2005-194668 filed on Jul. 4, 2005 with the Japanese Patent Office, the entire contents of which are hereby incorporated by reference.

What is claimed is:

1. A display device comprising:
   a signal line;
   a power supply line;
   a first pixel comprising a first display region, a driving transistor, a first switch, a second switch, a third switch, a fourth switch, and a capacitor element; and
   a second pixel comprising a second display region,
   wherein the signal line is electrically connected to a first terminal of the first switch,
   wherein a first terminal of the capacitor element is electrically connected to a second terminal of the first switch,
   wherein a second terminal of the capacitor element is electrically connected to a gate of the driving transistor and a first terminal of the second switch,
   wherein one of a source and a drain of the driving transistor is electrically connected to a second terminal of the second switch and the first display region,
   wherein the other of the source and the drain of the driving transistor is electrically connected to the power supply line, and
   wherein an area of the first display region is different from an area of the second display region.

2. The display device according to claim 1, wherein the other of the source and the drain of the driving transistor is electrically connected to the power supply line through the fourth switch.

3. The display device according to claim 1, wherein the one of the source and the drain of the driving transistor is directly connected to the first display region.

4. The display device according to claim 1, wherein a first terminal of the third switch is connected to the second terminal of the first switch, and
wherein a second terminal of the third switch is connected to the other of the source and the drain of the driving transistor.

5. The display device according to claim 1, further comprising a first scan line and a second scan line,
wherein the first scan line is connected to the first switch, and
wherein the second scan line is connected to the second switch and the third switch.

6. The display device according to claim 1, further comprising a third scan line connected to the fourth switch.

7. The display device according to claim 1, further comprising a fourth pixel including a fourth display region and a fifth display region,
wherein in the first, fourth, and fifth display regions, the same color is displayed,
wherein in a first state, the first display region and the fourth display region are used for a first subpixel, and the fifth display region is used for a second subpixel,
wherein in a second state, the fourth display region and the fifth display region are used for the first subpixel, and the first display region is used for a third subpixel, and
wherein an area of the first display region is equal to an area of the fifth display region.

8. An electronic device comprising the display device according to claim 1.

9. A display module comprising the display device according to claim 1.

10. A display device comprising:
a signal line;
a power supply line;
a first pixel comprising a first display region, a driving transistor, a first switch, a second switch, a third switch, a fourth switch, and a capacitor element; and
a second pixel comprising a second display region,
wherein the signal line is connected to a first terminal of the first switch,
wherein a first terminal of the capacitor element is connected to a second terminal of the first switch,
wherein a second terminal of the capacitor element is connected to a gate of the driving transistor and a first terminal of the second switch,
wherein one of a source and a drain of the driving transistor is connected to a second terminal of the second switch,
wherein the one of the source and the drain of the driving transistor is electrically connected to the first display region,
wherein the other of the source and the drain of the driving transistor is electrically connected to the power supply line, and
wherein an area of the first display region is different from an area of the second display region.

11. The display device according to claim 10, wherein the other of the source and the drain of the driving transistor is electrically connected to the power supply line through the fourth switch.

12. The display device according to claim 10, wherein the one of the source and the drain of the driving transistor is directly connected to the first display region.

13. The display device according to claim 10,
wherein a first terminal of the third switch is connected to the second terminal of the first switch, and
wherein a second terminal of the third switch is connected to the other of the source and the drain of the driving transistor.

14. The display device according to claim 10, further comprising a first scan line and a second scan line,
wherein the first scan line is connected to the first switch, and
wherein the second scan line is connected to the second switch and the third switch.

15. The display device according to claim 10, further comprising a third scan line connected to the fourth switch.

16. The display device according to claim 10, further comprising a fourth pixel including a fourth display region and a fifth display region,
wherein in the first, fourth, and fifth display regions, the same color is displayed,
wherein in a first state, the first display region and the fourth display region are used for a first subpixel, and the fifth display region is used for a second subpixel,
wherein in a second state, the fourth display region and the fifth display region are used for the first subpixel, and the first display region is used for a third subpixel, and
wherein an area of the first display region is equal to an area of the fifth display region.

17. An electronic device comprising the display device according to claim 10.

18. A display module comprising the display device according to claim 10.

19. A display device comprising:
a first scan line;
a power supply line;
a first pixel comprising a first display region, a driving transistor, a first switch, a second switch, a third switch, a fourth switch, and a capacitor element; and
a second pixel comprising a second display region,
wherein the first scan line is electrically connected to the second switch and the third switch,
wherein the power supply line is electrically connected to the first display region through the driving transistor,
wherein a first terminal of the capacitor element is electrically connected to a gate o the driving transistor and a first terminal of the second switch,
wherein one of a source and a drain of the driving transistor is electrically connected to a second terminal of the second switch and the first display region,
wherein the other of the source and the drain of the driving transistor is electrically connected to a first terminal of the third switch and a first terminal of the fourth switch, and
wherein an area of the first display region is different from an area of the second display region.

20. The display device according to claim 19, wherein the second terminal of the fourth switch is connected to the power supply line.

21. The display device according to claim 19, further comprising a signal line,
wherein a first terminal of the first switch is connected to the signal line, and
wherein a second terminal of the first switch is connected to a second terminal of the third switch and a second terminal of the capacitor element.

22. The display device according to claim 19, further comprising a second scan line, wherein the second scan line is connected to the first switch.

23. The display device according to claim 19, wherein the one of the source and the drain of the driving transistor is directly connected to the first display region.

24. The display device according to claim 19, further comprising a third scan line connected to the fourth switch.

25. The display device according to claim 19, further comprising a fourth pixel including a fourth display region and a fifth display region, wherein in the first, fourth, and fifth display regions, the same color is displayed, wherein in a first state, the first display region and the fourth display region are used for a first subpixel, and the fifth display region is used for a second subpixel, wherein in a second state, the fourth display region and the fifth display region are used for the first subpixel, and the first display region is used for a third subpixel, and wherein an area of the first display region is equal to an area of the fifth display region.

26. An electronic device comprising the display device according to claim 19.

27. A display module comprising the display device according to claim 19.

* * * * *